(12) United States Patent
Kim et al.

(10) Patent No.: US 11,558,969 B2
(45) Date of Patent: Jan. 17, 2023

(54) DISPLAY DEVICE

(71) Applicant: LG ELECTRONICS INC., Seoul (KR)

(72) Inventors: Hoyoung Kim, Seoul (KR); Dongkyoon Han, Seoul (KR); Heegun Park, Seoul (KR); Hyeongjun Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 19 days.

(21) Appl. No.: 17/139,547

(22) Filed: Dec. 31, 2020

(65) Prior Publication Data

US 2021/0204428 A1 Jul. 1, 2021

(51) Int. Cl.
*H05K 5/02* (2006.01)
*H05K 5/00* (2006.01)
*H01L 51/52* (2006.01)

(52) U.S. Cl.
CPC ......... *H05K 5/0217* (2013.01); *H05K 5/0017* (2013.01)

(58) Field of Classification Search
CPC H05K 5/0217; H05K 5/0017; H01L 51/5237; H01L 2251/5338; G06F 1/1681; G06F 1/1652; G09F 9/301
See application file for complete search history.

(56) References Cited

U.S. PATENT DOCUMENTS

| | | | | |
|---|---|---|---|---|
| 10,439,154 B2 * | 10/2019 | Kim | | G06F 1/1652 |
| 10,582,628 B2 * | 3/2020 | Kim | | B65H 16/06 |
| 2016/0187929 A1 * | 6/2016 | Kim | | G06F 1/1643 |
| | | | | 345/184 |
| 2016/0374228 A1 * | 12/2016 | Park | | G09F 15/0062 |
| 2017/0280571 A1 * | 9/2017 | Yang | | H05K 5/0069 |
| 2018/0070466 A1 * | 3/2018 | Kim | | G06F 1/1652 |
| 2018/0070467 A1 * | 3/2018 | Kim | | B21B 39/008 |
| 2018/0160554 A1 * | 6/2018 | Kang | | B21B 39/008 |
| 2019/0036049 A1 * | 1/2019 | Kim | | H01L 51/0097 |
| 2019/0037710 A1 * | 1/2019 | Han | | G06F 1/1601 |
| 2019/0150300 A1 * | 5/2019 | Kim | | H05K 5/0217 |
| | | | | 361/807 |

OTHER PUBLICATIONS

Machine Translation of KR 20170062875A (Year: 2022).*

* cited by examiner

*Primary Examiner* — Jinhee J Lee
*Assistant Examiner* — Sagar Shrestha
(74) *Attorney, Agent, or Firm* — Lee, Hong, Degerman, Kang & Waimey PC

(57) ABSTRACT

A display device is disclosed. The display device includes a flexible display panel, a module cover positioned behind the flexible display panel, a panel roller coupled to a lower end of the flexible display panel, a subsidiary roller spaced apart from the panel roller and positioned adjacent to a front side of the flexible display panel, a protective sheet in contact with a front side of the flexible display panel when the protective sheet is wound around the panel roller together with the flexible display panel and the module cover, a filler coupled to the subsidiary roller, wherein a portion of the filler is configured to be in contact with the front side of the flexible display panel and a distance between a rotational axis of the panel roller and a rotational axis of the subsidiary roller is fixed.

12 Claims, 77 Drawing Sheets

DISPLAY DEVICE

CROSS-REFERENCE TO RELATED APPLICATION

Pursuant to 35 U.S.C. § 119 (a), this application claims the benefit of an earlier filing date and right of priority to International Application No. PCT/KR2019/018791 filed on Dec. 31, 2019, the contents of which are hereby incorporated by reference herein in its entirety.

BACKGROUND OF THE INVENTION

1. Field of the Invention

The present disclosure relates to a display device.

2. Description of the Related Art

With the development of the information society, demand for various kinds of display devices is increasing. In response to these needs, various kinds of display devices, such as LCDs (Liquid Crystal Display Devices), PDPs (Plasma Display Panels) and ELDs (Electro luminescent Displays) and VFDs (Vacuum Fluorescent Displays) have been recently researched and used.

Among these, a display device using OLED (Organic Light-Emitting Diode) has an advantage in that the display device is excellent in brightness and viewing angle properties compared to an LCD device and does not require a backlight unit, thereby realizing an extremely slim device.

In addition, a flexible display panel can be bent or wound around a roller. The flexible display panel may be used to implement a display device that unfolds on a roller or winds around the roller. Many studies have been made on a structure for winding a flexible display panel around a roller or unwinding the flexible display panel from the roller.

SUMMARY OF THE INVENTION

It is an object of the present disclosure to solve the above and other problems.

It is another object of the present disclosure to provide a display device capable of preventing damage to a display panel due to contact with a module cover, which may occur during a procedure of winding the display panel and the module cover around a panel roller or unwinding the display panel and the module cover from the panel roller.

It is another object of the present disclosure to provide a display device capable of stably guiding a display panel without unexpected motion of the display panel during a procedure of winding the display panel around a panel roller or unwinding the display panel from the panel roller.

It is another object of the present disclosure to provide a display device capable of allowing a subsidiary roller, on which a protective sheet for preventing damage to a display panel is wound or unwound, to be smoothly rotated.

In accordance with an aspect of the present disclosure, the above and other objects can be accomplished by the provision of a display device including a flexible display panel, a module cover positioned behind the flexible display panel, a panel roller coupled to a lower end of the flexible display panel, wherein the flexible display panel and the module cover are configured to be wound around or unwound from the panel roller, a subsidiary roller spaced apart from the panel roller and positioned adjacent to a front side of the flexible display panel, a protective sheet in contact with a front side of the flexible display panel when the protective sheet is wound around the panel roller together with the flexible display panel and the module cover, wherein the protective sheet is wound around one of the subsidiary roller and the panel roller while being unwound from a remaining one of the subsidiary roller and the panel roller, a filler coupled to the subsidiary roller, wherein a portion of the filler is configured to be in contact with the front side of the flexible display panel and a distance between a rotational axis of the panel roller and a rotational axis of the subsidiary roller is fixed.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
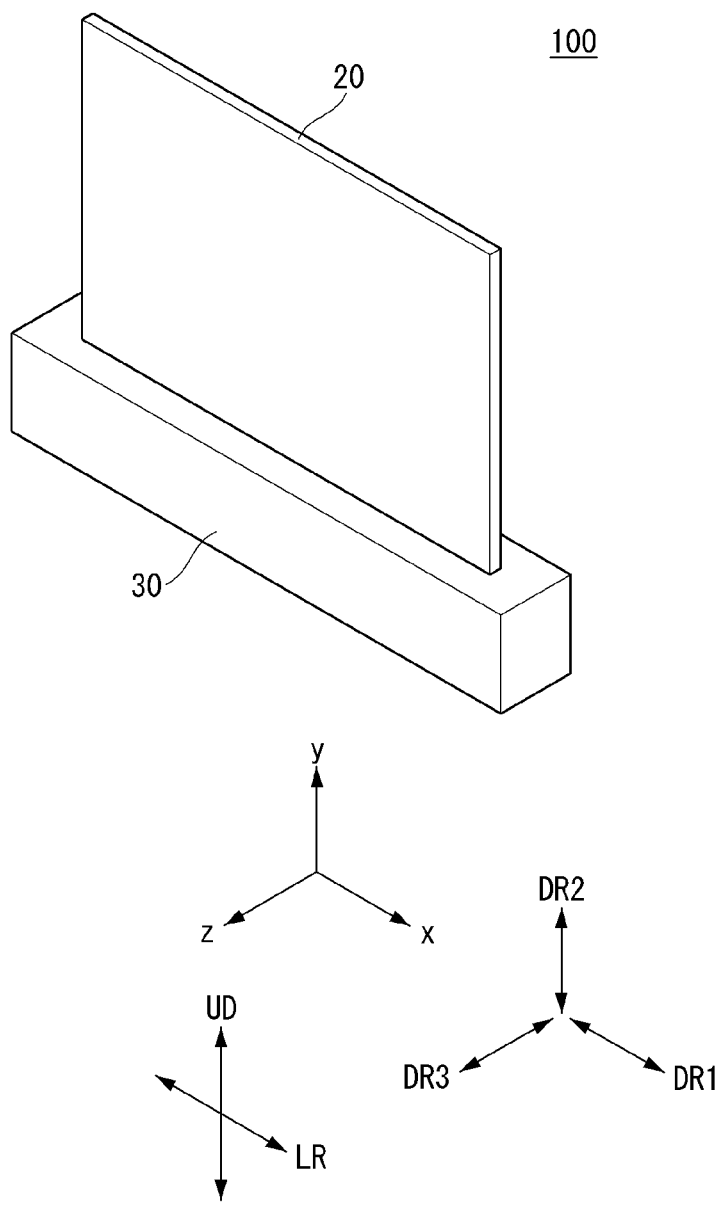
FIGS. 1 to 77 are views illustrating display devices according to embodiments of the present disclosure.

A description will now be given in detail according to exemplary embodiments disclosed herein, with reference to the accompanying drawings. For the sake of brevity of description with reference to the drawings, the same or equivalent components is denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features, and it should be understood that the embodiments presented herein are not limited by the accompanying drawings. As such, the present disclosure should be construed to extend to any alterations, equivalents and substitutes, in addition to those which are particularly set out in the accompanying drawings.

It will be understood that although the terms "first," "second," etc. may be used herein to describe various elements, these elements should not be limited by these terms. These terms are only used to distinguish one element from another.

It will be understood that when an element is referred to as being "connected with" another element, intervening elements may be present. In contrast, it will be understood that when an element is referred to as being "directly connected with" another element, there are no intervening elements present.

A singular representation may include a plural representation unless the context clearly indicates otherwise.

In the following description, when an example is described with reference to a specific figure, a reference numeral that is not illustrated in the specific figure may be mentioned. The reference numeral that is not illustrated with the specific figure is used in the case in which the reference numeral is indicated in the other figures.

Referring to FIG. 1, a display device 100 may include a display unit 20 and a housing 30. The housing 30 may have an internal space therein. The display unit 20 may be at least partially positioned inside the housing 30. The display unit 20 may be at least partially positioned outside the housing 30. The display unit 20 may display an image.

The direction parallel to the longitudinal direction of the housing 30 may be referred to as a first direction DR1, a +x-axis direction, a −x-axis direction, a leftward direction or a rightward direction. The direction in which the display unit 20 displays an image may be referred to as a +z-axis direction, a forward direction or forward. The direction opposite the direction in which the display unit 20 displays an image may be referred to as a −z-axis direction, a rearward direction or rearward. A third direction DR3 may be parallel to the +z-axis direction or the −z-axis direction. A direction parallel to a height direction of the display device 100 may be referred to as a second direction DR2, a +y-axis direction, a −y-axis direction, an upward direction or a downward direction.

The third direction DR3 may be a direction perpendicular to the first direction DR1 and/or the second direction DR2. The first direction DR1 and the second direction DR2 may be referred to as in common a horizontal direction. The third direction may be referred to as a vertical direction. A lateral direction LR may be parallel to the first direction DR1, and the vertical direction UD may be parallel to the second direction DR2.

Figure 2:
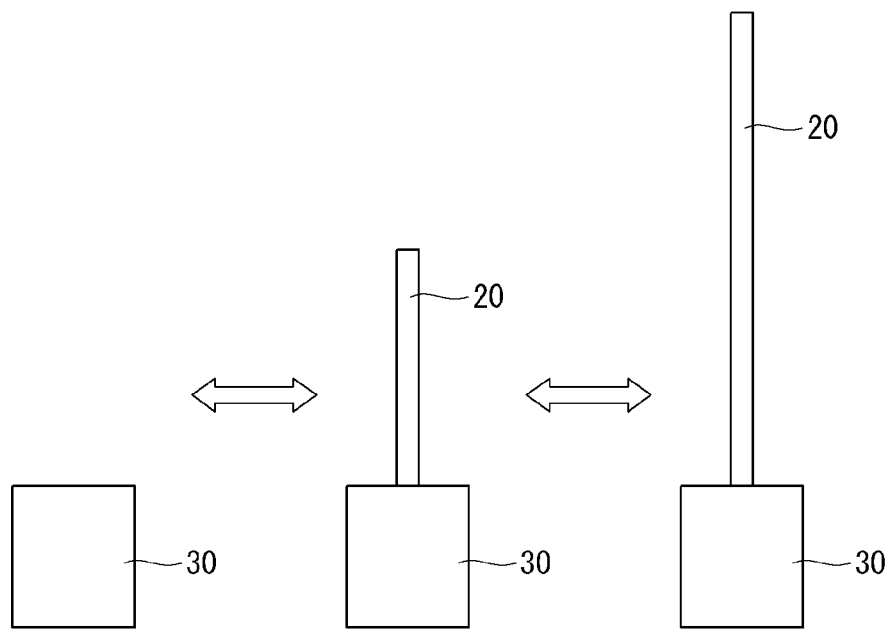

Referring to FIG. 2, the display unit 20 may be positioned entirely inside the housing 30. The display unit 20 may be at least partially positioned outside the housing 30. The extent to which the display unit 20 is externally exposed from the housing 30 may be adjusted as necessary.

Figure 3:
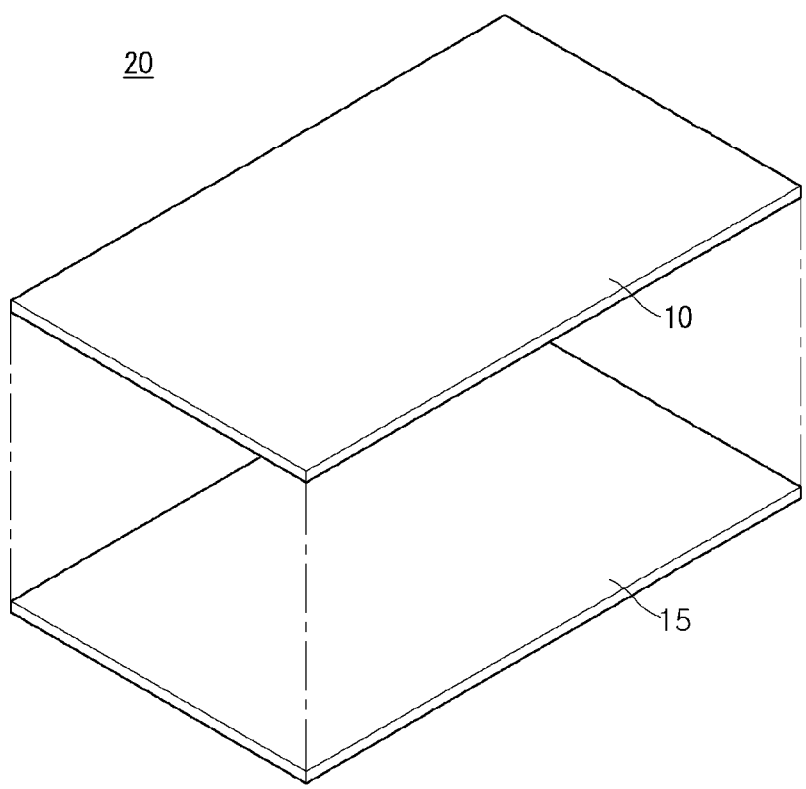

Referring to FIG. 3, the display unit 20 may include a display panel 10 and a plate 15. The display panel 10 may be flexible. For example, the display panel 10 may be an organic light-emitting display (OLED).

The display panel 10 may include a front surface displaying an image. The display panel 10 may include a rear surface opposite the front surface. The front surface of the display panel 10 may be coated with a translucent material. For example, the translucent material may be a synthetic resin or film.

The plate 15 may be coupled, fastened or attached to the rear surface of the display panel 10. The plate 15 may include a metal material. The plate 15 may be referred to as a module cover 15, a cover 15, a display panel cover 15, a panel cover 15 or an apron 15.

Figure 4:
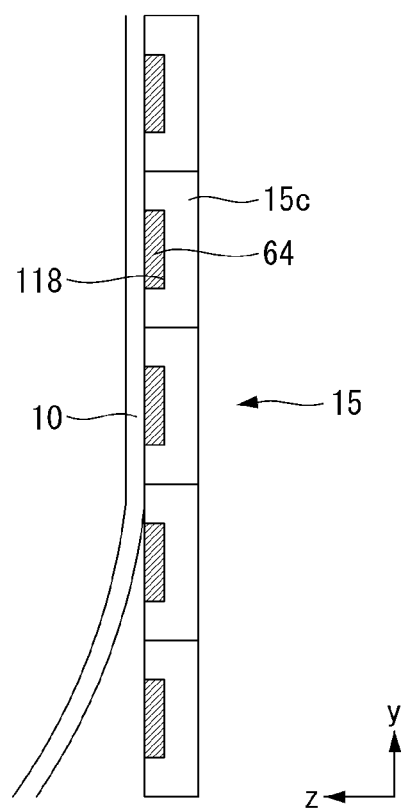

Referring to FIG. 4, the plate 15 may include a plurality of segments 15c. A magnet 64 may be positioned in a recess 118 in each of the segments 15c. The recess 118 may be formed in the surface of the segment 15c that faces the display panel 10. The recess 118 may be positioned at the front surface of each of the segments 15c. Because the magnet 64 is received in the recess 118, the magnet 64 may be prevented from being exposed to the outside of the segment 15c. The display panel 10 may be flat without corrugations, even when it is contact with the segment 15c.

Figure 5:
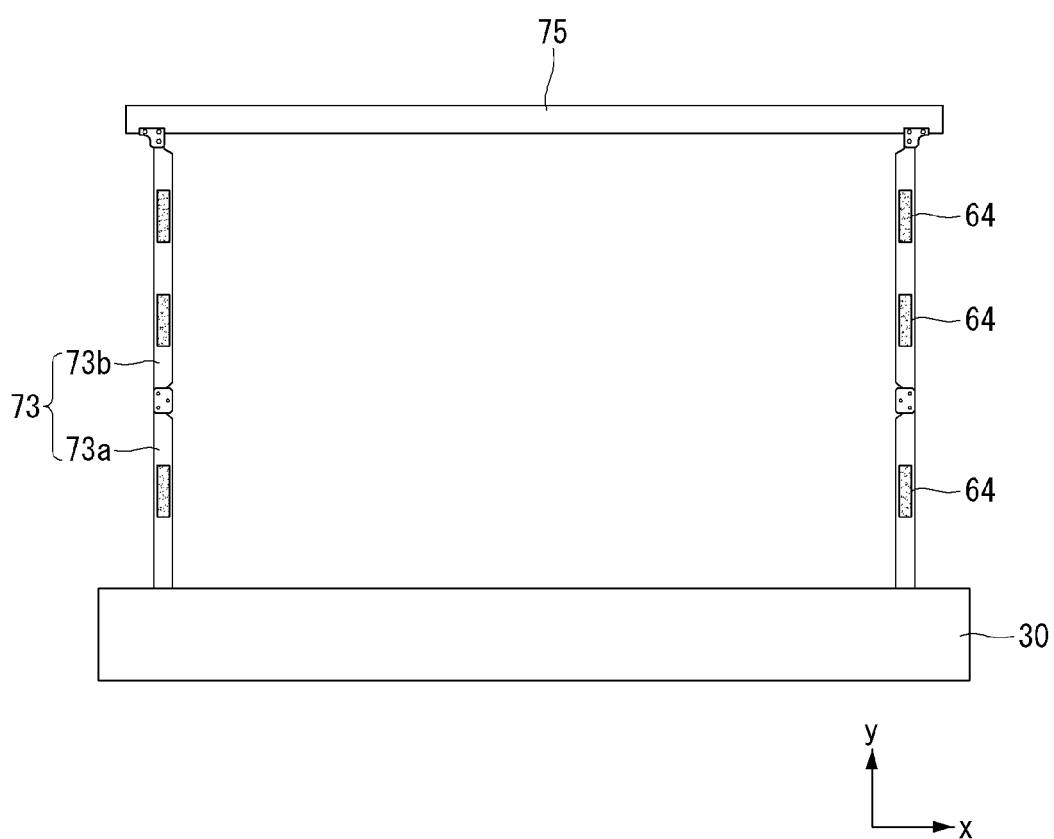

Referring to FIG. 5, a plurality of magnets 64 may be positioned on a link 73. For example, at least one magnet 64 may be positioned on a first arm 73a, and at least one magnet 64 may be positioned on a second arm 73b. The plurality of magnets 64 may be spaced apart from each other.

Figure 6:
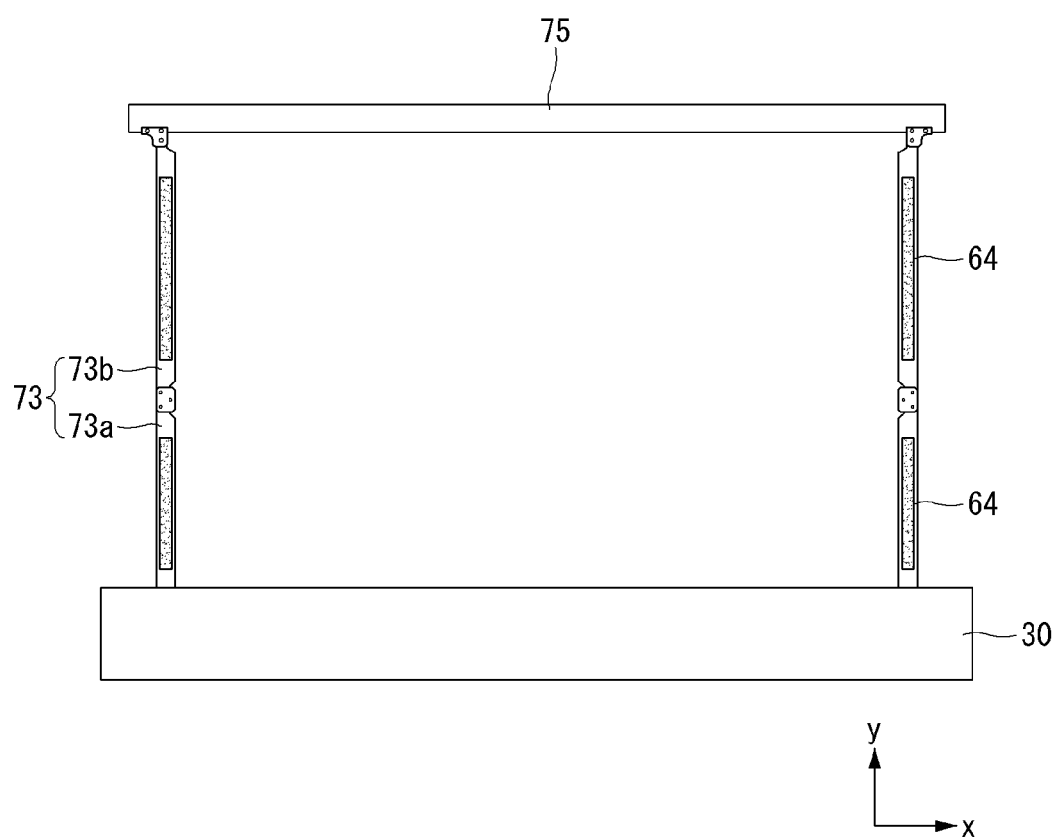

Referring to FIG. 6, one magnet 64 may be positioned on each of the first arm 73a and the second arm 73b. The magnet 64 may be configured to extend in the direction of the longer side of each of the first arm 73a and the second arm 73b. Since the magnet 64 may be configured to extend in the direction of the longer side of each of the first arm 73a and the second arm 73b, the surface area in which the link 73 is in close contact with the display panel and the module cover may be increased. Accordingly, the force of adhesion between the link 73, the display panel, and the module cover may be increased.

Figure 7:
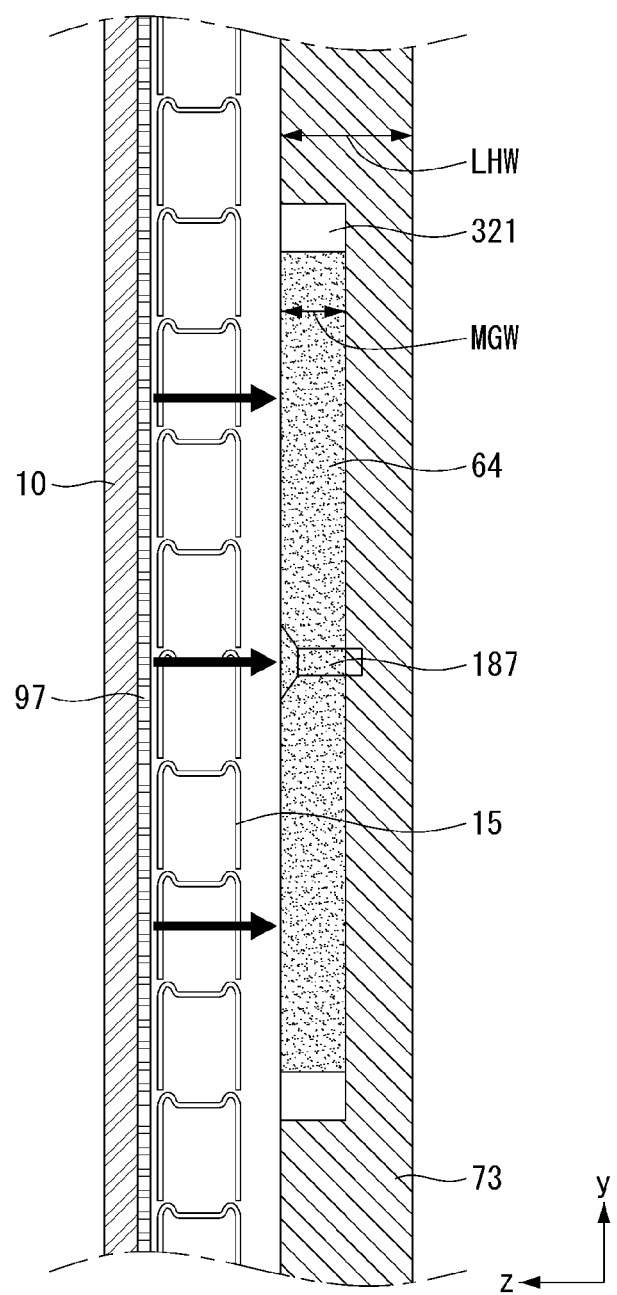

Referring to FIG. 7, the magnet 64 may be positioned in a depression 321 formed in the link 73. The depression 321 may be depressed in the link 73. The magnet 64 may be coupled to the link 73 by means of at least one screw 187.

The depth LHW to which the depression 321 is depressed in the link 73 may be equal to or greater than the thickness MGW of the magnet 64. If the thickness MGW of the magnet 64 is greater than the depth LHW of the depression 321, the display panel 10 and the module cover 15 may not be in close contact with the link 73. In this case, the display panel 10 may be corrugated or uneven.

A panel protector 97 may be positioned on the rear surface of the display panel 10. The panel protector 97 is capable of preventing damage to the display panel 10 due to friction with the module cover 15. The panel protector 97 may include a metal material. The panel protector 97 may have an extremely thin thickness. For example, the panel protector 97 may have a thickness of about 0.1 mm.

Because the panel protector 97 includes a metal material, an attraction force may act between the panel protector 97 and the magnet 64. Hence, the module cover 15, which is positioned between the panel protector 97 and the link 73, is capable of being in close contact with the magnet 64 even though the module cover 15 does not include a metal material.

Figure 8:
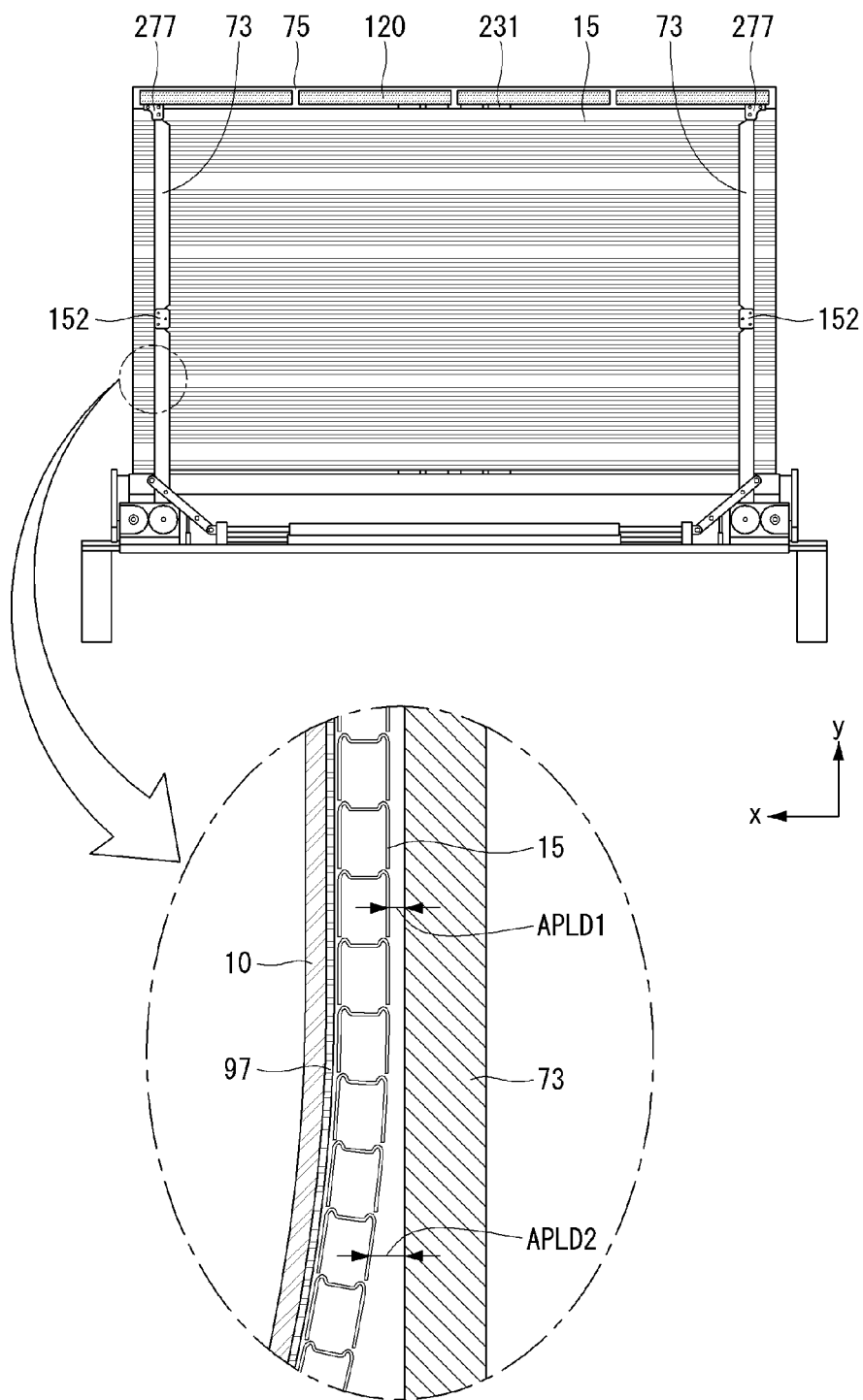
Figure 15:
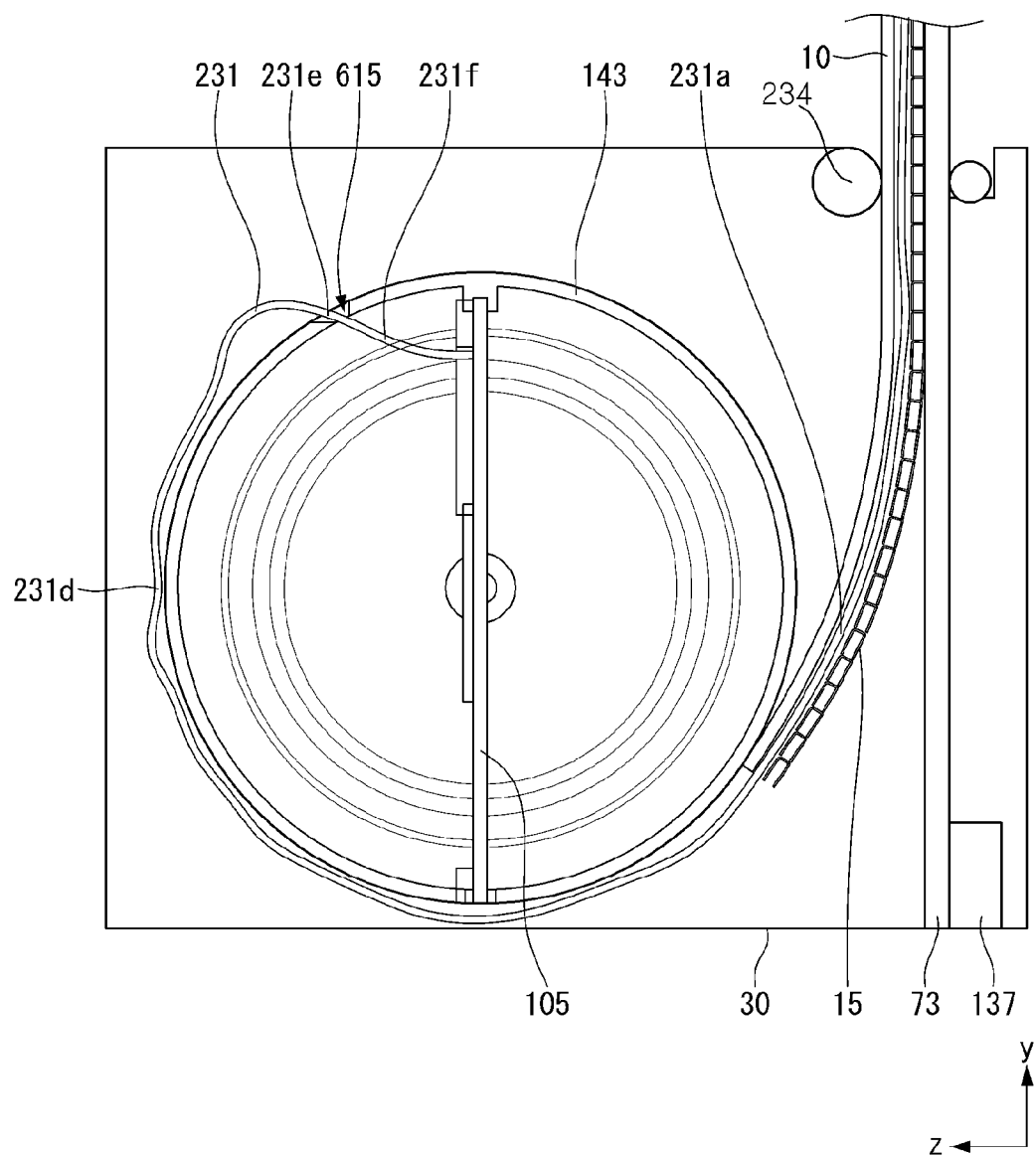

Referring to FIG. 8, the module cover 15 may be in close contact with the link 73 by virtue of an upper bar 75 and a lower guide bar 234 (see FIG. 15). The portion of the link 73 that is positioned between the upper bar 75 and the lower guide bar 234 may not be in close contact with the module cover 15. Furthermore, the central region of the link 73 may not be in close contact with the module cover 15. The central region of the link 73 may be a region near an arm joint 152. Here, the distance APLD1 and APLD2 between the module cover 15 and the link 73 may be inconsistent. Hence, the display panel 10 may be corrugated or bent.

Figure 9:
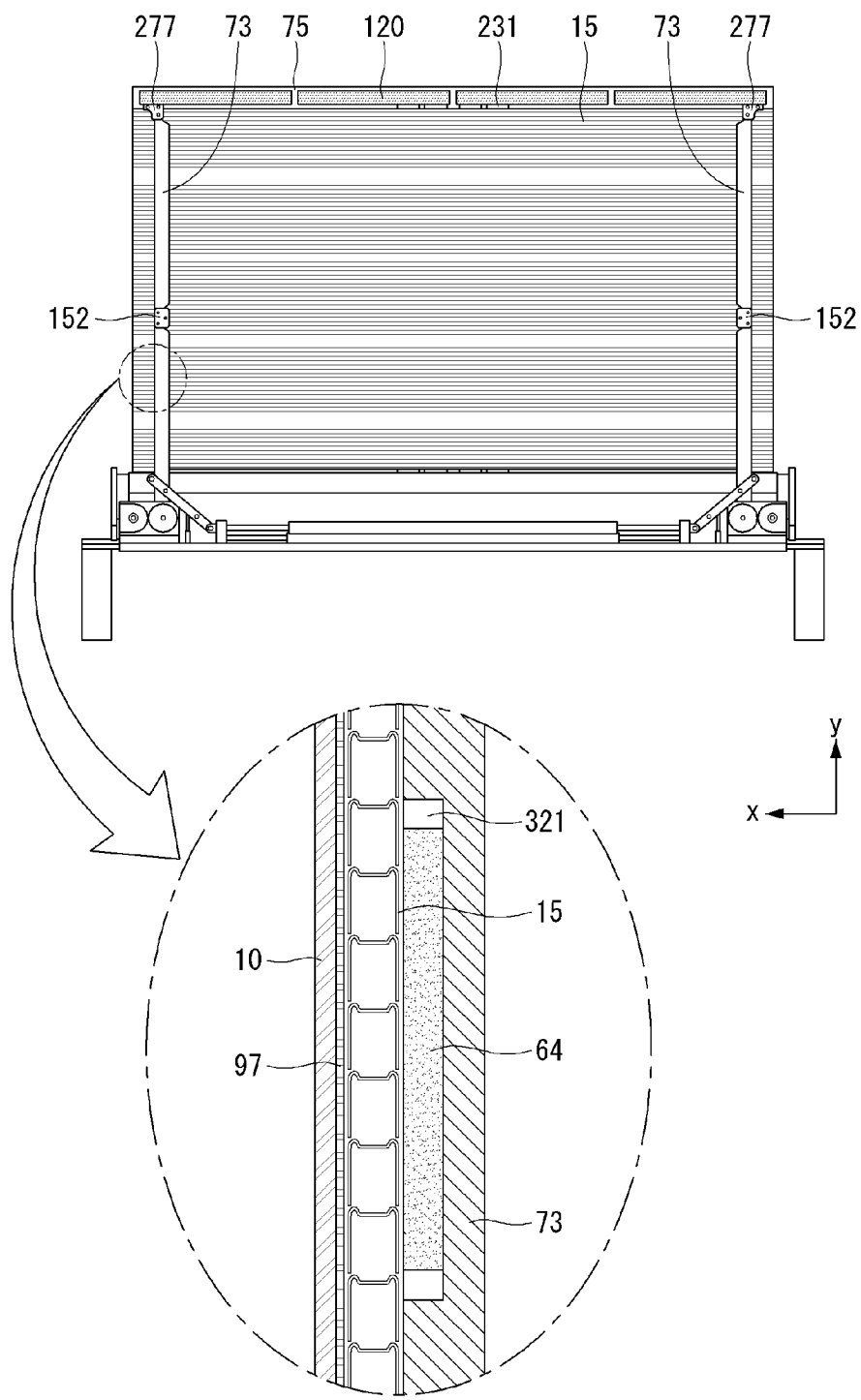

Referring to FIG. 9, when the magnet 64 is positioned in the depression 321 in the link 73, the module cover 15 may be in closed contact with the magnet 64 because the magnet 64 attracts the panel protector 97. In other words, the central region of the link 73 may be in close contact with the module cover 15.

Figure 10:
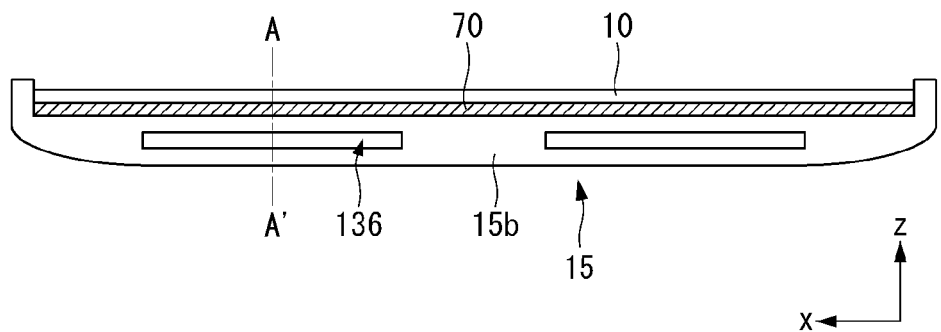
Figure 10:
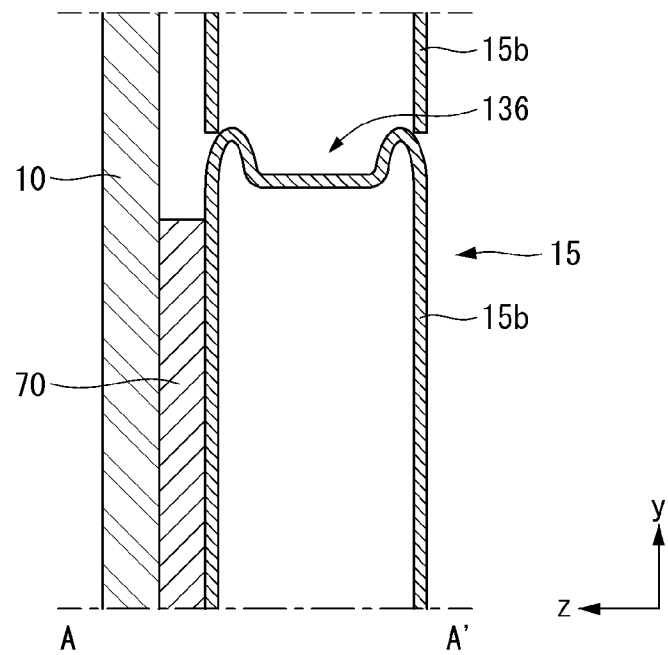

Referring to FIG. 10, a bead 136 may be formed in the upper surface of a segment 15b. The bead 136 may be may take the form of a recess in the segment 15b. The bead 136 may be depressed in a −y-axis direction. For example, the bead 136 may be formed by pressing the segment 15b. The bead 136 may include a plurality of beads formed in the segment 15b. The plurality of beads 136 may be spaced apart from each other. The beads 136 may increase the rigidity of the segment 15b. The beads 136 are capable of preventing deformation of the segment 15b attributable to external impact.

Figure 11:
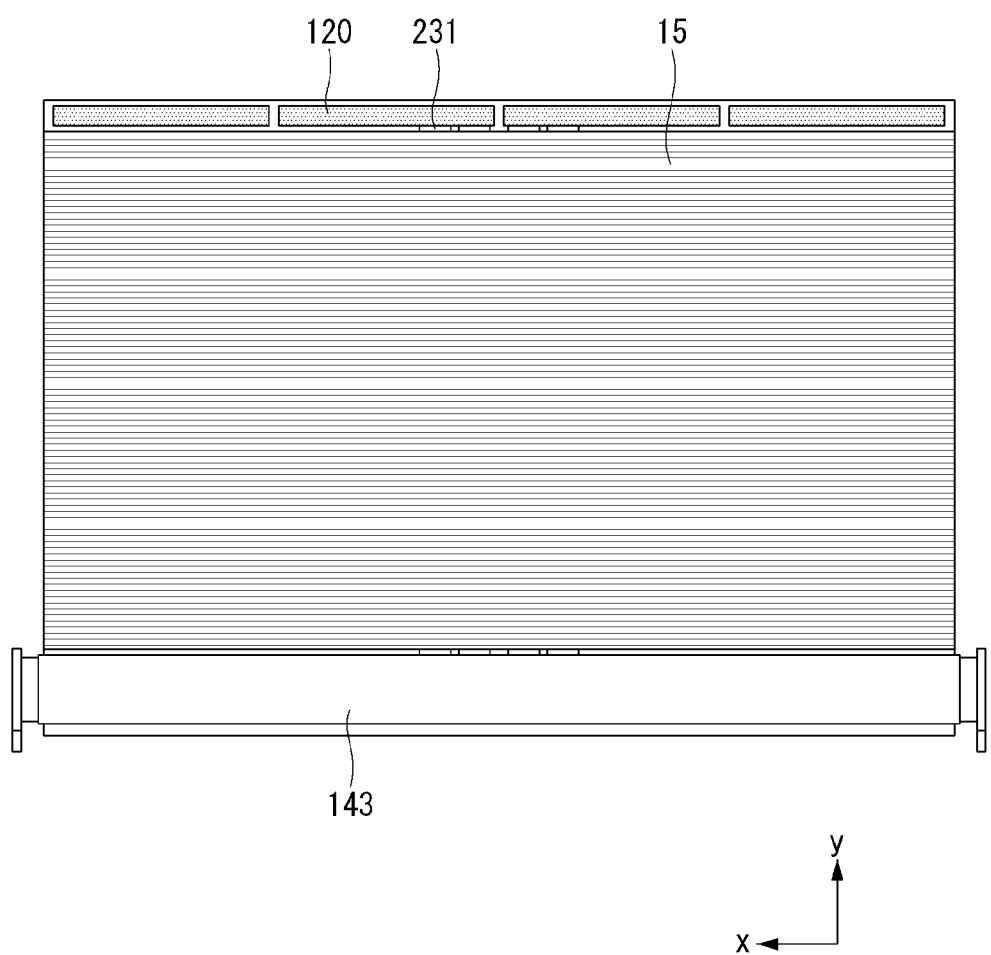

Referring to FIG. 11, a source PCB 120 may be positioned at the upper side of the module cover 15. In the case of roll-up or roll-down, the position of the source PCB 120 may be changed with the movement of the module cover 15. An FFC cable 231 may be positioned at the center of the module cover 15 in the first direction. The FFC cable 231 may also be positioned at opposite ends of the module cover 15 in the first direction.

Figure 12:
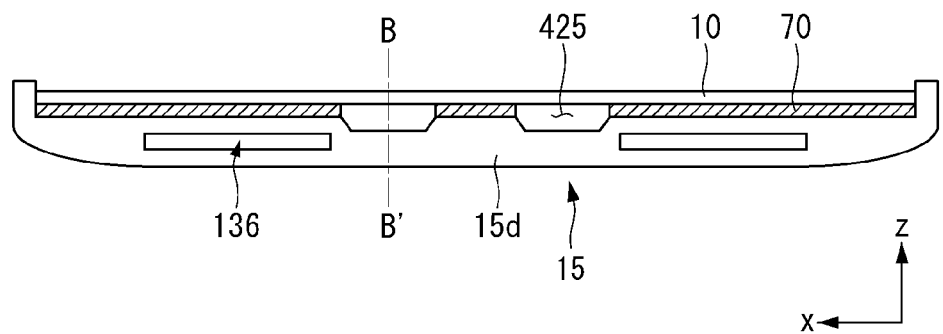
Figure 12:
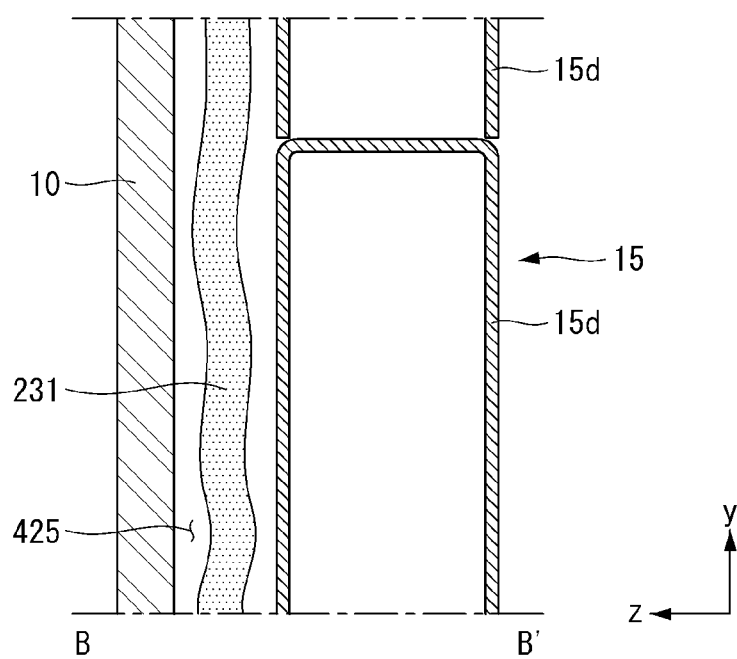

Referring to FIG. 12, the segment 15d may have a depression 425, which is depressed in a −z-axis direction.

The depression 425 may define the space between the display panel 10 and the module cover 15. The FFC cable 231 may be received in the space defined by the depression 425. The depression 425 may increase the rigidity of the segment 15d.

The bead 136 may be formed in the remainder of the region of the segment 15d excluding the depression 425. Because the region at which the depression 425 is positioned is thinned in the third direction, the bead 136 may not be formed in this region.

Figure 13:
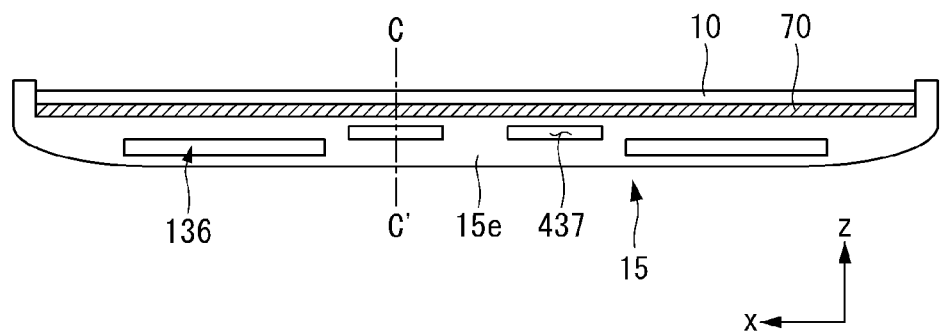
Figure 13:
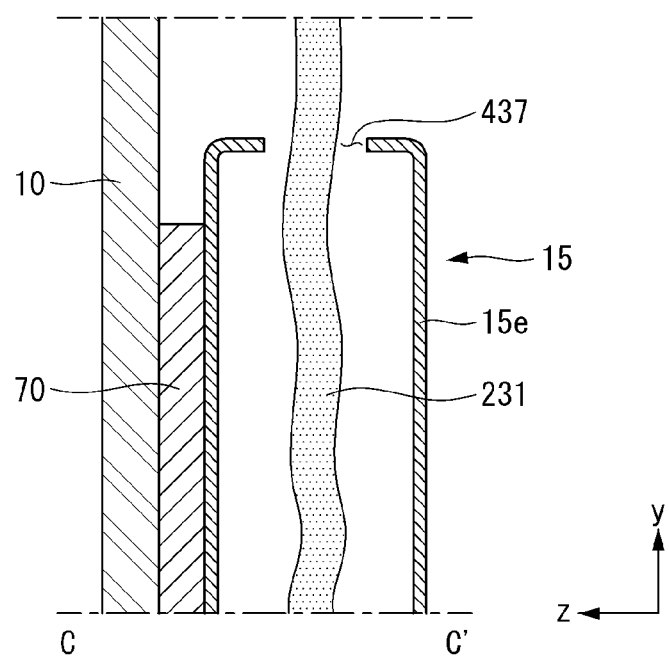

Referring to FIG. 13, a segment 15e may have a through hole 437 in the center thereof in the first direction. The through hole 437 may be formed through the center of the segment 15e in the second direction. The through hole 437 may be a hole positioned in the segment 15e. The through hole 437 may be a portion at which the FFC cable 231 is positioned. Because the through hole 437 is formed in the segment 15e, it is possible to reduce the thickness of the segment 15e, compared to the case in which the FFC cable 231 is positioned in the depression 425.

The bead 136 may be formed in the remainder of the region of the segment 15e excluding the through hole 437. Because the region of the segment 15e in which the through hole 437 is positioned is thinned, the bead 136 may not be formed in this region.

Figure 14:
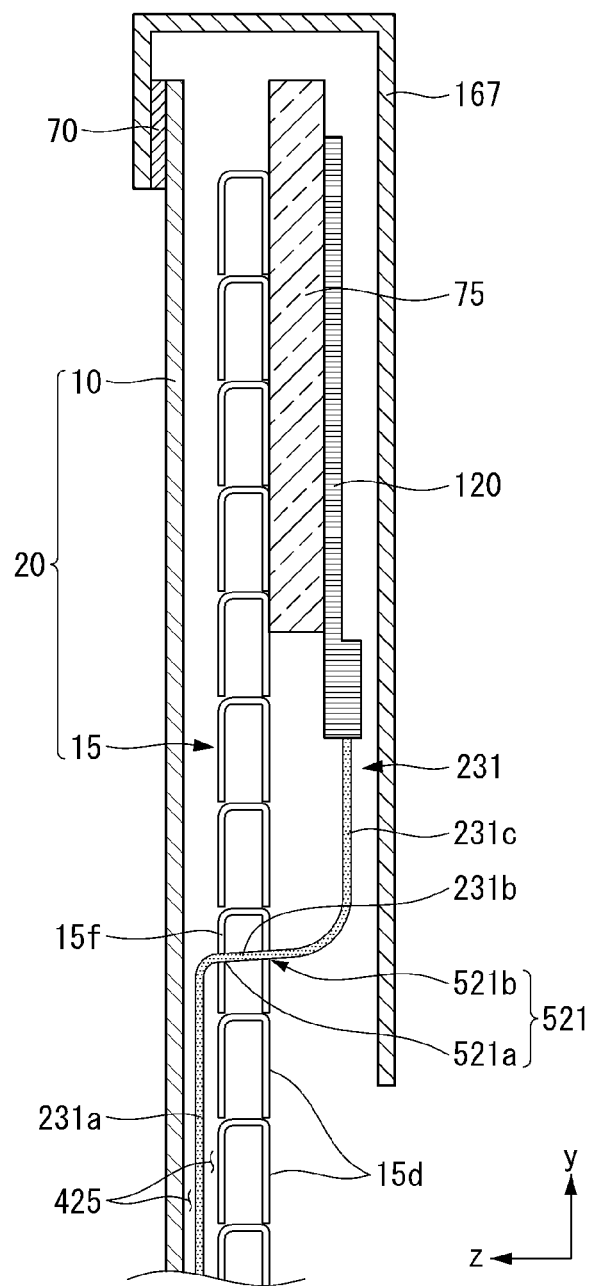

Referring to FIG. 14, a top case 167 may cover the source PCB 120 and the upper bar 75 as well as the display panel 10 and the module cover 15. The upper bar 75 is coupled at one surface thereof to the rear surface of the module cover 15 and at the other surface thereof to the source PCB 120. The upper bar 75 may be fixed to the module cover 15 so as to support the source PCB 120.

The lower end of the FFC cable 231 may be connected to a timing controller board 105 (see FIG. 15) inside a panel roller 143 (see FIG. 15). The FFC cable 231 may be wound around or unwound from the panel roller 143 together with the display unit 20.

A portion of the FFC cable 231 may be positioned between the display panel 10 and the module cover 15. The portion of the FFC cable 231 that is positioned between the display panel 10 and the module cover 15 may be referred to as a first portion 231a. The first portion 231a may be positioned in the depression 425 formed by the plurality of segments 15d. Alternatively, the first portion 231a may be received in the depression 425 defined by the plurality of segments 15d.

A portion of the FFC cable 231 may extend through a segment 15f. The portion of the FFC cable 231 that extends through the segment 15f may be referred to as a second portion 231b. The segment 15f may have a first hole 521a formed in the front surface thereof and a second hole 521b formed in the rear surface thereof. The first hole 521a and the second hole 521b may be connected to each other so as to define a single hole 521. The hole 521 may be formed through the segment 15f in the third direction. The second portion 231b may extend through the hole 521. The hole 521 may also be referred to as a connecting hole 521.

The upper end of the FFC cable 231 may be electrically connected to the source PCB 120. A portion of the FFC cable 231 may be positioned on the rear surface of the module cover 15. The portion of the FFC cable 231 that is positioned on the rear surface of the module cover 15 may be referred to as a third portion 231c. The third portion 231c may be electrically connected to the source PCB 120.

The third portion 231c may be covered by the top case 167. Accordingly, the third portion 231c may be prevented from being exposed to the outside.

Referring to FIG. 15, the FFC cable 231 may be connected to the timing controller board 105 mounted on the panel roller 143. A through hole 615 may be formed through the panel roller 143, and the FFC cable 231 may be connected to the timing controller board 105 through the through hole 615.

The through hole 615 may be positioned at a side of the panel roller 143, and may extend through the outer circumferential portion of the panel roller 143. The FFC cable 231 may be connected to a side of the timing controller board 105 through the through hole 615.

Although the FFC cable 231 is positioned on the outer circumference of the panel roller 143, the FFC cable 231 may be maintained in the state of being connected to the timing controller board 105 by virtue of the through hole 615. Accordingly, since the FFC cable 231 is rotated with the panel roller 143, the FFC cable 231 is prevented from becoming tangled.

A portion of the FFC cable 231 may be wound around the panel roller 143. The portion of the FFC cable 231 that is wound around the panel roller 143 may be referred to as a fourth portion 231d. The fourth portion 231d may be in contact with the outer circumferential surface of the panel roller 143.

A portion of the FFC cable 231 may extend through the through hole 615. The portion of the FFC cable 231 that extends through the through hole 615 may be referred to as a fifth portion 231e.

The lower end of the FFC cable 231 may be electrically connected to the timing controller board 105. A portion of the FFC cable 231 may be positioned inside the panel roller 143. The portion of the FFC cable 231 that is positioned inside the panel roller 143 may be referred to as a sixth portion 231f. The sixth portion 231f may be electrically connected to the timing controller board 105.

Figure 16:
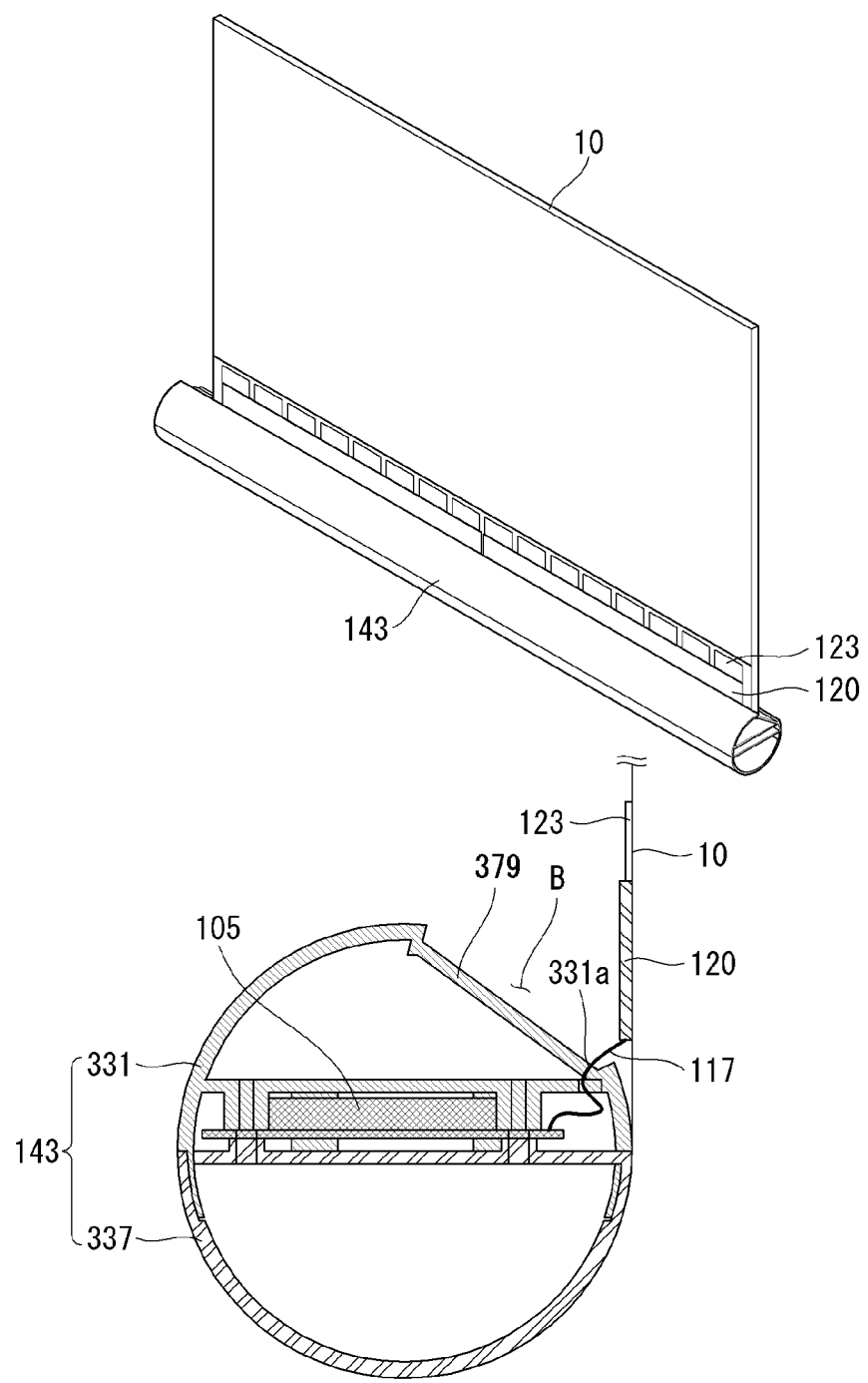

Referring to FIG. 16, the lower end of the display panel 10 may be connected to the panel roller 143. The display panel 10 may be wound around or unwound from the panel roller 143. The front surface of the display panel 10 may be coupled to a plurality of source PCBs 120. The plurality of source PCBs 120 may be spaced apart from each other.

A source COF (Chip On Film) 123 may connect the display panel 10 to the source PCB 120. The source COF 123 may be positioned on the front surface of the display panel 10. The panel roller 143 may include a first part 331 and a second part 337. The first part 331 and the second part 337 may be fastened to each other by means of a screw. The timing controller board 105 may be mounted in the panel roller 143.

The source PCB 120 may be electrically connected to the timing controller board 105. The timing controller board 105 may transmit digital video data and a timing control signal to the source PCB 120.

A cable 117 may electrically connect the source PCB 120 to the timing controller board 105. For example, the cable 117 may be an FFC (Flexible Flat Cable). The cable 117 may extend through a hole 331a. The hole 331a may be formed through a mounting portion 379 or the first part 331. The cable 117 may be positioned between the display panel 10 and the second part 337.

The mounting portion 379 may be formed at the outer circumference of the first part 331. The mounting portion 379 may be formed by causing a portion of the outer circumference of the first part 331 to be stepped. The mounting portion 379 may define a space B. When the display unit 20 is wound around the panel roller 143, the source PCB 120 may be received in the mounting portion 379. Since the source PCB 120 is received in the mounting portion 379, the source PCB 120 may not be bent or corrugated, and the durability thereof may be improved.

The cable 117 may electrically connect the timing controller board 105 to the source PCB 120.

Figure 17:
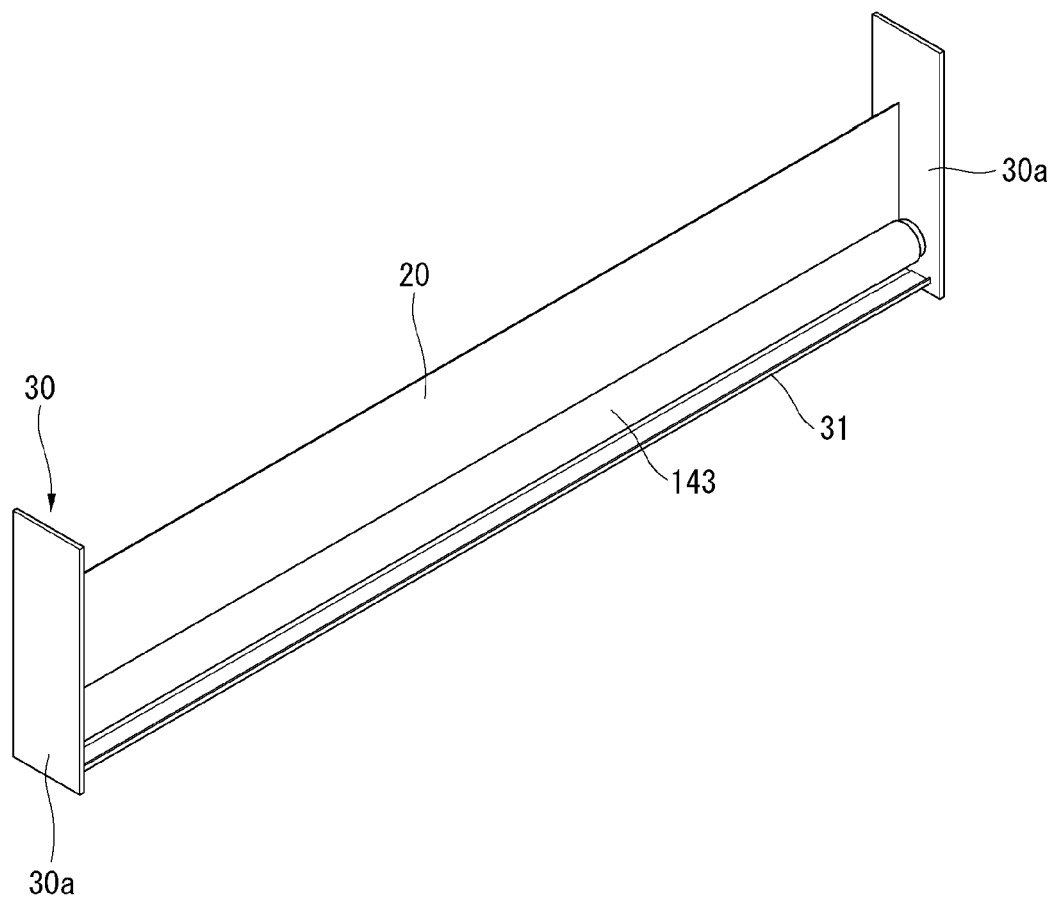

Referring to FIG. 17, the panel roller 143, around which the display unit 20 is wound, may be mounted on a first base 31. The first base 31 may be the bottom wall of the housing 30. The panel roller 143 may extend in the longitudinal direction of the housing 30. The first base 31 may be connected to side walls 30a of the housing 30.

Figure 18:
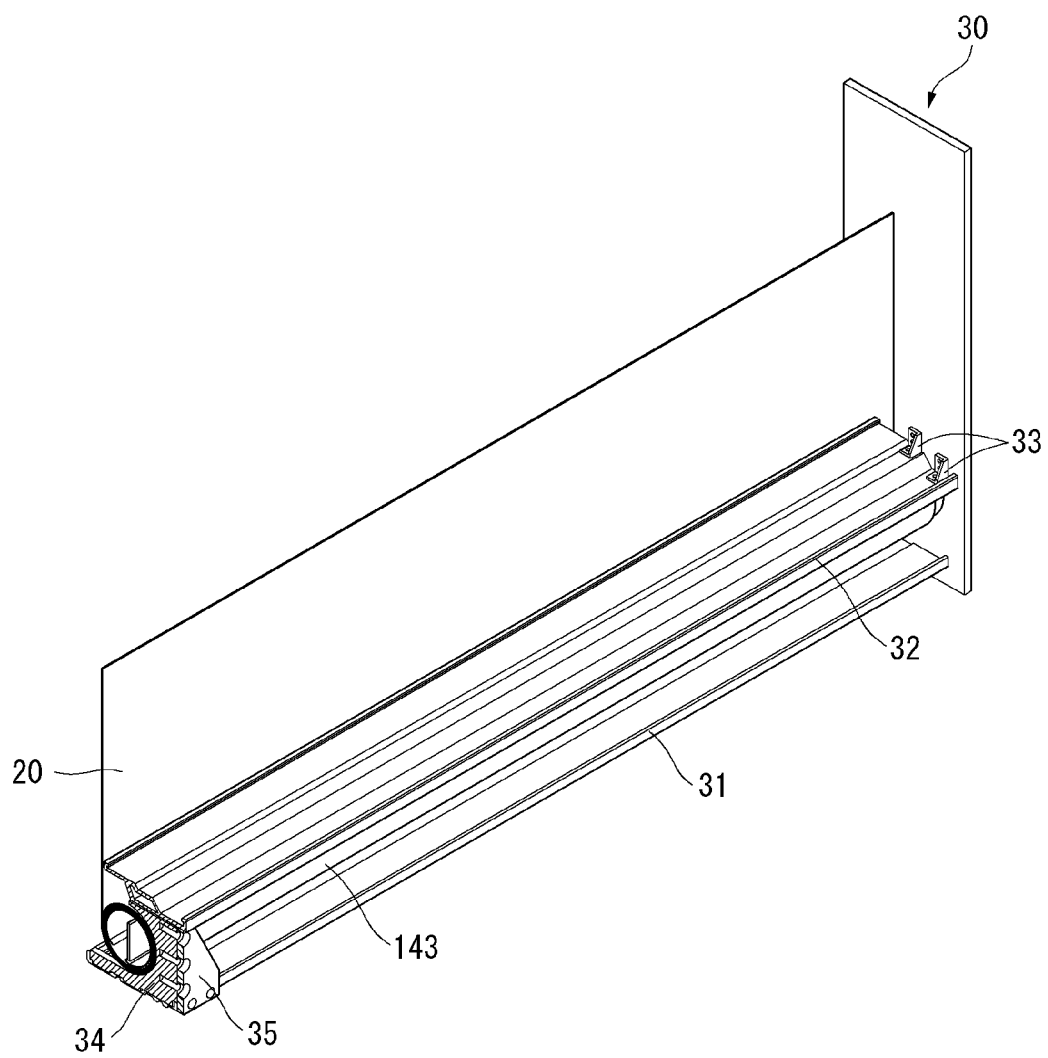
Figure 19:
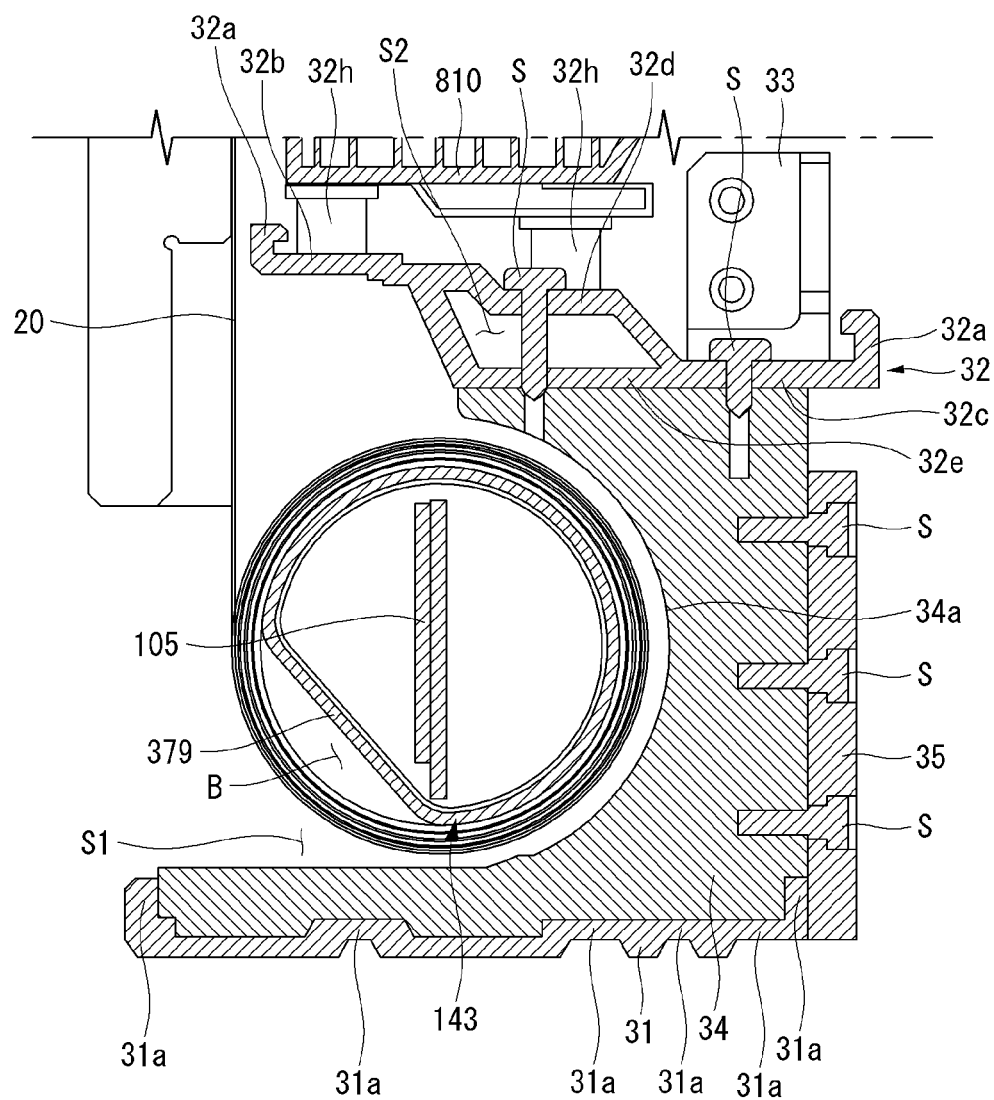

Referring to FIGS. 18 and 19, a beam 31a may be formed at the first base 31. The beam 31a may increase the bending or torsional rigidity of the first base 31. Many components may be mounted on the first base 31, and the first base 31 may be subjected to a high load. Since the rigidity of the first base 31 is increased, it is possible to prevent the first base 31 from drooping due to the load. For example, the beam 31a may be formed through a pressing process.

A second base 32 may be spaced apart from the first base 31 in an upward direction. A space S1 may be defined between the first base 31 and the second base 32. The panel roller 143, around which the display unit 20 is wound, may be received in the space S1. The panel roller 143 may be positioned between the first base 31 and the second base 32.

The second base 32 may be connected to the side walls 30a of the housing 30. A bracket 33 may be fastened to the upper surface of the first base 31. The bracket 33 may be fastened to the side walls 30a of the housing 30.

A beam 32a may be formed at the second base 32. The beam 32a may increase the bending or torsional rigidity of the second base 32. For example, the beam 32a may be formed through a pressing process.

A third part 32d may be connected both to a first part 32b and to a second part 32c. A fourth part 32e may be connected both to the first part 32b and to the second part 32c. A space S2 may be defined between the third part 32d and the fourth part 32e. Consequently, the bending or torsional rigidity of the second base 32 may be increased. The third part 32d may be referred to as a reinforcing rib 32d or a rib 32d. The fourth part 32e may be referred to as a reinforcing rib 32e or a rib 32e.

Many components may be mounted on the second base 32, and the second base 32 may be subjected to a high load. Since the rigidity of the second base 32 is increased, it is possible to prevent the second base 32 from drooping due to the load.

A first reinforcing plate 34 may be positioned between the first base 31 and the second base 32. The first reinforcing plate 34 may be fastened to the second base 32 by means of a screw. The first reinforcing plate 34 may support the second base 32. The first reinforcing plate 34 is capable of preventing the second base 32 from drooping. The first reinforcing plate 34 may be positioned at the central portion of the first base 31 or the central portion of the second base 32. The first reinforcing plate 34 may include a curved portion 34a. The curved portion 34a may be formed along the panel roller 143. The curved portion 34a may not be in contact with the panel roller 143 or the display unit wound around the panel roller 143. The curved portion 34a may be spaced apart from the panel roller 143 by a predetermined distance so as to prevent the curved portion 34a from interfering with the rotation of the panel roller 143.

A second reinforcing plate 35 may be fastened both to the first base 31 and to the first reinforcing plate 34. The second reinforcing plate 35 may support the first reinforcing plate 34. The second reinforcing plate 35 may be positioned behind the first reinforcing plate 34. The second reinforcing plate 35 may be positioned behind the first base 31. The second reinforcing plate 35 may be positioned so as to be perpendicular to the first base 31. The second reinforcing plate 35 may be fastened to the beam 31a of the first base 31. The second base 32 may face the front surface or the rear surface of the housing 30.

Figure 20:
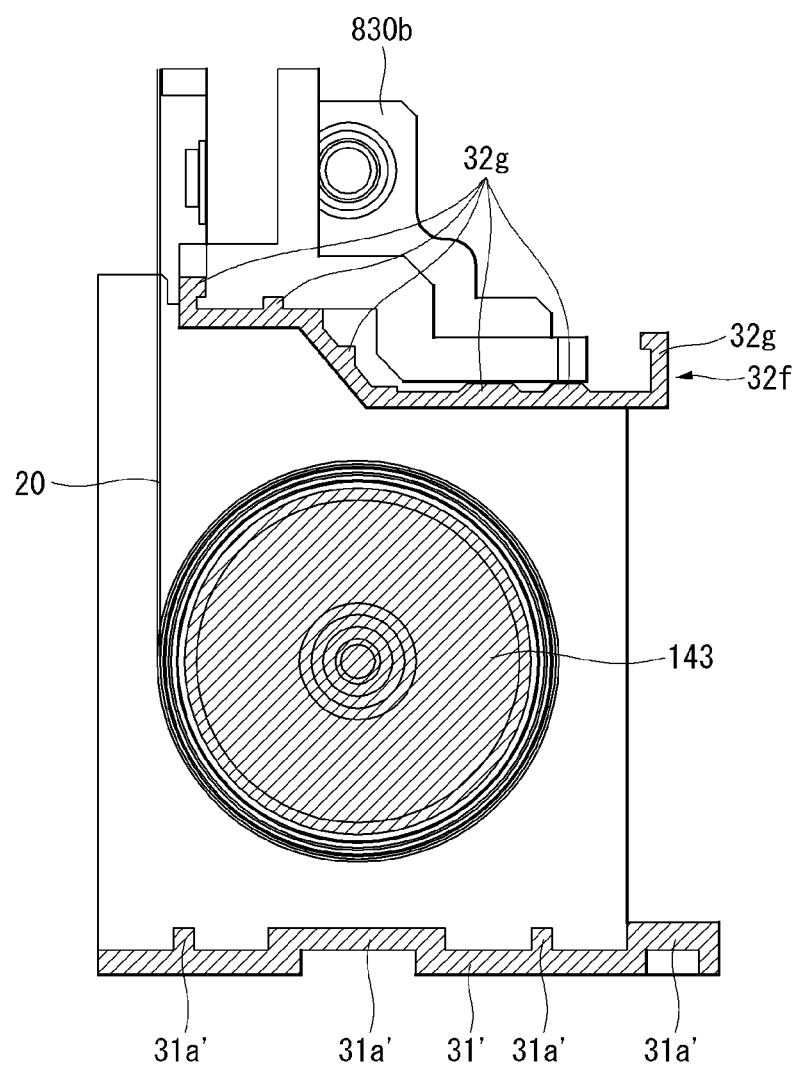

Referring to FIG. 20, a second base 32f may not define a space. When the load to which the second base 32f is subjected is not great, the second base 32f may have been imparted with sufficient rigidity by including a beam 32g. A first base 31' may include a beam 31a'.

Figure 21:
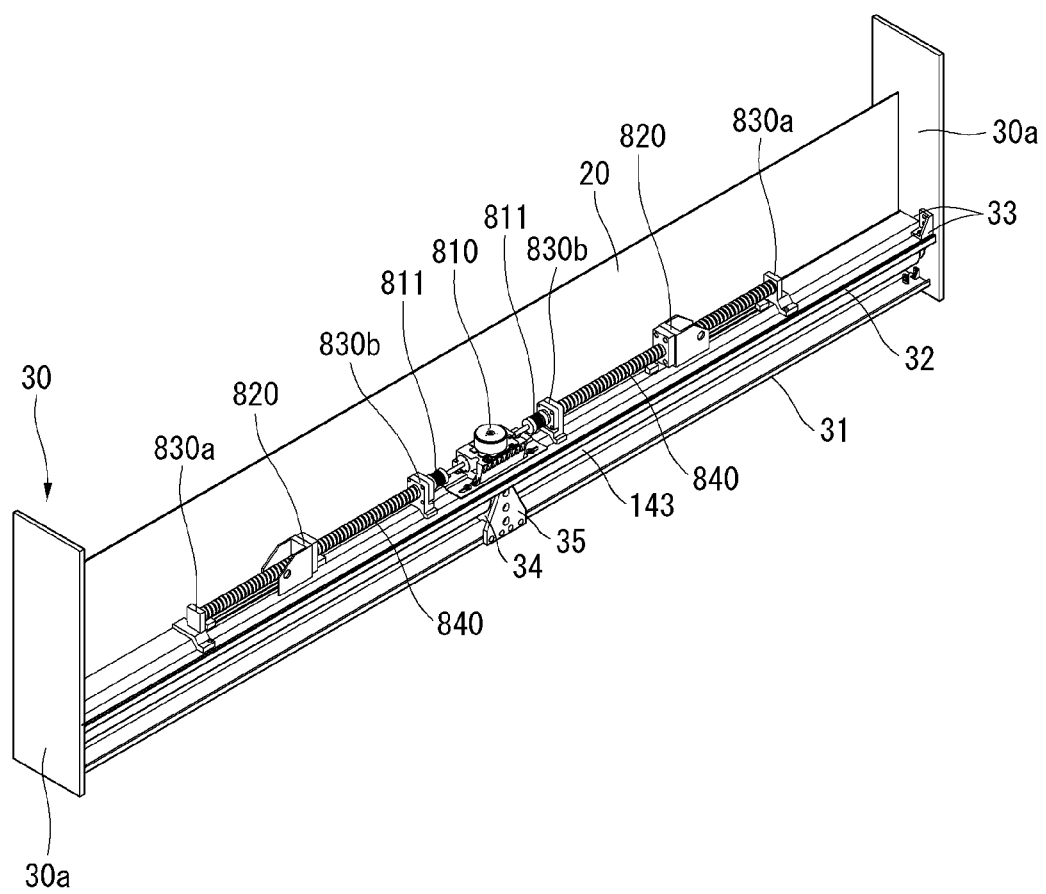
Figure 22:
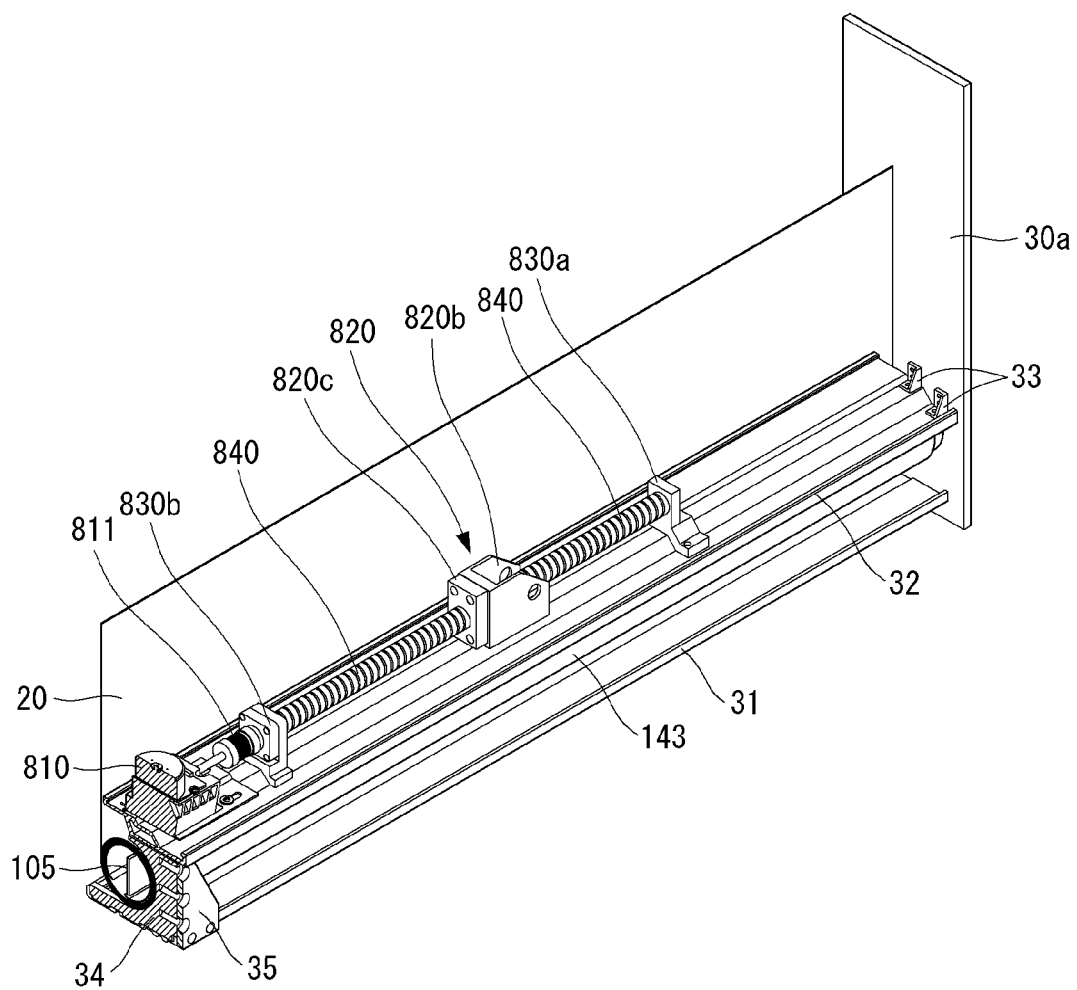

Referring to FIGS. 21 and 22, a motor assembly 810 may be mounted on the second base 32. The motor assembly 810 may be provided at opposite ends thereof with driving shafts. The right and left driving shafts of the motor assembly 810 may be rotated in the same direction. Alternatively, the right and left driving shafts of the motor assembly 810 may be rotated in opposite directions.

The motor assembly 810 may include a plurality of motors. The plurality of motors may be connected to each other in series. Since the plurality of motors are connected to each other in series, the motor assembly 810 is capable of outputting a high torque.

Lead screws 840 may be positioned to the right and left sides of the motor assembly 810. The motor assembly 810 may be connected to the lead screws 840. Couplings 811 may connect the lead screws 840 to the driving shafts of the motor assembly 810.

The lead screws 840 may be provided with threads, which extend longitudinally. The direction in which a thread is formed in the right lead screw 840 and the direction in which a thread is formed in the left lead screw 840, may be opposite each other. The direction in which a thread is formed in the right lead screw 840 and the direction in which a thread is formed on the left lead screw 840 may be the same. The pitch of thread of the left lead screw 840 and the pitch of the thread of the right lead screw 830 may be the same as each other.

Bearings 830a and 830b may be mounted on the second base 32. A pair of bearings 830a and 830b may support opposite ends of each of the lead screws 840. A pair of bearings 830a and 830b may include an inner bearing 830b, which is positioned close to the motor assembly 810, and an outer bearing 830a, which is positioned far from the motor assembly 810. The lead screws 840 may be stably rotated by means of the bearings 830a and 830b.

Slides 820 may be engaged with the lead screws 840. The slides 820 may be moved in the longitudinal direction of the lead screws 840 by rotation of the lead screws 840. Each of the slides 820 may be moved between the outer bearing 830a and the inner bearing 830b. The slides 820 may be respectively provided at the left lead screw 840 and the right lead screw 840. The left slide 820 may be engaged with the left lead screw 840, and the right slide 820 may be engaged with the right lead screw 840.

The left slide 820 and the right slide 820 may be symmetrically positioned with respect to the motor assembly 810. By driving the motor assembly 810, the left slide 820 and the right slide 820 may be moved away from or close to the motor assembly 810 by the same distance.

Figure 23:
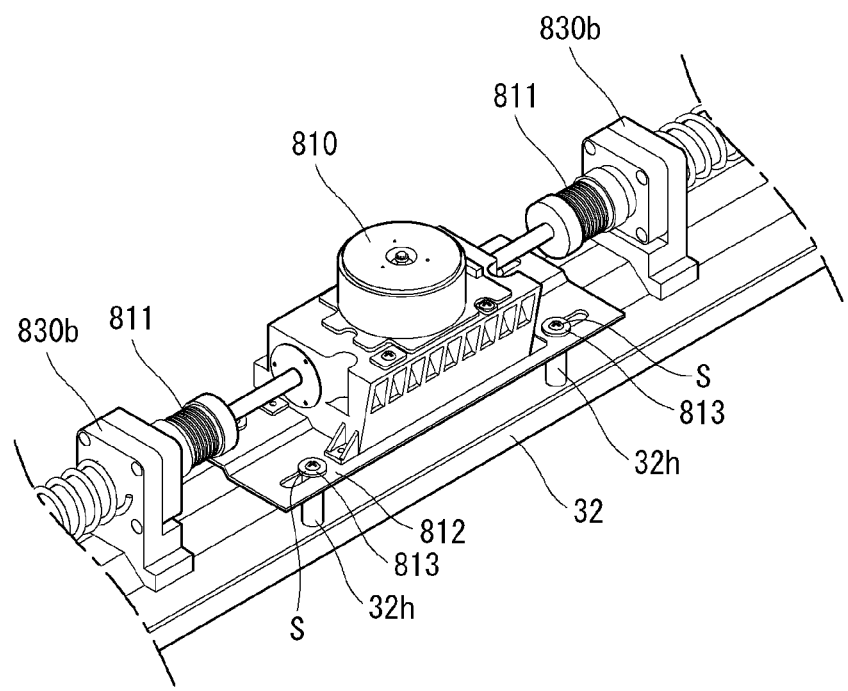

Referring to FIG. 23, the motor assembly 810 may include a plate 813. The plate 813 may be referred to as a mount plate 813 or a motor mount plate 813. A coupler 32h may be formed on the upper surface of the second base 32. The plate 813 may be fastened to the coupler 32h by means of a screw S. The motor assembly 810 may be spaced apart from the upper surface of the second base 32. A washer 813 may be positioned between the upper surface of the plate 813 and the screw S. The washer 813 may include a rubber material. The washer 813 is capable of reducing vibration generated by the motor assembly 810. The washer 813 is capable of improving the driving stability of the display device 100.

Figure 24:
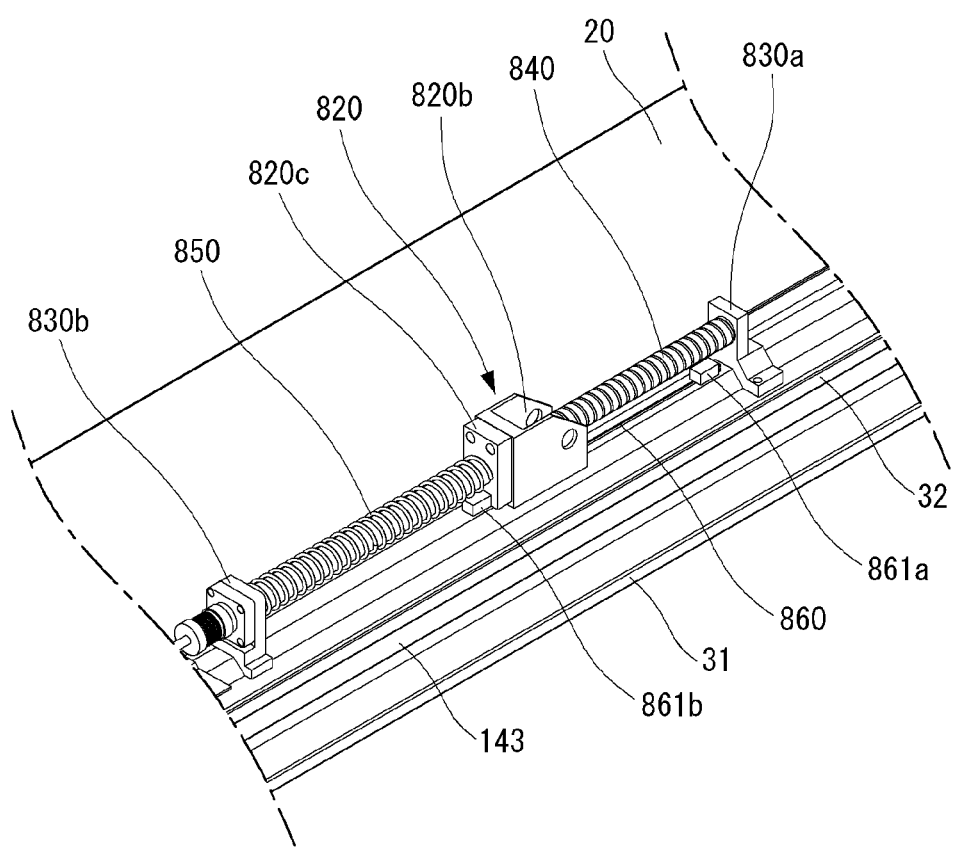

Referring to FIG. 24, a guide rail 860 may be provided at the second base 32. The guide rail 860 may be positioned so as to be parallel to the lead screw 840. The slide 820 may be engaged with the guide rail 860. A first stopper 861b may be positioned at the first end of the guide rail 860, and a second stopper 861a may be positioned at the second end of the guide rail 860. The range within which the slide 820 is movable may be limited between the first stopper 861b and the second stopper 861a.

The spring 850 may surround the lead screw 840. The lead screw 840 may extend through the spring 850. The spring 850 may be positioned between the inner bearing 830b and the slide 820. The first end of the spring 850 may be in contact with the inner bearing 830b, and the second end of the spring 850 may be in contact with the slide 820. The spring 850 may apply elastic force to the slide 820.

When the slide 820 reaches the first stopper 861b, the spring 850 may be maximally compressed. When the slide 820 reaches the second stopper 861b, the length of the spring 850 may be minimized. When the slide 820 reaches the first stopper 861b, the distance between the slide 820 and the inner bearing 830b may be minimized.

Figure 25:
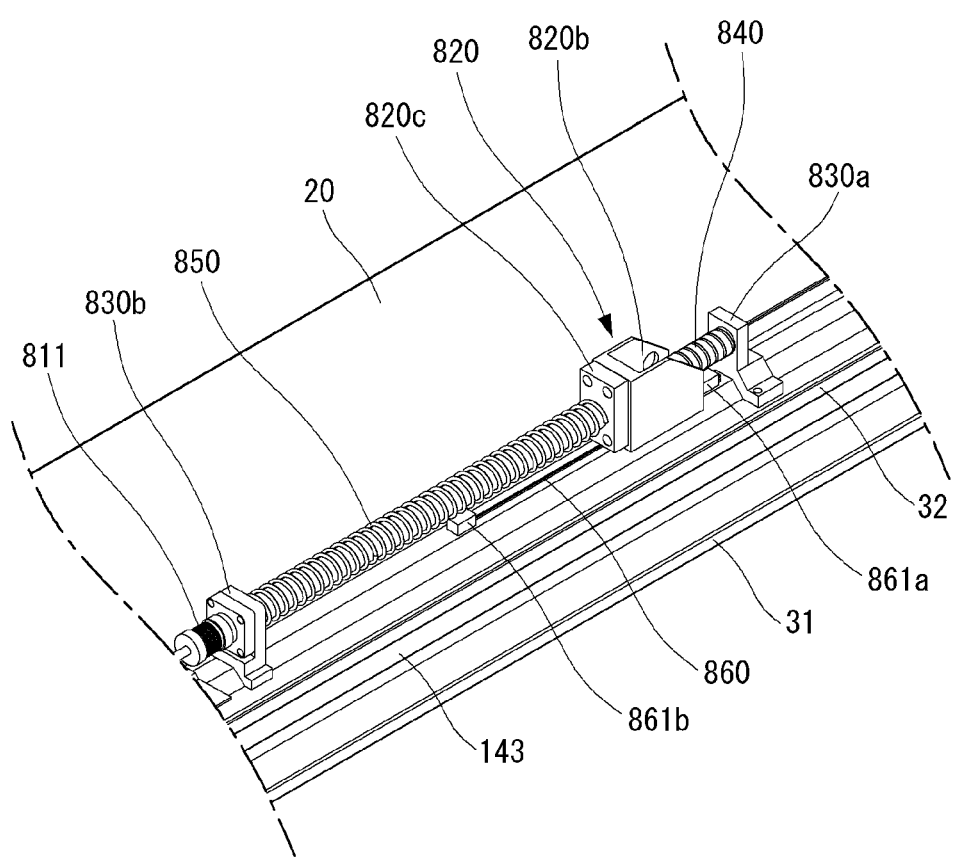

Referring to FIG. 25, when the slide 820 reaches the second stopper 861a, the spring 850 may be maximally extended. When the slide 820 reaches the second stopper 861b, the length of the spring 850 may be maximized. When the slide 820 reaches the second stopper 861a, the distance between the slide 820 and the inner bearing 830b may be maximized.

Figure 26:
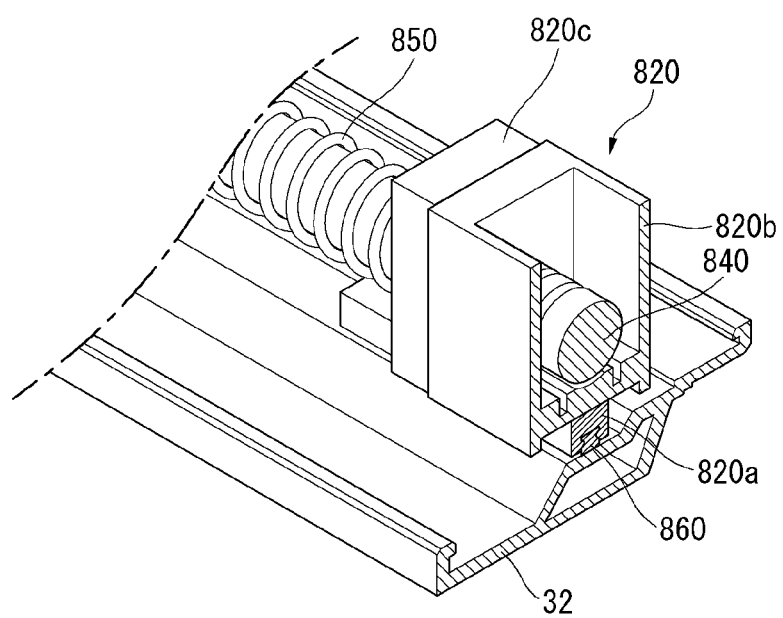

Referring to FIG. 26, a first part 820a may be engaged with the guide rail 860. The first part 820a may be moved along the guide rail 860. The movement of the first part 820a in the longitudinal direction of the guide rail 860 may be restricted. A second part 820b may be positioned above the first part 820a. The first part 820a and the second part 820b may be fastened to each other by means of a screw. The second part 820b may be spaced apart from the guide rail 860. The lead screw 840 may extend through the second part 820b. For example, the second part 820b may include a female thread, which is engaged with a male thread of the lead screw 840. Accordingly, even when the lead screw 840 is rotated, the slide 820 may be stably moved forward or rearward along the guide rail 860 without rotation.

A third part 820c may be coupled to a side of the second part 820b. The third part 820c may be in contact with the spring 850. The third part 820c may receive elastic force from the spring 850.

Figure 27:
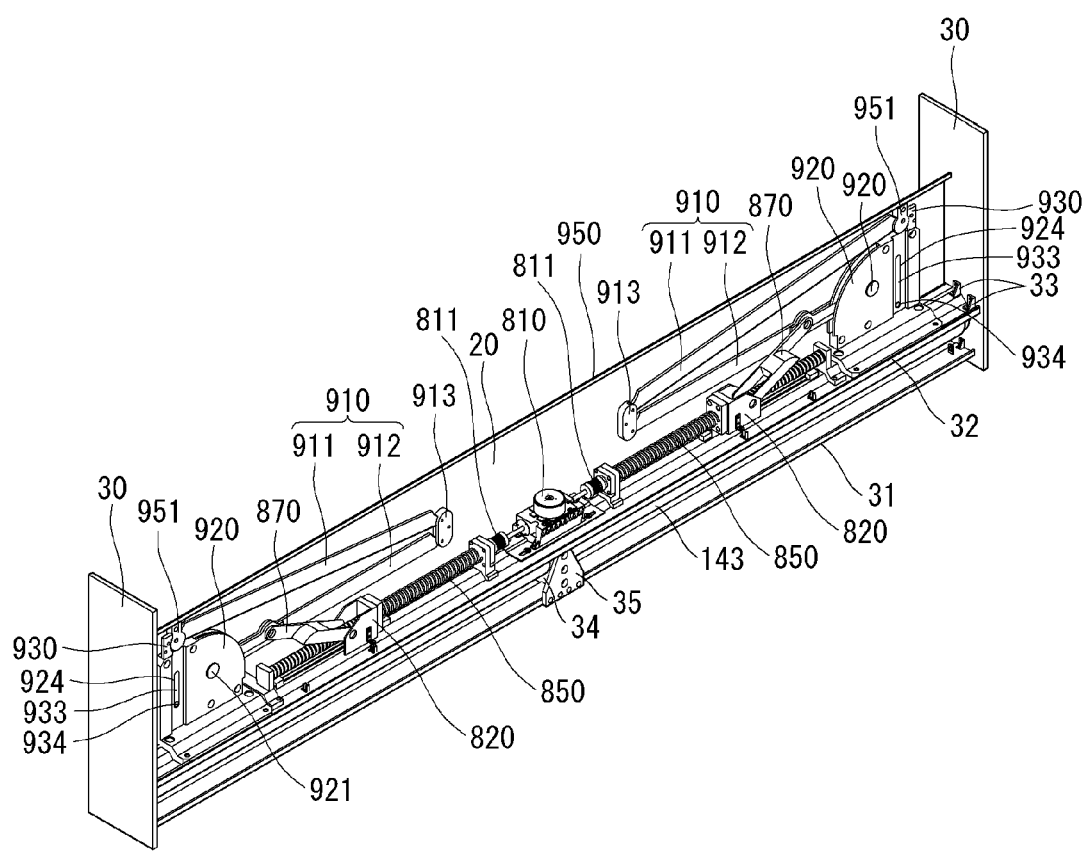
Figure 28:
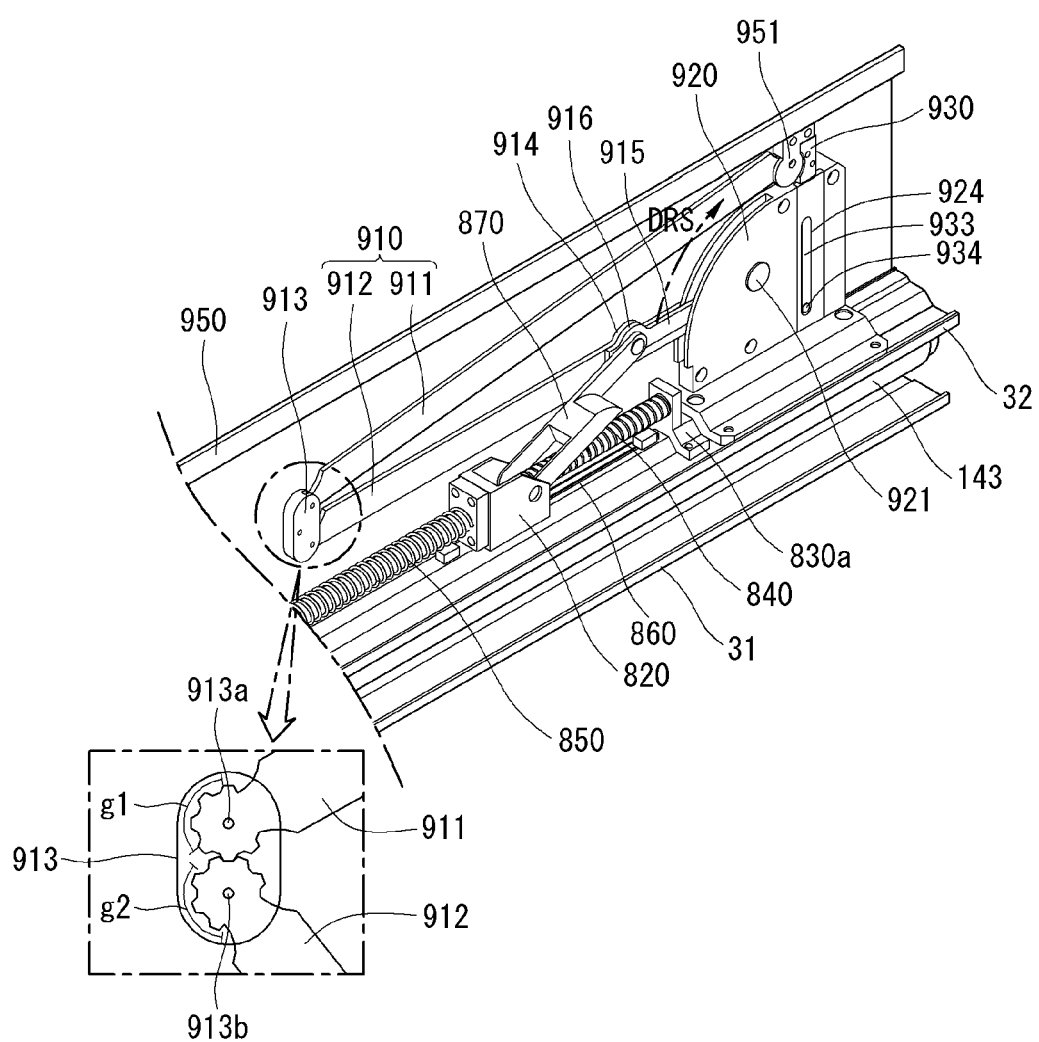

Referring to FIGS. 27 and 28, the link mount 920 may be mounted on the second base 32. The first end of a second arm 912 may be pivotably connected to the link mount 920. The second end of the second arm 912 may be pivotably connected to a joint 913. The second end of the second arm 912 may be pivotably connected to a second shaft 913b. The first end of a rod 870 may be pivotably connected to the slide 820. The second end of the rod 870 may be pivotably connected to the second arm 912 or to a third arm 915. The first end of the third arm 915 may be pivotably connected to the link mount 920. The second end of the third arm 915 may be pivotably connected to the second end of the rod 870. The link mount 920 may include a shaft 921. The second arm 912 or a third arm 911 may be pivotably connected to the shaft 921.

A link bracket 951 may be referred to as a link cap 951. The link bracket 951 may be coupled to a top case 950. The top case 950 may be referred to as a case top 950, an upper bar 950, a top 950 or a bar 950. The top case 950 may be positioned at the upper end of the display unit 20. The display unit 20 may be fixed to the top case 950.

The first end of the first arm 911 may be pivotably connected to a joint 913. The first end of the first arm 911 may be pivotably connected to the first shaft 913a. The second end of the first arm 911 may be pivotably connected to the link bracket 951 or to the top case 950.

A first gear g1 may be formed at the first end of the first arm 911. A second gear g2 may be formed at the second end of the second arm 912. The first gear g1 of the first arm 911 and the second gear g2 of the second arm 912 may be engaged with each other.

When the slide 820 is moved close to the outer bearing 830a, the second arm 912 or the second arm 915 may be erected. Here, the direction in which the second arm 912 or the third arm 915 is erected may be referred to as an erection direction DRS.

The second arm 912 may include a projection 914, which projects in the erection direction DRS. The projection 912 may be referred to as a connector 914. The third arm 915 may include a projection 916, which projects in the erection direction DRS. The projection 916 may be referred to as a connector 916. The projection 914 of the second arm 912 and the projection 916 of the third arm 915 may face each other, or may be in contact with each other. The second end of the rod 870 may be fastened to the projection 914 of the second arm 912 or to the projection 916 of the third arm 915.

The link 910 may include the first arm 911, the second arm 912, the third arm 915 and/or the joint 913.

Figure 29:
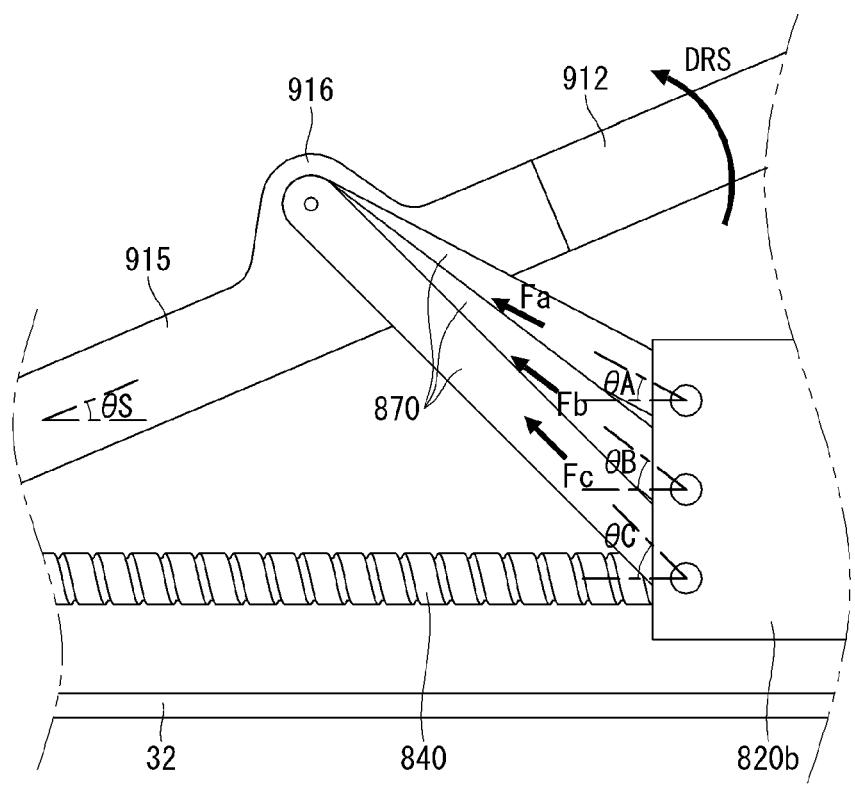
Figure 30:
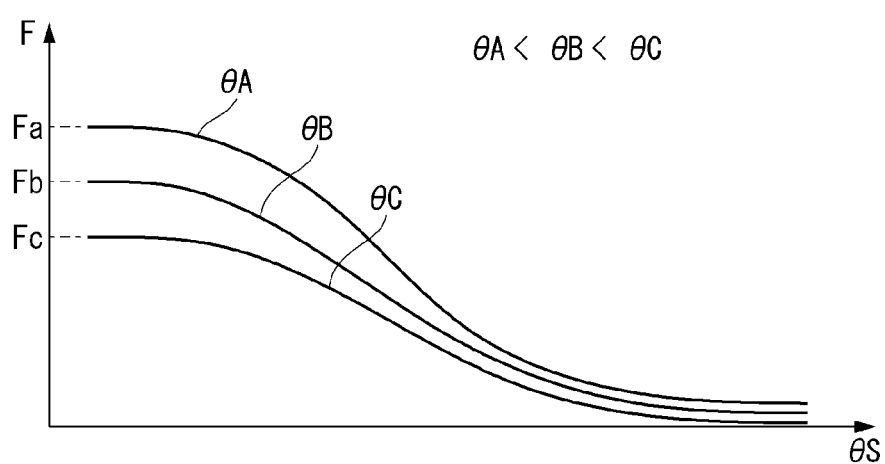

Referring to FIGS. 29 and 30, the angle defined between the second arm 912 or the third arm 915 and the second base 32 may be defined as θS. When the rod 870 is connected to an upper portion of the second part 820b, the angle defined between the rod 870 and the second base 32 may be defined as θA, and the minimal force required to erect the second arm 912 or the third arm 915 by the rod 870 may be defined as Fa. When the rod 870 is connected to an intermediate portion of the second part 820b, the angle defined between the rod 870 and the second base 32 may be defined as θB, and the minimal force required to erect the second arm 912 or the third arm 915 by the rod 870 may be defined as Fb. When the rod 870 is connected to a lower portion of the second part 820b, the angle defined between the rod 870 and the second base 32 may be defined as θC, and the minimal force required to erect the second arm 912 or the third arm 915 by the rod 870 may be defined as Fc.

For the same θS, the relationship θA<θB<θC may be established. Furthermore, for the same θS, the relationship Fc<Fb<Fa may be established. If the angle defined between the second arm 912 or the third arm 915 and the second base 32 is constant, the force required to erect the second arm 912 or the third arm 915 may decrease as the angle defined between the rod 870 and the second base 32 increases. It is possible to reduce the load applied to the motor assembly 810 by connecting the load 870 to a lower portion of the second part 820b.

Figure 31:
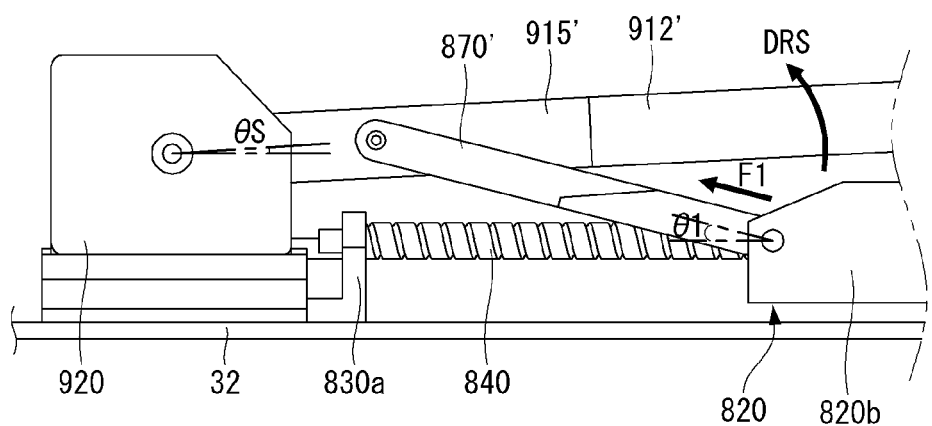

Referring to FIG. 31, a rod 870' may not be connected to a projection of a second arm 912' or to a projection of a third arm 915'. When the angle defined between the second arm 912' or the third arm 915' and the second base 32 is θS, the angle defined between the rod 870' and the second base 32 may be defined as θ1, and the minimal force required to erect the second arm 912' or the third arm 915' by the rod 870' may be defined as F1.

Figure 32:
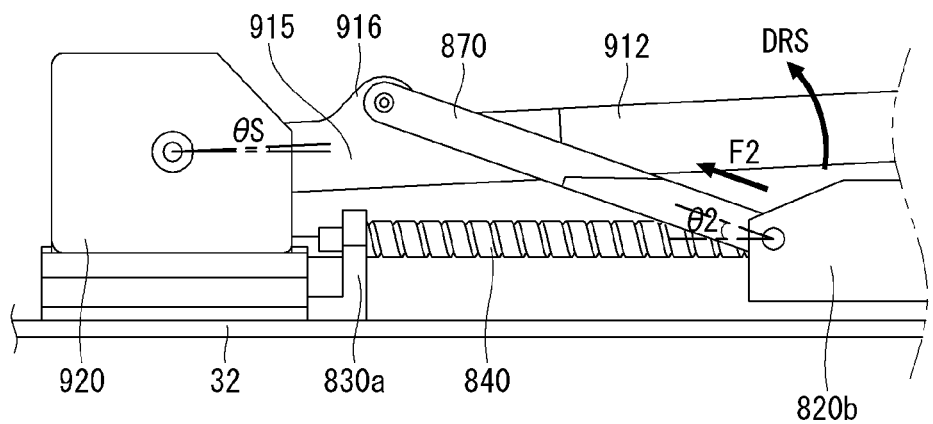

Referring to FIG. 32, the rod 870 may be connected to the projection 914 of the second arm 912 or to the projection 916 of the third arm 915. When the angle defined between the second arm 912 or the third arm 915 and the second base 32 is θS, the angle defined between the rod 870 and the second base 32 may be defined as θ2, and the minimal force required to erect the second arm 912 or the third arm 915 by the rod 870 may be defined as F2.

Figure 33:
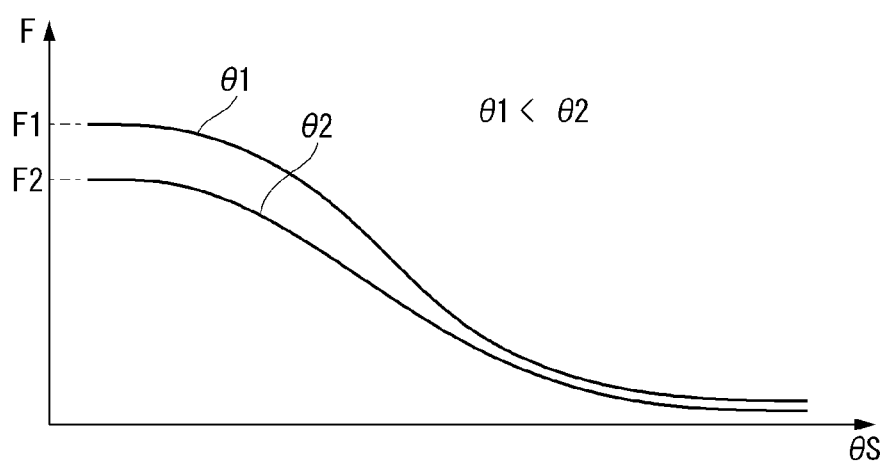

Referring to FIG. 33, for the same θS, θ2 may be larger than θ1. For the same θS, F1 may be greater than F2. When the angle defined between the second arm 912 or 912' and the second base 32 is constant, the force required to erect the second 912 or 912' may decrease as the angle defined between the rod 870 or 870' and the second base 32 increases. Since the rod 870 is connected to the projections 914 and 916, it is possible to erect the second arm 912 with a smaller force than that in the case in which the rod 870' is not connected to the projections. Since the rod 870 is connected to the projections 914 and 916, it is possible to decrease the load applied to the motor assembly 810.

Figure 34:
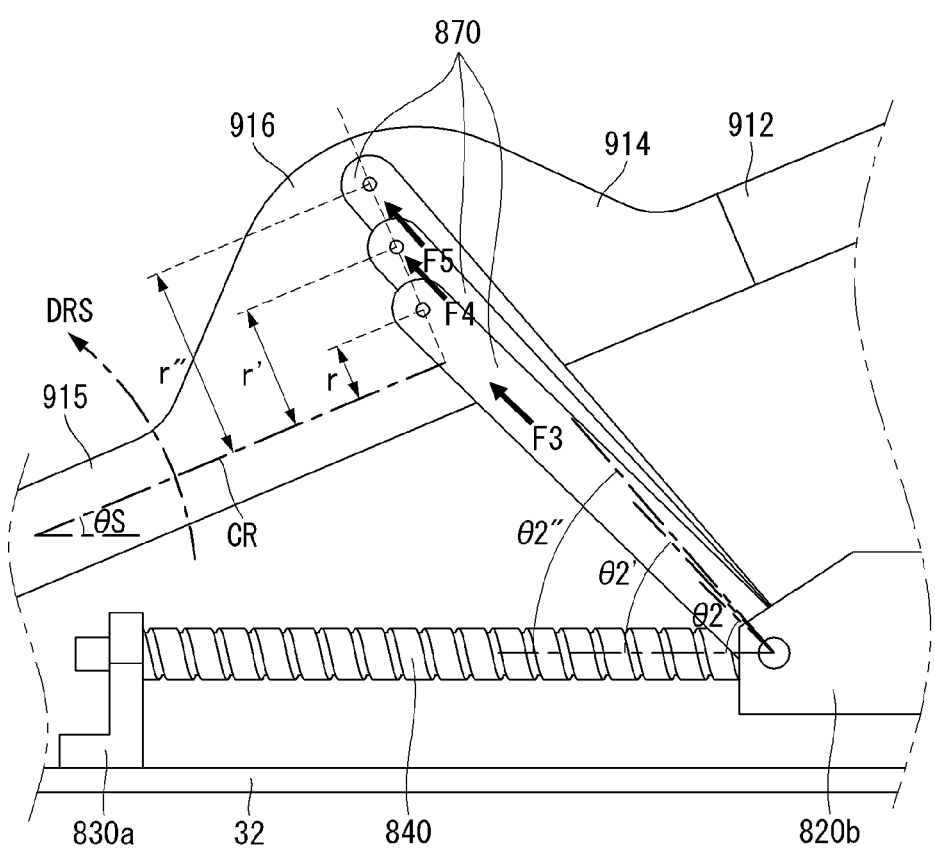

Referring to FIG. 34, the second arm 912 or the third arm 915 may have the central axis CR. When the rod 870 is connected to a point of the second arm 912, which is spaced apart from the central axis CR by a distance r, the angle defined between the rod 870 and the second base 32 may be defined as θ2, and the minimal force required to erect the second arm 912 or the third arm 915 by the rod 870 may be defined as F3. When the rod 870 is connected to a point of the second arm 912, which is spaced apart from the central axis CR by a distance r', the angle defined between the rod 870 and the second base 32 may be defined as θ2', and the minimal force required to erect the second arm 912 or the third arm 915 by the rod 870 may be defined as F4. When the rod 870 is connected to a point of the second arm 912, which is spaced apart from the central axis CR by a distance r", the angle defined between the rod 870 and the second base 32 may be defined as θ2", and the minimal force required to erect the second arm 912 or the third arm 915 by the rod 870 may be defined as F5.

Figure 35:
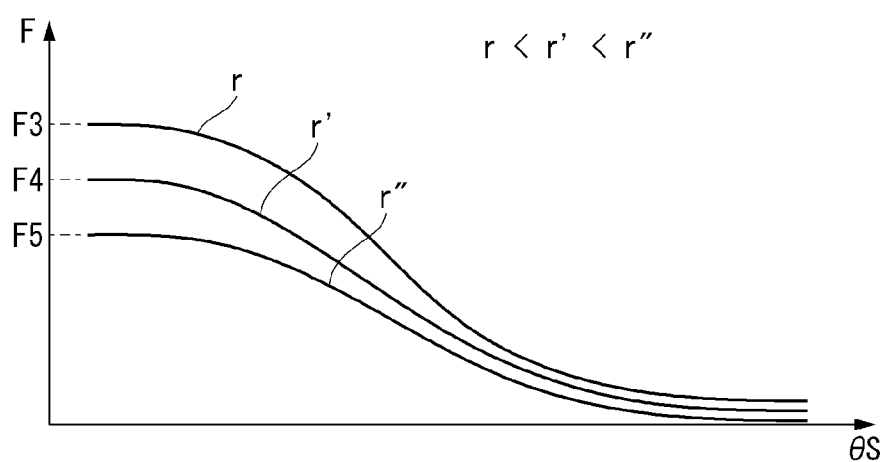

Referring to FIG. 35, for the same θS, θ2" may be larger than θ2', and θ2' may be larger than θ2. For the same θS, F3 may be greater than F4, and F4 may be greater than F5. As the distance between the rod 870 and the central axis CR increases, the force required to erect the second arm 912 may decrease. Since the rod 870 is connected to a point that is far from the central axis CR, it is possible to reduce the load applied to the motor assembly 810.

Figure 36:
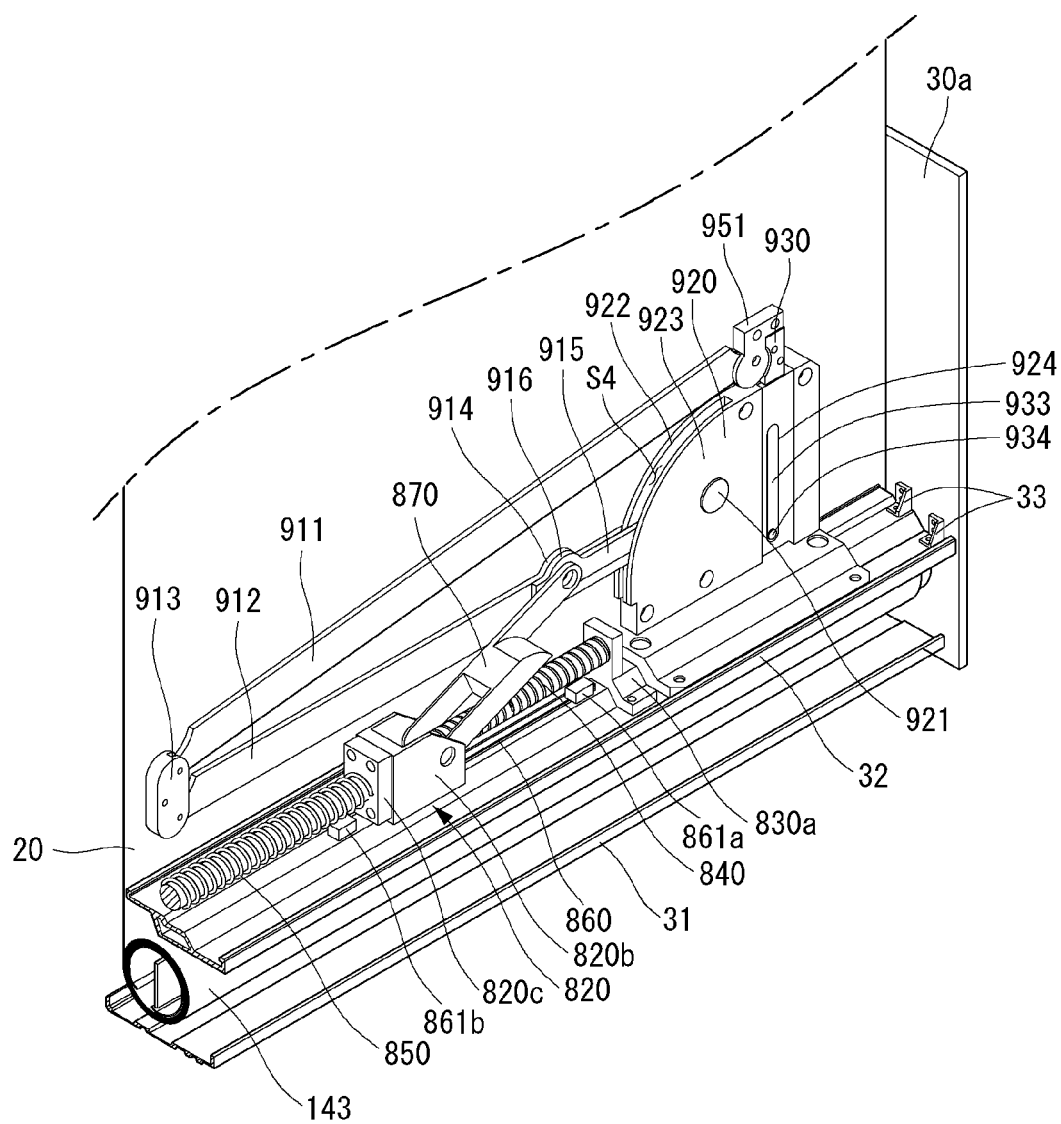

Referring to FIG. 36, the first arm 911 and the second arm 912 may be in contact with or close to the rear surface of the display unit 20. Since the first arm 911 and the second arm 912 may be in contact with or close to the rear surface of the display unit 20, it is possible to stably roll or unroll the display unit 20. The link mount 920 may include a first part 922 and a second part 923. The first part 922 and the second part 923 may face each other. A space S4 may be defined between the first part 922 and the second part 923. The first part 922 may face the display unit 20. The first part 922 may be positioned closer to the display unit 20 than is the second part 923. The second arm 912 may be pivotably connected to the front surface of the first part 922. The third arm 915 may be partially received in the space S4, and may be pivotably connected to the first part 922 or to the second part 923.

Figure 37:
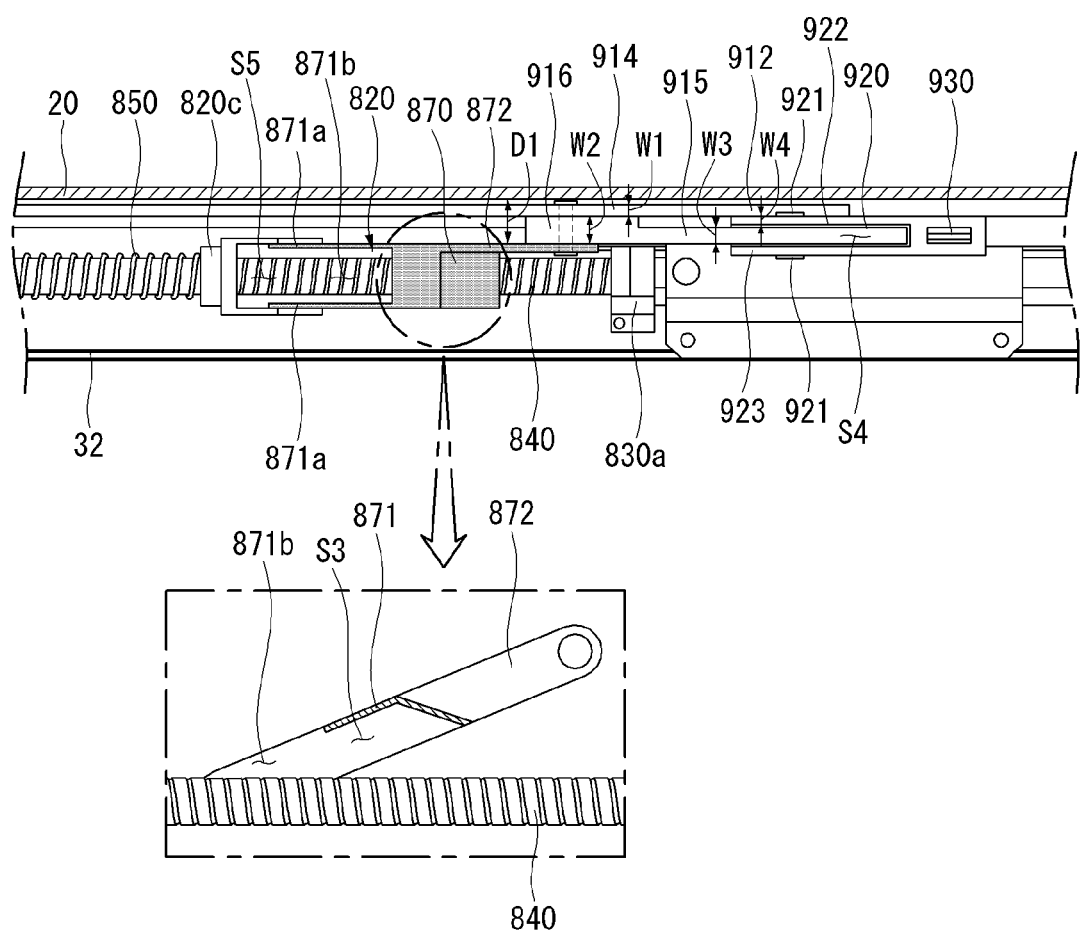

Referring to FIG. 37, the rod 870 may include a first part 871 and a second part 872. The first part 871 may include a connector 871*a* at the first end thereof. The second part 872 of the slide 820 may define therein a space S5. The connector 871*a* may be received in the space S5. The connector 871*a* may be pivotably connected to the second part 820*b* of the slide 820 (see FIG. 36). The second end of the first part 871 may be connected to the first end of the second part 872. The second end of the second part 872 may be pivotably connected to the second arm 912 or to the third arm 915. The first part 871 may define therein a space S3. The first part 871 may have therein a hole 871*b*. The lead screw 840 may be received in the hole 871*b* or the space S3.

The distance between the second part 872 and the display unit 20 may be D1. The second arm 912 may have a thickness W1. The portion of the third arm 915 that is received in the space S4 may have a thickness W3. The thickness W3 may be equal to the distance between the first part 922 and the second part 923. The portion of the third arm 915 that is not received in the space S4 may have a thickness W2. The first part 922 may have a thickness W4. The thickness W2 may be larger than the thickness W3. The thickness W2 may be equal to the sum of the thickness W3 and the thickness W4. The distance D1 may be the sum of the thickness W1 and the thickness W2.

The second arm 912 may be in contact with or close to the rear surface of the display unit 20, and the third arm 915 may be positioned between the second arm 912 and the second part 872. The second part 872 may stably transmit the force required to erect the second arm 912 through the third arm 915. In order to stably erect the second arm 912 or the third arm 915, the second part 872 may deviate forwards from the rotational axis of the lead screw 840, and may be connected to the first part 871. Consequently, the gap between the second arm 912 and the second part 872 may be minimized.

Figure 38:
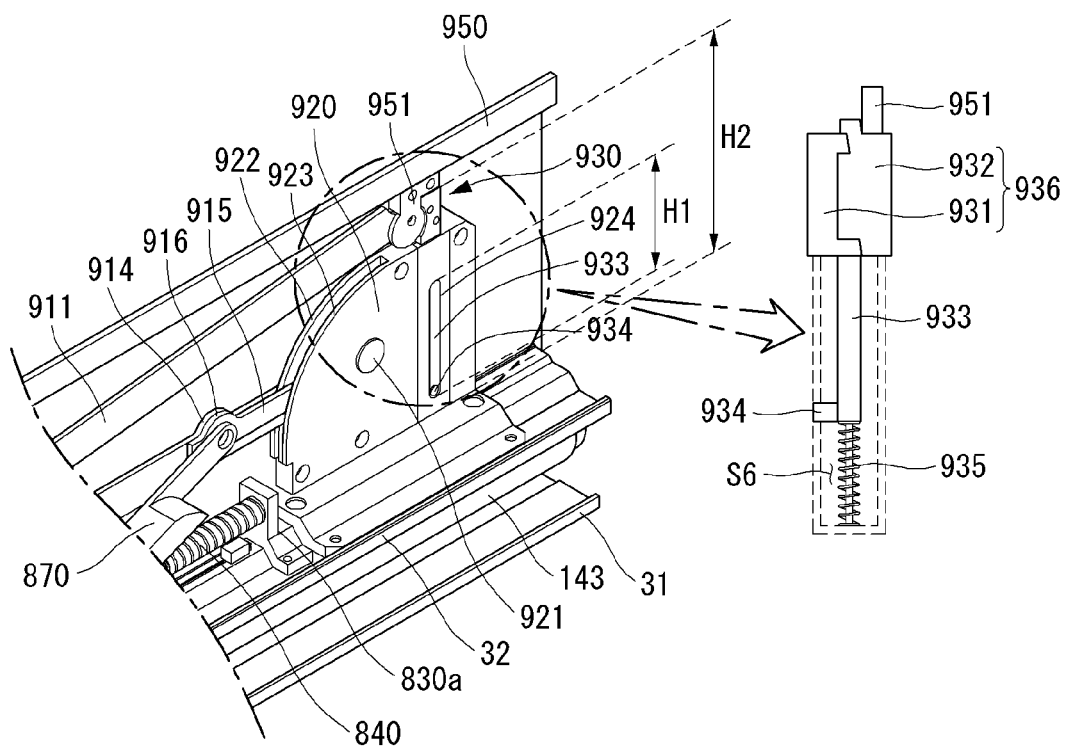

Referring to FIG. 38, a pusher 930 may be mounted on the link mount 920. The pusher 930 may be referred to as a lifter 930. A second part 932 may be fastened to a first part 931. The second part 932 may be brought into contact with or separated from the link bracket 951. The second part 932 may be made of a highly elastic material. The first part 931 may be made of a material having lower elasticity than that of the second part 932. The first part 931 may be made of a material having higher rigidity than that of the second part 932. The first part 931 and the second 932 may be collectively referred to as a head 936. The head 936 may be positioned above the link mount 920.

A third part 933 may be connected to the first part 931. Alternatively, the third part 933 may extend downwards from the first part 931. The third part 933 may be referred to as a tail 933. A fourth part 934 may project from the third part 933. The link mount 920 may define therein a space S6, and the third part 933 may be received in the space S6. The space S6 may be open at the upper face thereof. The space S6 in which the third part 933 is received may be adjacent to the space S4 (see FIG. 37) in which the third arm 915 is received. The second part 932 of the link mount 920 may have therein a hole 924. The hole 924 may be a long hole, which is elongated vertically. The length of the hole 924 may be H1. The fourth part 934 may be received in the hole 924. A spring 935 may be received in the space S6. The spring 935 may be positioned under the third part 933. The spring 935 may apply a vertical elastic force to the third part 933.

The head 936 may be larger than the diameter of the space S6. When the head 936 is positioned at the upper end of the space S6, the height of the head 936 from the second base 32 may be minimized. The minimal height of the head 936 may be H2. When the height of the head 936 is minimized, the fourth part 934 may be positioned at the lower end of the space S6. When the height of the head 936 is minimized, the spring 935 may be maximally compressed. When the height of the head 936 is minimized, the elastic force of the spring 935 may be maximized. When the height of the head 936 is minimized, the height of the top case 950 may be minimized.

The pusher 930 is capable of applying elastic force to the link bracket 951 while the pusher 930 is in contact with the link bracket 951. Accordingly, it is possible to decrease the load that is applied to the motor assembly in order to erect the link 910.

Figure 39:
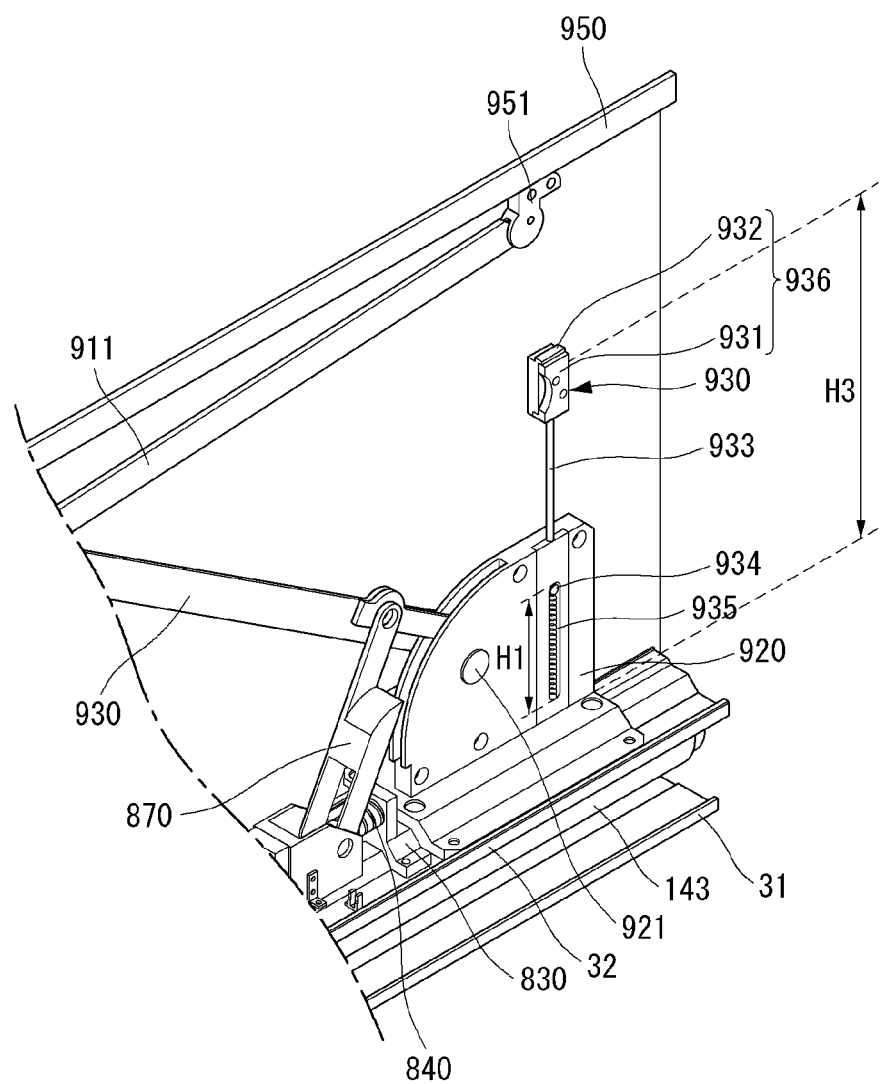

Referring to FIG. 39, when the link 910 is sufficiently erected, the pusher 930 may be separated from the link bracket 951. When the pusher 930 is separated from the link bracket 951, the height of the head 936 from the second base 32 may be maximized. The maximal height of the head 936 may be H3. When the height of the head 936 is maximized, the fourth part 934 may be positioned at the upper end of the hole 924 (see FIG. 38). When the height of the head 936 is maximized, the spring 935 may be maximally extended. When the height of the head 936 is maximized, the elastic force supplied from the spring 935 may be minimized. The maximal height H3 of the head 936 may be substantially equal to the sum of the minimal height H2 of the head 936 and the length H1 of the hole.

Figure 40:
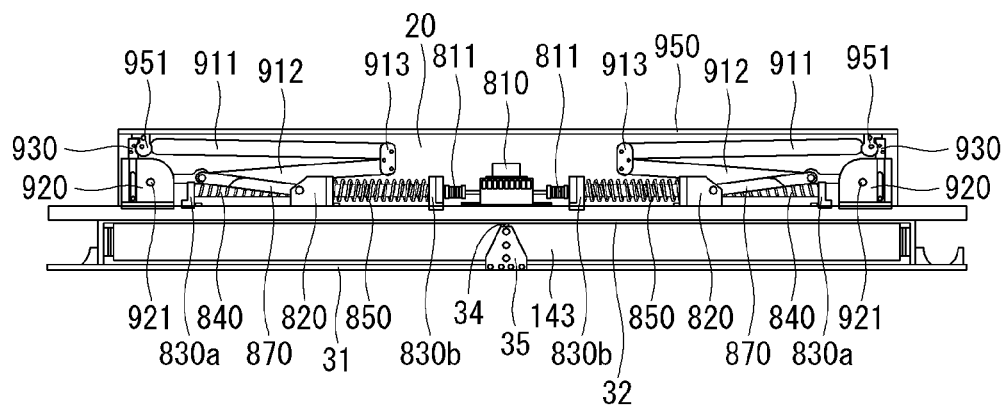

Referring to FIG. 40, the display unit 20 may be in a state of being maximally wound around the panel roller 143. The display device 100 may be bilaterally symmetrical with respect to the motor assembly 810. The height of the top case 950 may be minimized. The slide 820 may be positioned closest to the inner bearing 830b. The slide 820 may be restricted by the first stopper 861b. The spring 850 may be maximally compressed. The pusher 930 may be in contact with the link bracket 951. The height of the pusher 930 may be minimized.

Figure 41:
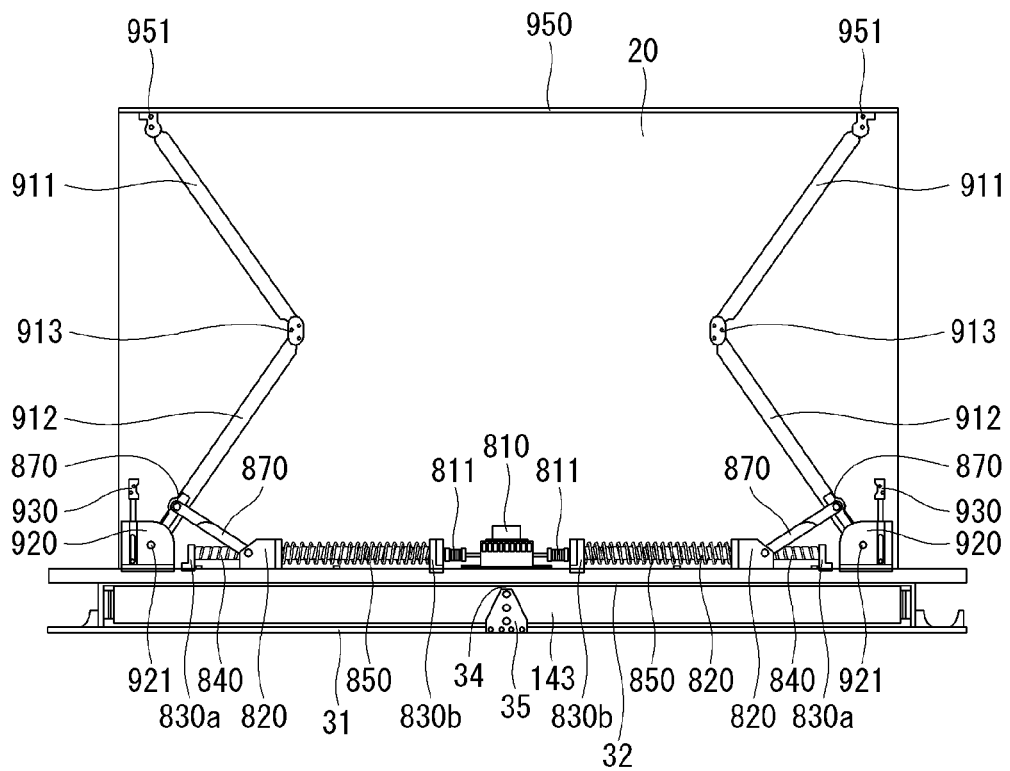

Referring to FIG. 41, the display unit 20 is in the state of being wound about halfway around the panel roller 142. The display device 100 may be bilaterally symmetrical with respect to the motor assembly 810. The display unit 20 may be unwound from the panel roller 143 about halfway. The slide 820 may be positioned between the first stopper 861b and the second stopper 861a. The pusher 930 may be separate from the link bracket 951. The height of the pusher 930 may be maximized.

Figure 42:
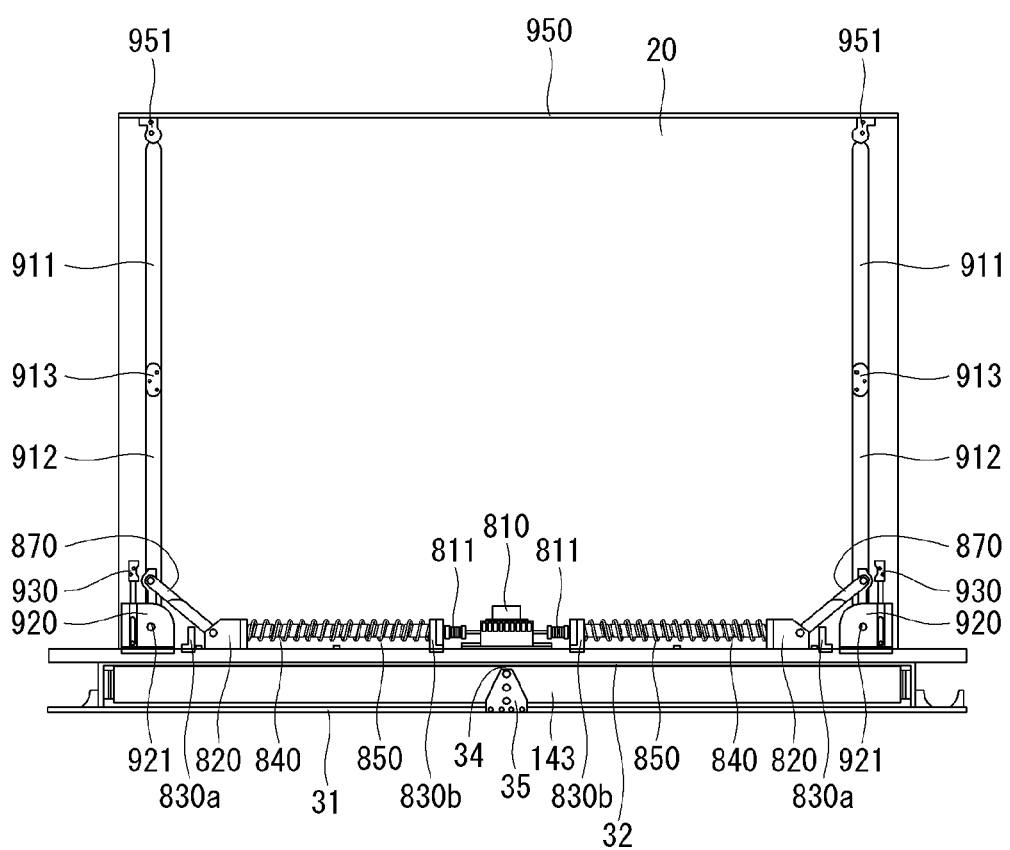
Figure 43:
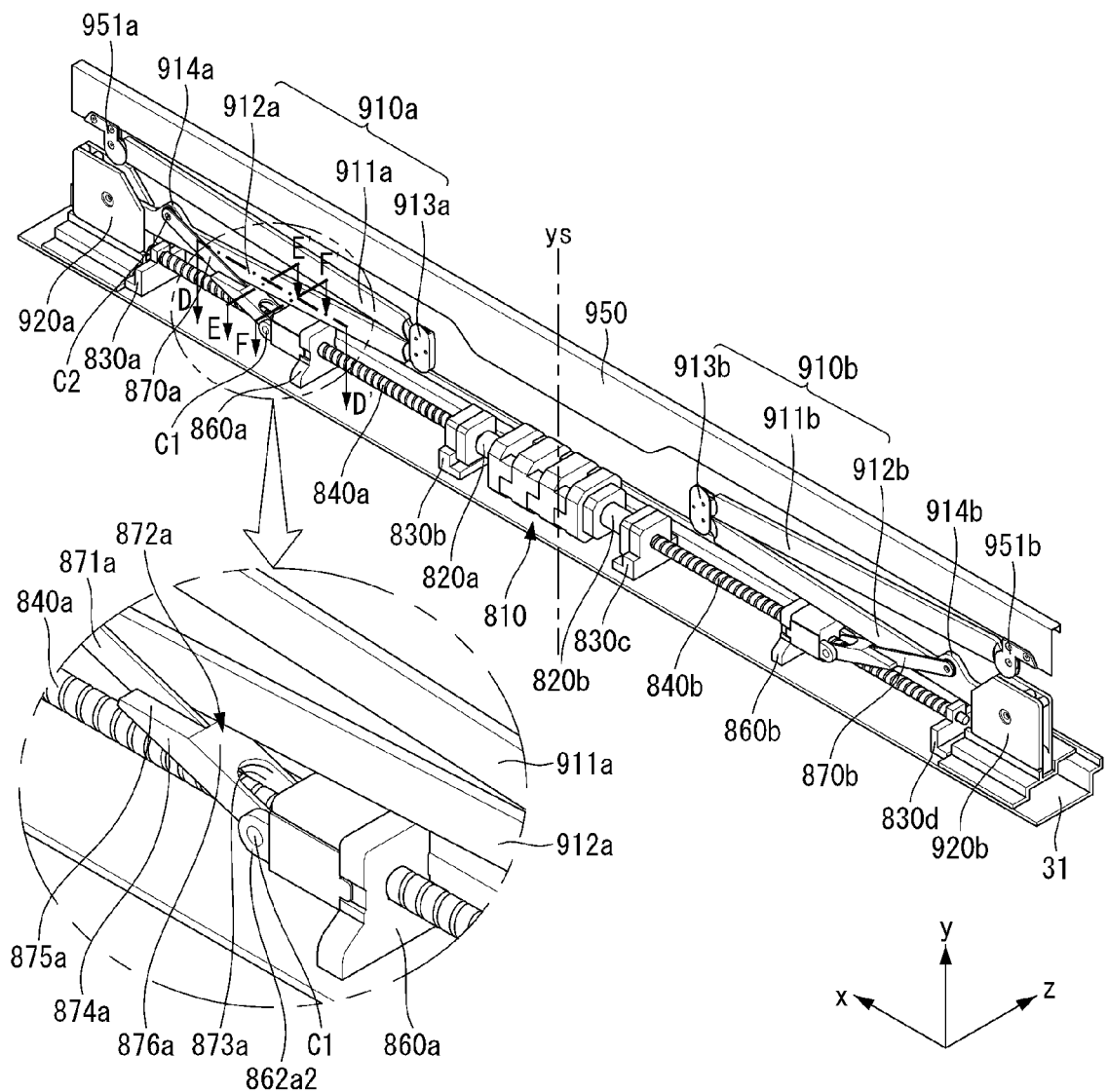
Figure 44:
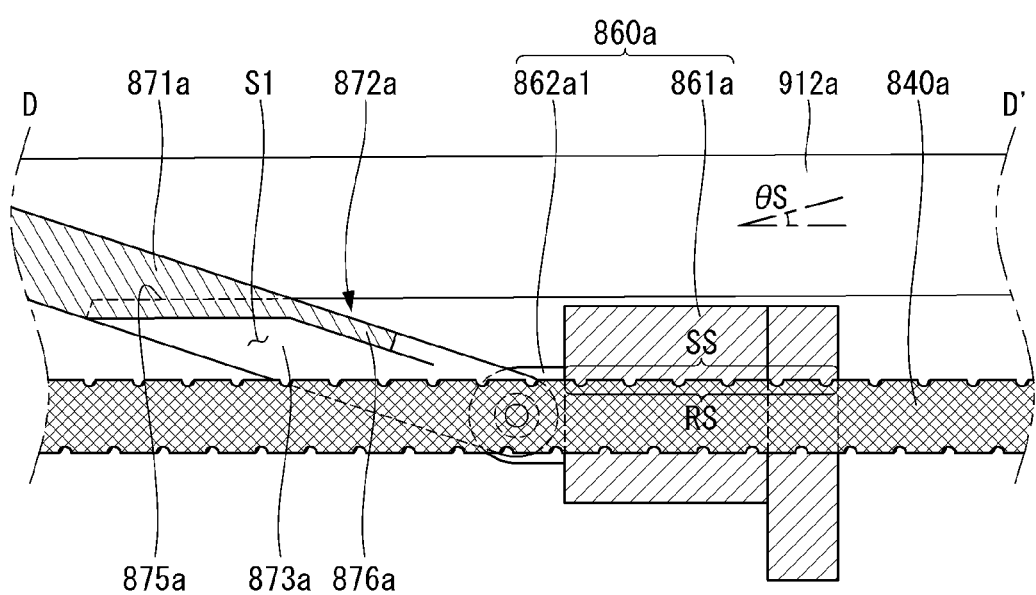
Figure 45:
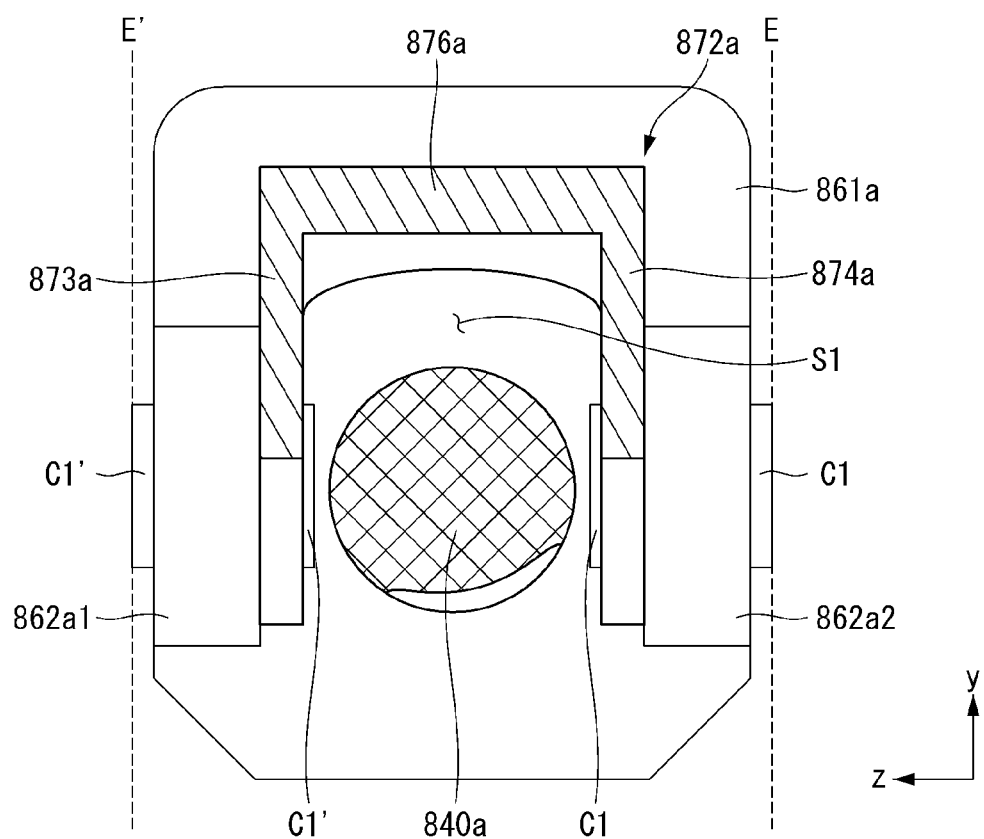
Figure 46:
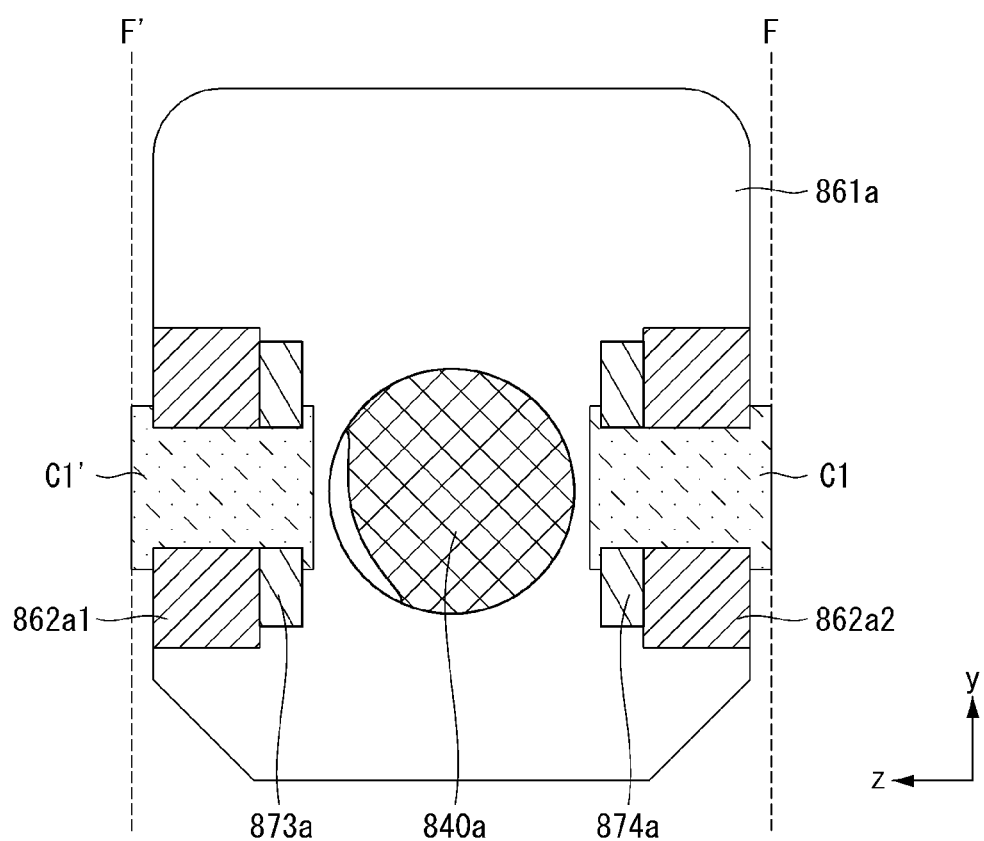

Referring to FIG. 42, the display unit 20 is in the state of being maximally unwound. The display device 100 may be bilaterally symmetrical with respect to the motor assembly 810. The height of the top case 950 may be maximized. The slide 820 may be positioned closest to the outer bearing 830a. The slide 820 may be restricted by the second stopper 861a. The spring 850 may be maximally extended. The pusher 930 may be separated from the link bracket 951. The height of the pusher 930 may be maximized.

Referring to FIGS. 43 to 46, the link mounts 920a and 920b may be mounted on the base 31. The link mounts 920a and 920b may include a right link mount 920a, which is spaced apart from the first right bearing 830a rightwards, and a left link mount 920b, which is spaced apart from the left bearing 830d leftwards.

The links 910a and 910b may be respectively connected to the link mounts 920a and 920b. The links 910a and 910b may include a right link 910a, which is connected to the right link mount 920a, and a left link 910b, which is connected to the left link mount 920b.

The right link 910a may be referred to as a first link. The left link 910b may be referred to as a second link. The right link mount 920a may be referred to as a first link mount 920a. The left link mount 920b may be referred to as a second link mount 920b.

The links 910a and 910b may include first arms 911a and 911b, second arms 912a and 912b, and arm joints 913a and 913b, respectively. The first ends of the second arms 912a and 912b may be rotatably connected to the link mounts 920a and 920b, respectively. The second ends of the second arms 912a and 912b may be rotatably connected to the arm joints 913a and 913b, respectively. The first ends of the first arm 911a and 911b may be rotatably connected to the arm joints 913a and 913b, respectively. The second ends of the first arms 911a and 911b may be rotatably connected to the link brackets 951a and 951b, respectively.

The link brackets 951a and 951b may include a right link bracket 951a, which is connected to the first arm 911a of the right link 910a, and a left link bracket 951b, which is connected to the first arm 911b of the left link 910b. The link brackets 951a and 951b may be connected to the upper bar 950.

The upper bar 950 may connect the right link bracket 951a to the left link bracket 951b.

The rods 870a and 870b may connect the sliders 860a and 860b to the links 910a and 910b, respectively. The first ends of the rods 870a and 870b may be rotatably connected to the sliders 860a and 860b. The second ends of the rods 870a and 870b may be rotatably connected to the second arm 912a and 912b. The rods 870a and 870b may include a right rod 8709a, which connects the right slider 860a to the second arm 912a of the right link 910a, and a left rod 870b, which connects the left slider 860b to the second arm 912b of the left link 910b. The right rod 870a may be referred to as a first rod 870a. The left rod 870b may be referred to as a second rod 870b.

Specifically, a structure established by the right lead screw 840a, the right slider 860a, the right rod 870a and the right link 910a, will now be described. The right slider 860a may include a body 861a and a rod mount 862a. The body 861a may have a thread SS formed in the inner circumferential surface thereof. The thread formed in the body 861a may be engaged with the thread RS in the right lead screw 840a. The right lead screw 840a may extend through the body 861a.

The rod mount 862a may be formed at the right side of the body 861a. The rod mount 862a may be rotatably connected to the first end of the right rod 870a. The rod mount 862a may include a first rod mount 862a1 and a second rod mount 862a2. The first rod mount 862a1 may be positioned in front of the right lead screw 840a. The second rod mount 862a2 may be positioned behind the right lead screw 840a. The first rod mount 862a1 and the second rod mount 862a2 may be spaced apart from each other. The second rod mount 862a2 may be spaced apart from the first rod mount 862a1 in a −z-axis direction. The right lead screw 840a may be positioned between the first rod mount 862a1 and the second rod mount 862a2.

The rod mount 862a may be rotatably connected to the first end of the right rod 870a via a connecting element C1. The connecting element C1 may extend through the rod mount 862a and the right rod 870a.

The right rod 870a may be rotatably connected to the second arm 912a via a connecting element C2. The connecting element C2 may extend through the second arm 912a and the right rod 870a.

The right rod 870a may include a transmitter 871a, which is connected to the second arm 912a of the right link 910a, and a cover 872a, which is connected to the rod mount 862a of the right slider 860a. The transmitter 871a may transmit a force, which is generated by movement of the right slider 860a along the right lead screw 840a, to the right link 910a.

The cover 872a may include a first plate 873a, which is disposed in front of the right lead screw 840a. The first plate 873a may be positioned so as to be perpendicular to the base 31. Alternatively, the first plate 873a may face the right lead screw 840a.

The cover 872a may include a second plate 874a, which is disposed behind the right lead screw 840a. The second plate 874a may be disposed so as to be perpendicular to the base 31. Alternatively, the second plate 874a may face the right lead screw 840a. Alternatively, the second plate 874a may be spaced apart from the first plate 873a. The right lead screw 840a may be positioned between the first plate 873a and the second plate 874a.

The cover 872a may include a third plate 875a, which connects the first plate 873a to the second plate 874a. The third plate 875a may be connected to the transmitter 871a. The third plate 875a may be positioned above the right lead screw 840a.

The cover 872a may include a fourth plate 876a, which connects the first plate 873a to the second plate 874a. The fourth plate 876a may be connected to the third plate 875a. The fourth plate 876a may be positioned above the right lead screw 840a.

The first end of the first plate 873a may be connected to the first rod mount 862a1. The first plate 873a and the first rod mount 862a1 may be connected to each other via a connecting element C1'. The second end of the first plate 873a may be connected to the third plate 875a.

The first end of the second plate 874a may be connected to the second rod mount 862a2. The second plate 874a and the second rod mount 862a2 may be connected to each other via the connecting element C1. The second end of the second plate 874a may be connected to the third plate 875a.

When the right slider 860a is moved close to the motor assembly 810, the right lead screw 840a and the right rod 870a may come into contact with each other. When the right lead screw 840a and the right rod 870a comes into contact with each other, interference therebetween may occur, thereby restricting the movement of the right slider 860a.

The cover 872a may define therein a space S1. The first plate 873a, the second plate 874a, the third plate 875a and the fourth plate 876a may collectively define the space S1. When the right slider 860a is moved close to the motor assembly 810, the right lead screw 840a may be received in the space S1 in the cover 872a. By virtue of the space S1 defined by the cover 872a, the right slider 860a may be moved closer to the motor assembly 810 than in the case in which the cover 872a is not provided. In other words, since the cover 872a provides therein the space S1, it is possible to increase the movable range of the right slider 860a. Furthermore, since the right lead screw 840a is received in the cover 872a, there is an advantage of reducing the size of the housing 30 (see FIG. 2).

In addition, the cover 872a is capable of restricting the minimum value of θS defined between the second arm 912a and the base 31. When θS is sufficiently decreased, the third plate 875a of the cover 872a may come into contact with the second arm 912a, thereby supporting the second arm 912a. Since the third plate 875a supports the second arm 912a, it is possible to restrict the minimum value of θS and to prevent the second arm 912a from drooping. In other words, the cover 872a may serve as a stopper for preventing the second arm 912a from drooping. In addition, the third plate 875a is capable of decreasing the initial load, which is applied to the motor assembly 810 for erection of the second arm 912a, by restricting the minimum value of θS.

The lead screws 840a and 840b may be driven by a single motor assembly 810. Since the lead screws 840a and 840b are driven by a single motor assembly 810, the second arms 912a and 912b may be erected in a symmetrical state. However, when the lead screws 840a and 840b are driven by a single motor assembly 810, the load applied to the motor assembly 810 for erection of the second arms 912a and 912b may be excessively increased. Here, since the third plate 875a restricts the minimum value of θS, it is possible to decrease the load applied to the motor assembly 810 for erection of the second arms 912a and 912b.

A structure established by the left lead screw 840b, the left slider 860b, the left rod 870b and the left link 910b, may be symmetrical with a structure established by the right lead screw 840a, the right slider 860a, the right rod 870a and the right link 910a. Here, the symmetrical axis may be the symmetrical axis ys of the motor assembly 810.

Figure 47:
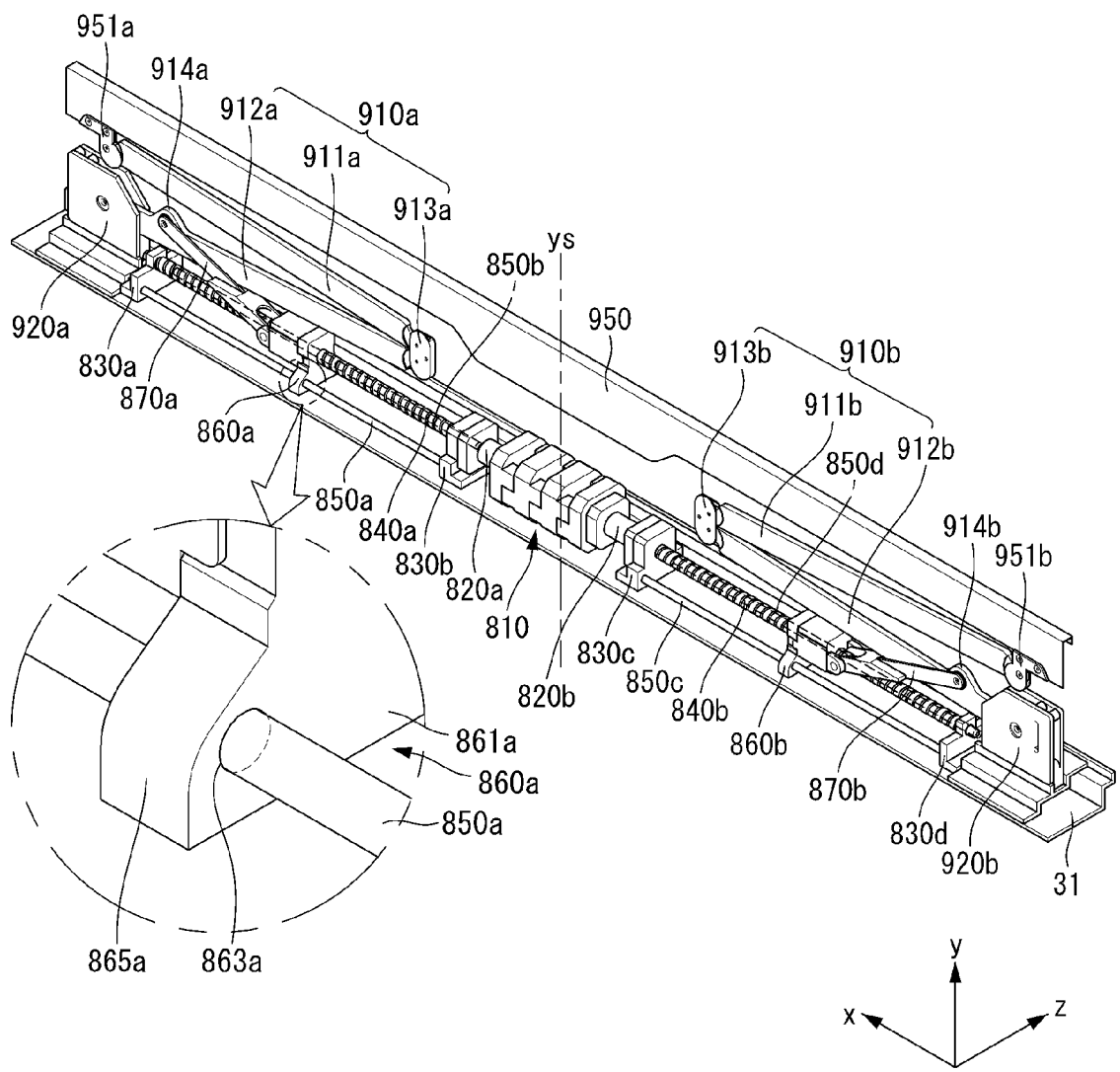

Referring to FIG. 47, guides 850a, 850b, 850c and 850d may be connected to the bearings 830a, 830b, 830c and 830d. The guides 850a, 850b, 850c and 850d may include right guides 850a and 850b, which are disposed to the right of the motor assembly 810, and left guides 850c and 850d, which are disposed to the left of the motor assembly 810.

The right guides 850a and 850b may be connected at first ends thereof to the first right bearing 830a and at second ends thereof to the second right bearing 830b. The right guides 850a and 850b may be positioned parallel to the right lead screw 840a. The right guides 850a and 850b may be spaced apart from the right lead screws 840a.

The right guides 850a and 850b may include a first right guide 850a and a second right guide 850b. The first right guide 850a and the second right guide 850b may be spaced apart from each other. The right lead screw 840a may be positioned between the first right guide 850a and the second right guide 850b.

The right slider 860a may include a projection. In other words, the display device 100 may include a projection formed at the right slider 860a. The projection may be formed at the body of the right slider 860a. The projection may include a front projection (not shown), which projects from the body 861a of the right slider 860a in a +z-axis direction, and a projection 865a, which projects from the body 861a of the right slider 860a in a −z-axis direction.

The first right guide 850a may extend through the rear projection 865a. Alternatively, the first right guide 850a may have a first hole 863a formed in the rear projection, and the first right guide 850a may extend through the first hole 863a. The first hole 863a may be formed in an x-axis direction. The first hole 863a may be simply referred to as a hole 863a.

The second right guide (not shown) may extend through the front projection (not shown). Alternatively, the second right guide may have a second hole (now shown) formed in the front projection, and the second right guide may extend through the second hole. The second hole may be formed in an x-axis direction.

The right guides 850a and 850b may more stably guide the right slider 860a while the right slider 860a is moved along the right lead screw 840a. Since the right guides 850a and 850b stably guide the right slider 860a, the right slider 860a may be moved along the right lead screw 840a without rotating with respect to the right lead screw 840a.

A structure established by the left guides 850c and 850d, the left bearings 830c and 830d, the left slider 860b and the left lead screw 840b may be symmetrical with a structure established by the right guides 850a and 850b, the right bearings 830a and 830b, the right slider 860a and the right lead screw 840a. Here, the symmetrical axis may be the symmetrical axis ys of the motor assembly 810.

Figure 48:
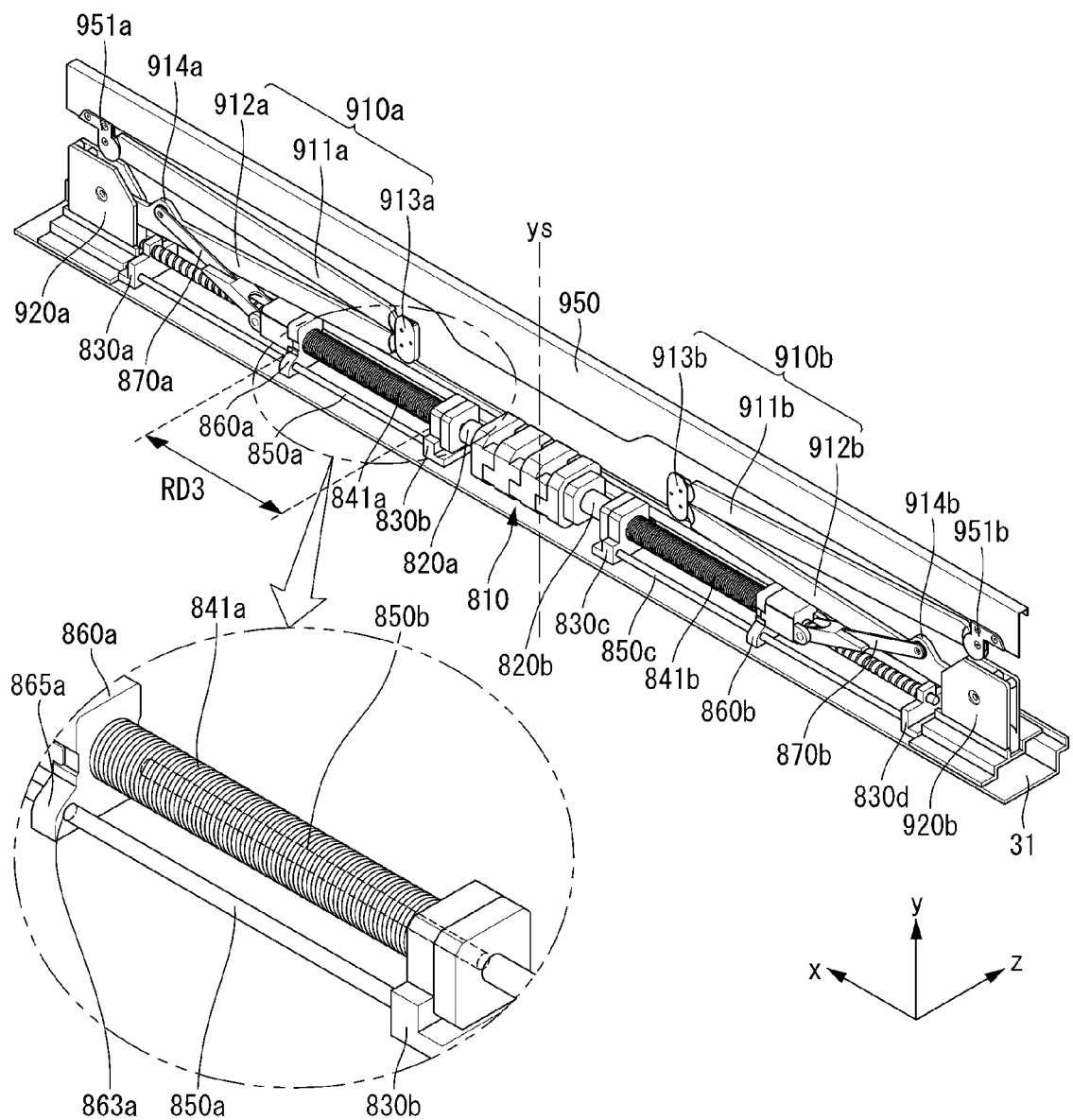

Referring to FIG. 48, first springs 841a and 841b may surround the lead screws 840a and 840b. In other words, the lead screws 840a and 840b may extend through the first springs 841a and 841b. The first spring 841a and 841b may include a first right spring 841a, which is disposed to the right of the motor assembly 810, and a first left spring 841b, which is disposed to the left of the motor assembly 810.

The first right spring 841a may be disposed between the right slider 860a and the second right bearing 830b. The first end of the first right spring 841a may be in contact with or separated from the right slider 860a. The second end of the first right spring 841a may be in contact with or separated from the second right bearing 830b.

When the second arm 912a is positioned so as to be exactly parallel to the base 31, the distance between the right slider 860a and the second right bearing 830b may be RD3. The first right spring 841a may have a longer length than the distance RD3 when the first right spring 841a is not compressed or extended. Accordingly, when the second arm 912a is positioned so as to be exactly parallel to the base 31, the first right spring 841a may be compressed between the right slider 860a and the second right bearing 830b. The first right spring 841a may provide a restoring force in a +x-axis direction to the right slider 860a.

When the position of the second arm 912a is changed from the state of being exactly parallel to the base 31 to a state of being erected, the restoring force provided by the first right spring 841a may assist in erecting the second arm 912a. Since the first right spring 841a assists in erecting the second arm 912a, the load applied to the motor assembly 810 may be decreased.

The lead screws 840a and 840b may be driven by a single motor assembly 810. Since the lead screws 840a and 840b are driven by a single motor assembly 810, the second arms 912a and 912b may be erected in the state of being symmetrical with each other. However, when the lead screws 840a and 840b are driven by a single motor assembly 810, the load applied to the motor assembly 810 for erection of the second arms 912a and 912b is excessively increased. Here, since the first right spring 841a assists in erecting the second arm 912a, it is possible to decrease the load applied to the motor assembly 810, thereby decreasing the load applied to the motor assembly 810 for erection of the second arm 912a.

Furthermore, when the position of the second arm 912a is changed from the state of being erected to the state of being exactly parallel to the base 31, the restoring force provided by the first right spring 841a may mitigate the impact that occurs when the second arm 912a becomes parallel to the base 31. In other words, the first right spring 841a may serve as a damper when the second arm 912a is positioned so as to be exactly parallel to the base 31. Since the first right spring 841a serves as a damper, it is possible to decrease the load applied to the motor assembly 810.

A structure established by the first left spring 841b, the left bearings 830c and 830d, the left slider 860b, the left lead screw 840b and the second arm 912b, may be symmetrical with the structure established by the first right spring 841a, the right bearings 830a and 830b, the right slider 860a, the right lead screw 840b and the second arm 912a. Here, the symmetrical axis may be the symmetrical axis ys of the motor assembly 810.

Figure 49:
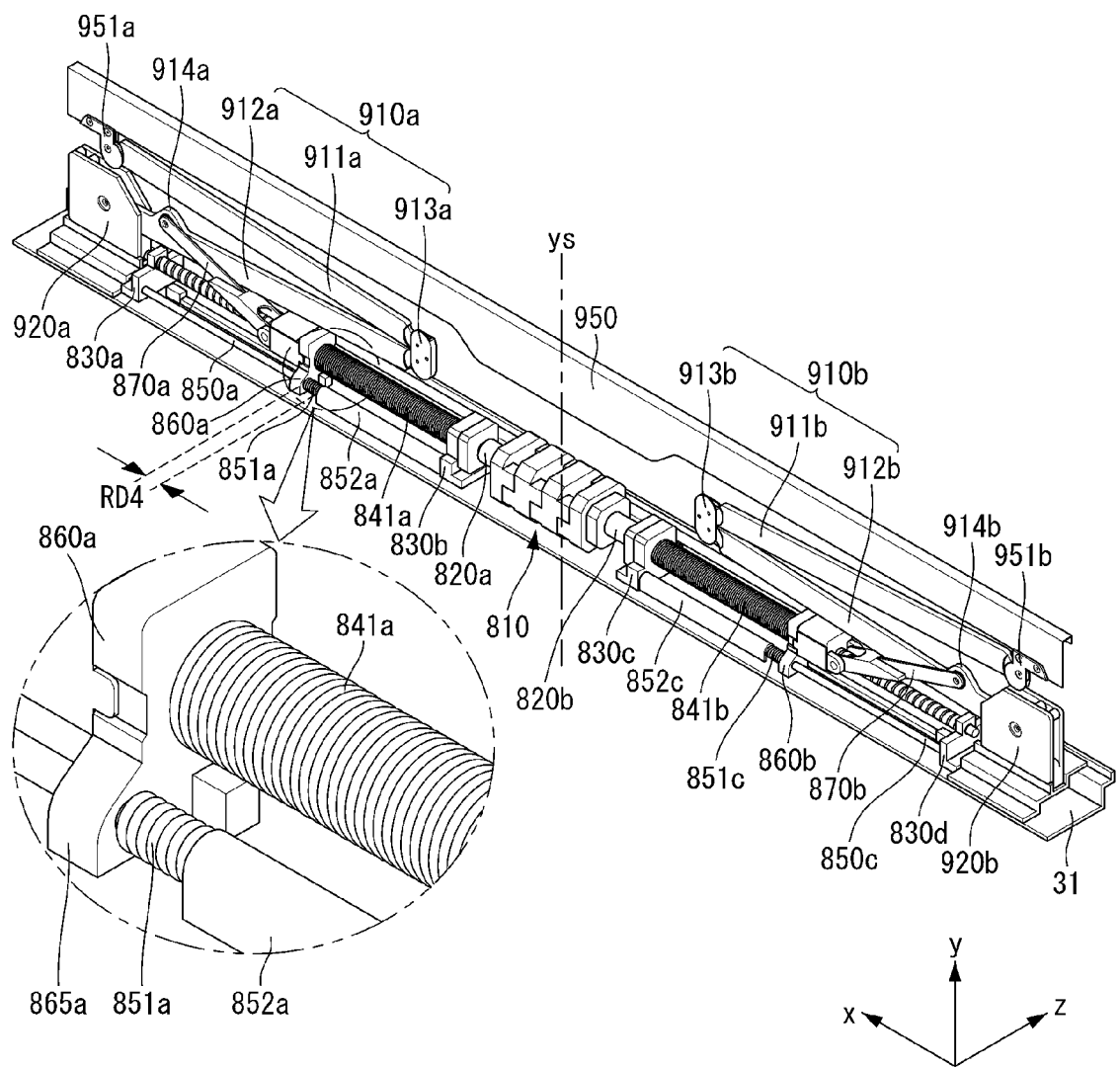

Referring to FIG. 49, second springs 851a and 851b may respectively surround the guides 850a, 950b, 850c and 850d.

In other words, the guides 850a, 850b, 850c and 850d may extend through the second springs 851a and 851b. The second springs 851a and 851b may include a second right spring 851a, which is disposed to the right of the motor assembly 810, and a second left spring 851b, which is disposed to the left of the motor assembly 810.

The second right spring 851a may include a plurality of second right springs. The second right spring 851a may include springs 940a and 940b, which surround the first right guide 850a, and springs 940a and 940b, which surround the second right guide 850b. In other words, the second right spring 851a may include springs 940a and 940b, through which the first right guide 850a extends, and springs 940a and 940b, through which the second right guide 850b extends.

The guides 850a, 850b, 850c and 850d may include supports 852a and 852b. The supports 852a and 852b may include a right support 852a, which is disposed to the right of the motor assembly 810, and a left support 852b, which is disposed to the left of the motor assembly 810.

The right support 852a may be disposed between the right slider 860a and the second right bearing 830b. The second right spring 851a may be disposed between the right slider 860a and the second right bearing 830b. The first end of the second right spring 851a may be in contact with or separated from the right slider 860a. The second end of the second right spring 851a may be in contact with or separated from the right support 852a.

When the second arm 912a is in the state of being exactly parallel to the base 31, the distance between the right slider 860a and the right support 852a may be RD4. The length of the second right spring 851a in the state of being not compressed or extended may be longer than RD4. Accordingly, when the second arm 912a is disposed so as to be exactly parallel to the base 31, the second right spring 851a may be compressed between the right slider 860a and the right support 852a. The second right spring 851a may provide a restoring force in the +x-axis direction to the right slider 860a.

When the second arm 912a is changed from the state of being exactly parallel to the base 31 to the state of being erected, the restoring force provided by the second right spring 851a may assist in erection of the second arm 912a, thereby decreasing the load of the motor assembly 810.

The lead screws 840a and 840b may be driven by a single motor assembly 810. Since the lead screws 840a and 840b are driven by a single motor assembly 810, the second arms 912a and 912b may be erected in the state of being symmetrical with each other. However, when the lead screws 840a and 840b are driven by a single motor assembly 810, the load applied to the motor assembly 810 in order to erect the second arms 912a and 912b may be excessively increased. Here, since the second right spring 851a assists in erection of the second arm 912a, it is possible to decrease the load applied to the motor assembly 810 in order to erect the second arm 912a.

Furthermore, when the second arm 912a is changed from the state of being erected to the state of being exactly parallel to the base 31, the restoring force provided by the second right spring 851a, may mitigate the impact that is generated when the second arm 912a becomes parallel to the base 31. In other words, when the second arm 912a becomes parallel to the base 31, the second right spring 851a may serve as a damper. Since the second right spring 851a serves as a damper, it is possible to decrease the load applied to the motor assembly 810.

The structure established by the second left spring 851b, the left support 852b, the left slider 860b, the left guides 850c and 850d and the second arm 912a, may be symmetrical with the structure established by the second right spring 851a, the right support 852a, the right slider 860a, the right guide 850a and 850b and the second arm 912a. Here, the symmetrical axis may be the symmetrical axis ys of the motor assembly 810.

Figure 50:
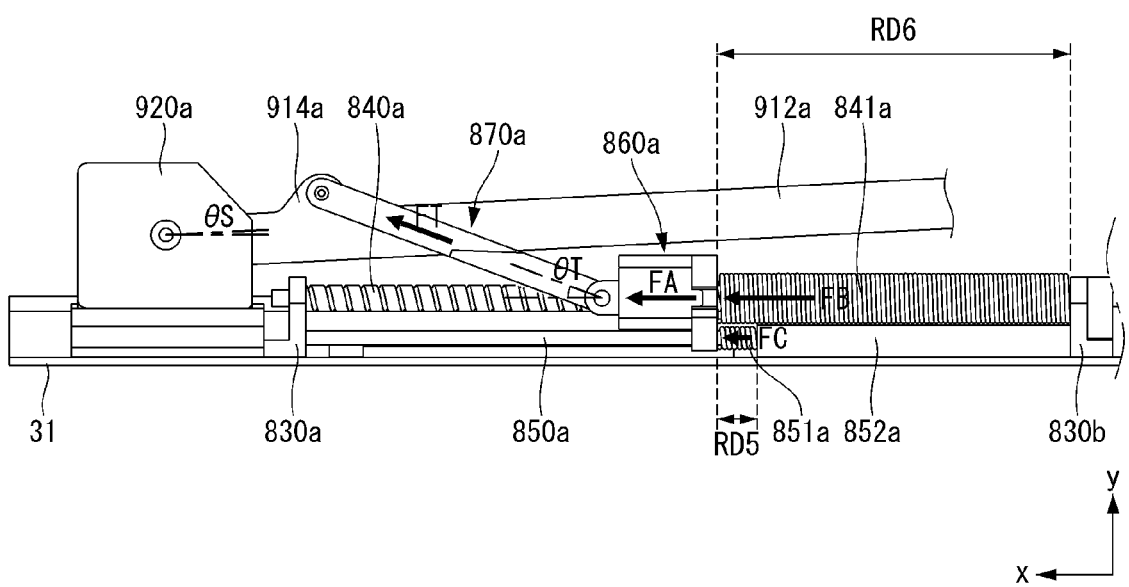
Figure 51:
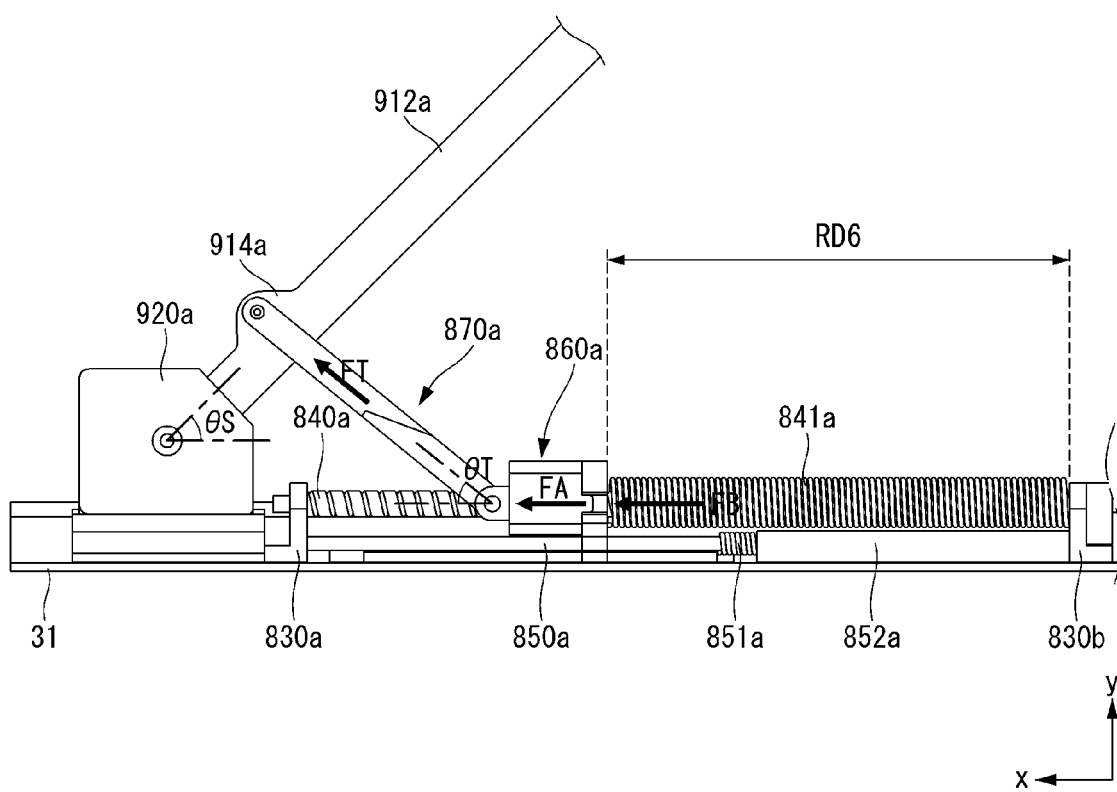
Figure 52:
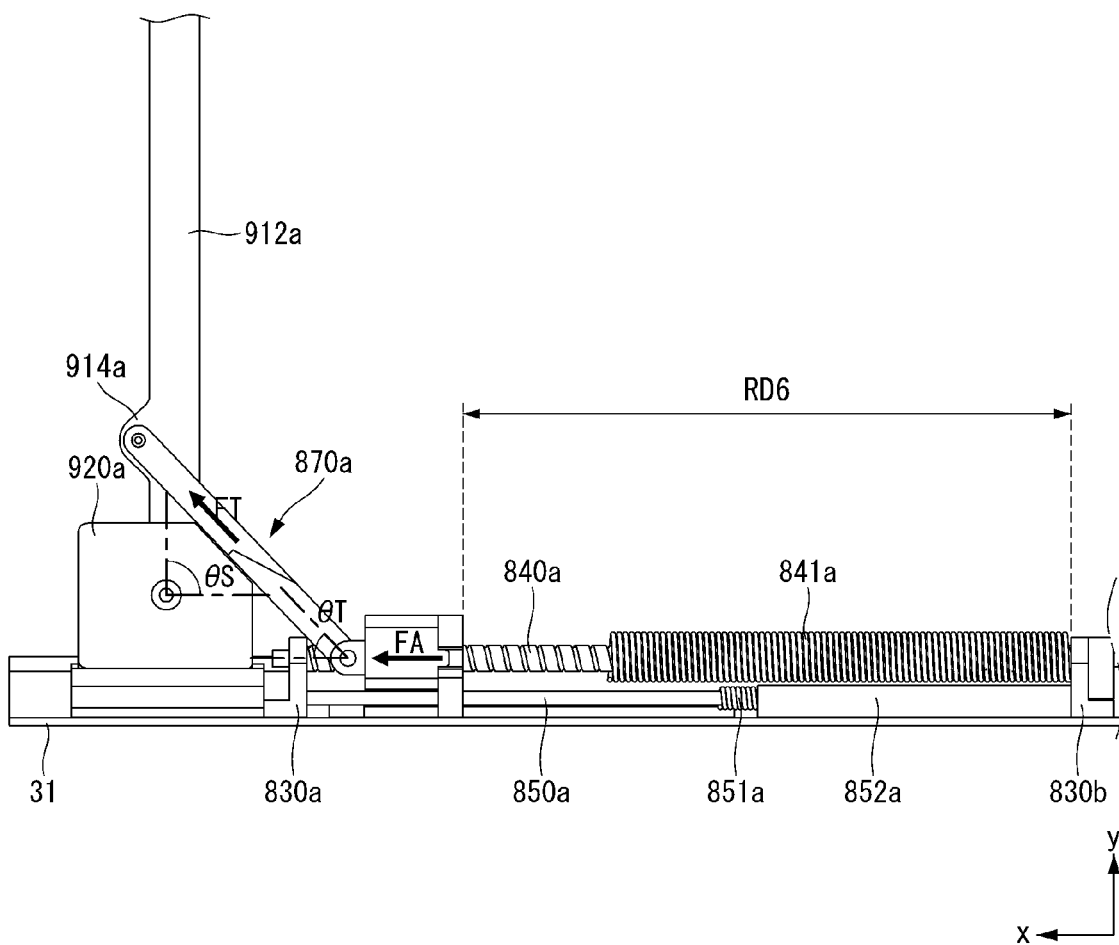

Referring to FIGS. 50 to 52, the second arm 912a may be erected by the restoring force provided by the first right spring 841a and the second right spring 851a.

The angle defined between the second arm 912a and the base 31 may be defined as θS. The angle defined between the right rod 870a and the base 31 may be defined as θT. The force required to move the right slider 860a in the +x-axis direction by the motor assembly 810 may be defined as FA. The force applied to the right slider 860a by the first right spring 841a may be defined as FB. The force applied to the right slider 860a by the second right spring 851a may be defined as FC. The force transmitted to the second arm 912a from the right rod 870a may be defined as FT.

When the second arm 912a is in the state of being exactly parallel to the base 31, each of the angle θS and the angle θT may have the minimum value. When the second arm 912a is changed from the state of being exactly parallel to the base 31 to the state of being erected, each of the angle θS and the angle θT may gradually increase.

When the second arm 912a is in the state of being exactly parallel to the base 31, the first right spring 841a may be compressed. The compressed first right spring 941a may provide the right slider 860a with the restoring force FB. The restoring force may act in a +x-axis direction. When the second arm 912a is in the state of being exactly parallel to the base 31, the magnitude of compression displacement may be maximized, and the restoring force FB may have the maximum value. When the second arm 912a is changed from the state of being exactly parallel to the base 31 to the state of being erected, the magnitude of compression displacement of the first right spring 841a may gradually decrease, and the restoring force FB may gradually decrease.

When the second arm 912a is in the state of being exactly parallel to the base 31, the second right spring 851a may be compressed. The compressed second right spring 851a may provide the right slider 860a with the restoring force FC. The restoring force FC may act in a +x-axis direction. When the second arm 912a is in the state of being exactly parallel to the base 31, the magnitude of compression displacement of the second right spring 851a may be maximized, and the restoring force FC may have the maximum value. When the second arm 912a is changed from the state of being exactly parallel to the base 31 to the state of being erected, the magnitude of compression displacement of the second right spring 851a may gradually decrease, and the restoring force FC may gradually decrease.

The force transmitted to the second arm 912a from the right rod 870a may be the sum of the force that is required to move the right slider 860a in a +x-axis direction by the motor assembly 810, the restoring force of the first right spring 841a and the restoring force FC of the second right spring 851a.

When the second arm 912a begins to be erected from the state of being exactly parallel to the base 31, the load applied to the motor assembly 810 may be maximized. Here, the restoring force provided by the first right spring 841a may be maximized. The restoring force FC provided by the second springs 851a and 851b may be maximized.

When the second arm 912a is changed from the state of being exactly parallel to the base 31 to the state of being erected, the restoring force provided by the first right spring 841a and the second right spring 851a may assist in erection of the second arm 912a. Since the first right spring 841a and the second right spring 851a assist in erection of the second arm 912a, it is possible to decrease the load applied to the motor assembly.

The first right spring 841a and the second right spring 851a may concurrently provide the right slider 860a with the restoring force (the sum of the restoring force FB and the restoring force FC). The restoring force (the sum of the restoring force FB and the restoring force FC) may be provided to the right slider 860a until the distance RD5 between the right slider 860a and the right support 852a becomes equal to the length of the second right spring 851a.

When the distance RD5 between the right slider 860a and the right support 852a becomes equal to the length of the second right spring 851a, the magnitude of compression displacement of the second right spring 851a may become zero. When the magnitude of compression displacement of the second right spring 851a becomes zero, the restoring force provided to the right slider 860a by the second right spring 851a may become zero.

When the distance RD5 between the right slider 860a and the right support 852a becomes greater than the length of the second right spring 851a, only the first right spring 841a may provide the right slider 860a with the restoring force FB. The restoring force FB may be provided to the right slider 860a until the distance between the right slider 860a and the second right bearing 830b becomes equal to the length of the first right spring 841a.

When the distance RD6 between the right slider 860a and the second right bearing 830b becomes equal to the length of the first right spring 841a, the magnitude of compression displacement of the first right spring 841a may be zero. When the magnitude of compression displacement of the first right spring 841a becomes zero, the restoring force FB provided to the right slider 860a by the first right spring 841a may become zero.

When the distance RD6 between the right slider 860a and the second right bearing 830b becomes greater than the length of the first right spring 841a, the motor assembly 810 may erect the second arm 912a without receiving the restoring force from the first right spring 841a or the second right spring 851a.

The structure established by the first left spring 841b, the second left spring 851b, the left support 852b, the left slider 860a, the left guides 850c and 850d, the left lead screw 840b, the left rod 870b and the second arm 912a, may be symmetrical with the structure established by the first right spring 841a, the second right spring 851a, the right support 852a, the right slider 860a, the second right spring 851a, the right support 852a, the right slider 860a, the right guide 850a and 850b, the right lead screw 840a, the right rod 870a, and the second arm 912a. Here, the symmetrical axis may be the symmetrical axis ys of the motor assembly 810.

Figure 53:
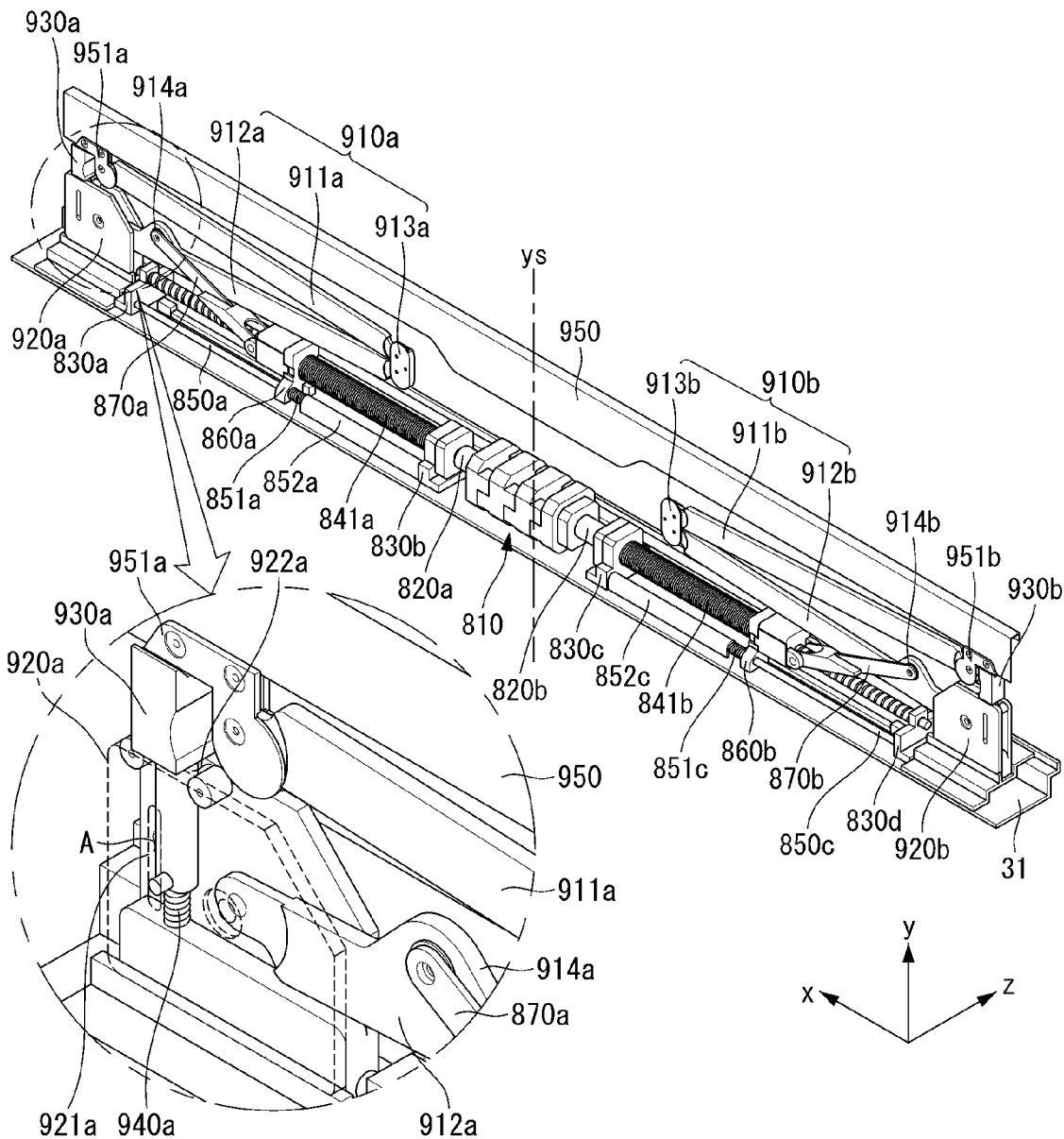

Referring to FIG. 53, pushers 930a and 930b may be connected to the link mounts 920a and 920b. The pushers 930a and 930b may include a right pusher 930a, which is disposed to the right of the motor assembly 810, and a left pusher 930b, which is disposed the left of the motor assembly 810.

The link mounts 920a and 920b may respectively define therein reception spaces A. The reception spaces A may respectively receive springs 940a and 940b and the pushers 930a and 930b. The springs 940a and 940b may include a right spring 940*a*, which is disposed to the right of the motor assembly 810, and a left spring 940*b*, which is disposed to the left of the motor assembly 810. The reception spaces A may be referred to as internal spaces A.

The link mounts 920*a* and 920*b* may respectively have therein first holes 922*a*, each of which connects the internal space A to the outside (the first hole corresponding to the link mount 920*b* is not shown in the drawing). The first holes 922*a* may be respectively formed in the upper surfaces of the link mounts 920*a* and 920*b*. The first holes 922*a* may be simply referred to as holes 922*a*.

The pushers 930*a* and 930*b* may be positioned so as to be perpendicular to the base 31. In other words, the pushers 930*a* and 930*b* may be disposed parallel to the y axis. The springs 940*a* and 940*b* may be positioned so as to be perpendicular to the base 31. In other words, the springs 940*a* and 930*b* may be disposed parallel to the y axis.

The pushers 930*a* and 930*b* may respectively include first parts 931*a* and 931*b* and second parts 932*a* and 932*b*. The second parts 932*a* and 932*b* may be respectively connected to the lower ends of the first parts 931*a* and 931*b*. The lower ends of the second parts 932*a* and 932*b* may be respectively connected to the springs 940*a* and 940*b*. All or a portion of each of the second parts 932*a* and 932*b* may be received in a corresponding one of the reception spaces A, which are defined in the link mounts 920*a* and 920*b*. Each of the second parts 932*a* and 932*b* may have a diameter equal to or less than the diameter of each of the first holes 922*a*. The second parts 932*a* and 932*b* may respectively extend through the first holes 922*a*.

The first parts 931*a* and 931*b* may be respectively positioned outside the link mounts 920*a* and 920*b*. In other words, the first parts 931*a* and 931*b* may be respectively positioned outside the reception spaces A in the link mounts 920*a* and 920*b*. Each of the first parts 931*a* and 931*b* may have a diameter larger than the diameter of each of the first holes 922*a*.

The first parts 931*a* and 931*b* may be in contact with or separated from the link brackets 951*a* and 951*b*, respectively. For example, when the second arms 912*a* and 912*b* are in the state of being exactly parallel to the base 31, the first parts 931*a* and 931*b* may be respectively in contact with the link brackets 951*a* and 951*b*. Meanwhile, when the second arms 912*a* and 912*b* are completely erected from the base 31, the first parts 931*a* and 931*b* may be respectively separated from the link brackets 951*a* and 951*b*.

When the first parts 931*a* and 931*b* are respectively in contact with the link brackets 951*a* and 951*b*, the pushers 930*a* and 930*b* may respectively receive force from the link brackets 951*a* and 951*b*. The force supplied to the pushers 930*a* and 930*b* may be directed downwards. In other words, the force supplied to the pushers 930*a* and 930*b* may be directed in a −y-axis direction. In other words, the link brackets 951*a* and 951*b* may respectively press the pushers 930*a* and 930*b*. The direction, in which the link brackets 951*a* and 951*b* respectively press the pushers 930*a* and 930*b* may be a downward direction. In other words, the direction in which the link brackets 951*a* and 951*b* respectively press the pushers 930*a* and 930*b* may be the −y-axis direction.

When the first parts 931*a* and 931*b* receive force, the springs 940*a* and 940*b* may be compressed. The compressed springs 940*a* and 940*b* may respectively provide the pushers 930*a* and 930*b* with restoring force. The restoring force may be directed in a direction opposite the direction in which the force is applied to the first parts 931*a* and 931*b*. In other words, the restoring force may be directed in a +y-axis direction.

The link mounts 920*a* and 920*b* may respectively have therein second holes 921*a* (the second hole corresponding to the link mount 920*b* is not shown in the drawing). Each of the second holes 921*a* may connect the reception space A to the outside. All or a portion of each of the springs 940*a* and 940*b* may be exposed to the outside through a corresponding one of the second holes 921*a*. All or a portion of each of the pushers 930*a* and 930*b* may be exposed to the outside through a corresponding one of the second holes 921*a*. Upon maintenance or repair of the display device, a service provider is able to check the operational state of the pushers 930*a* and 930*b* through the second holes 931*a*. The second holes 921*a* may offer convenience in maintenance or repair to the service provider.

Figure 54:
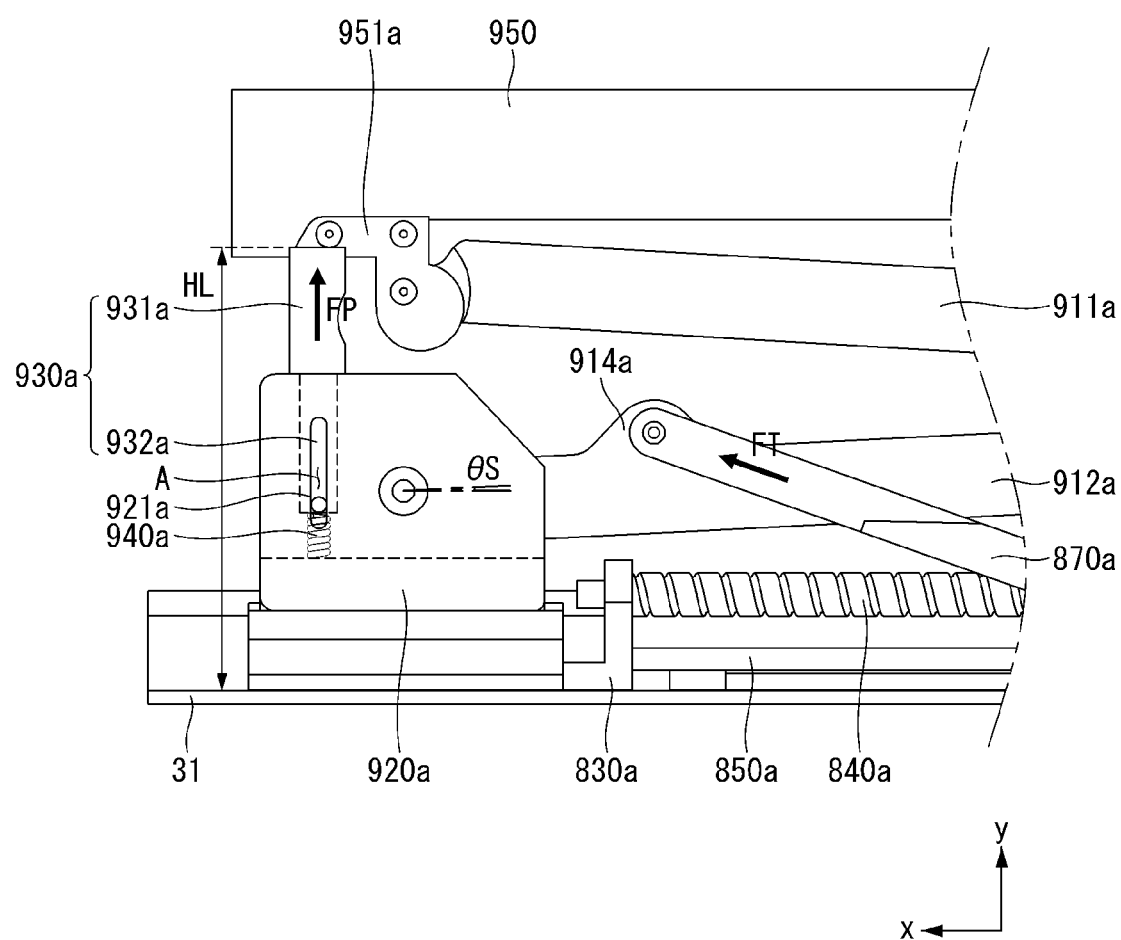
Figure 55:
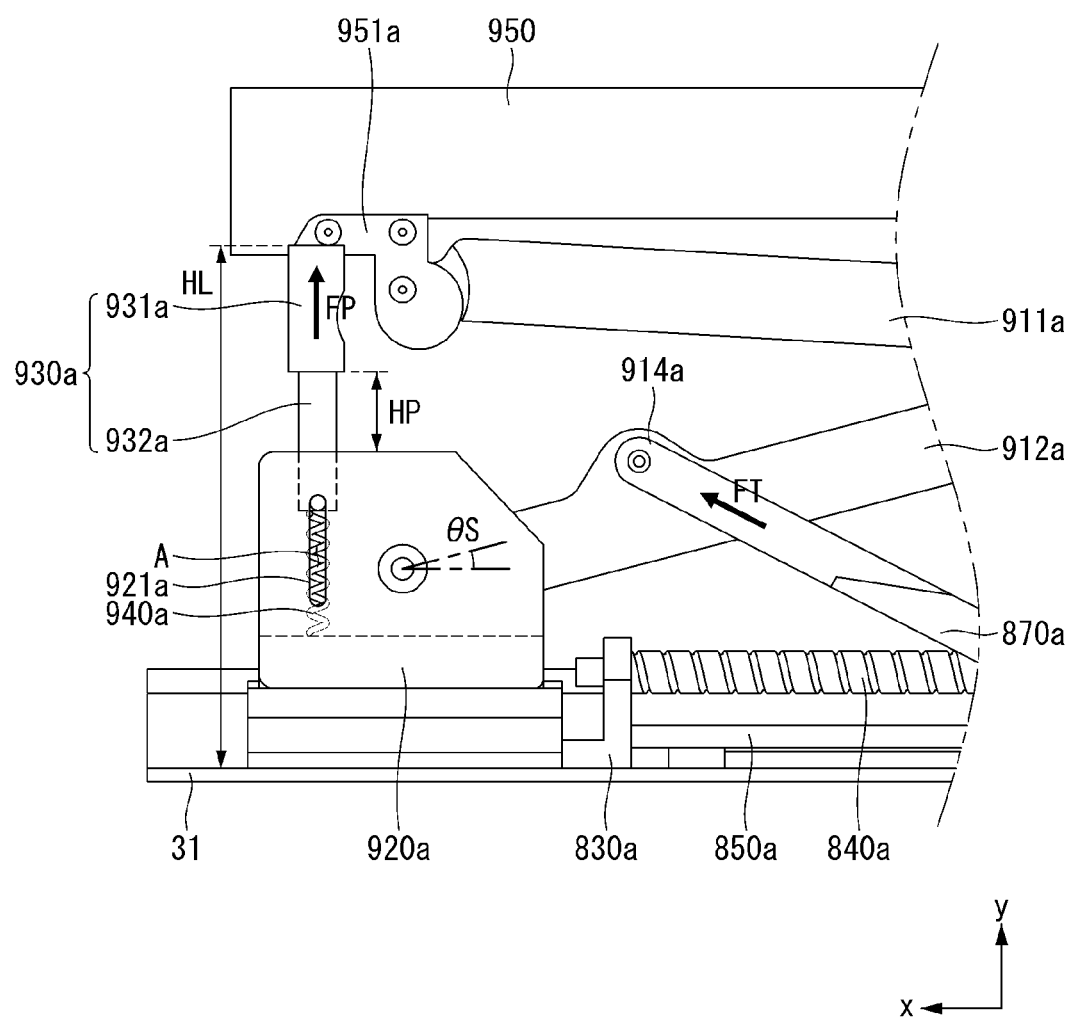
Figure 56:
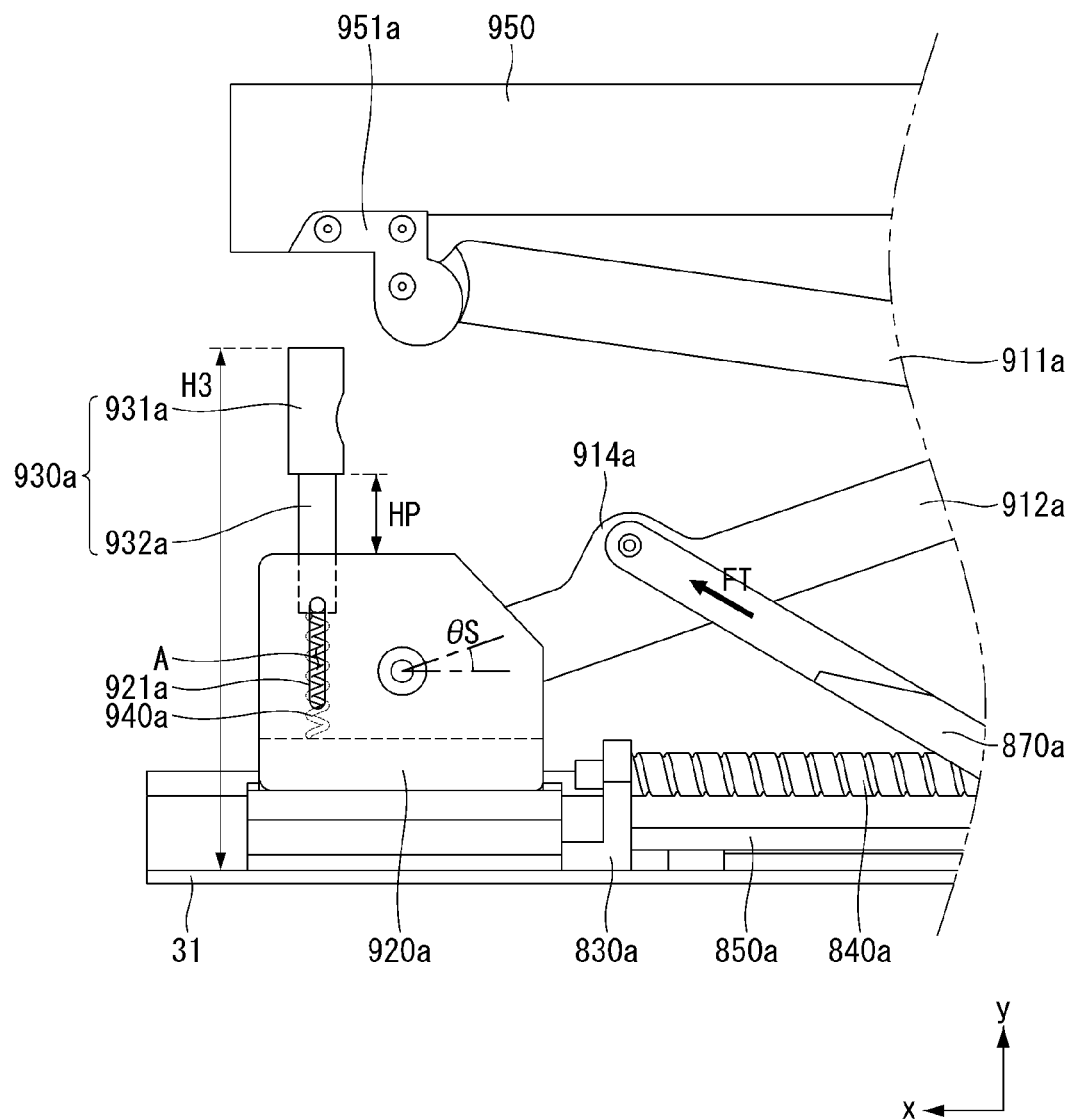

Referring to FIGS. 54 to 56, the right link 910*a* may be erected by receiving the restoring force from the right pusher 930*a*. Hereinafter, a description will be given on the basis of the right link 910*a*.

The angle defined between the second arm 912*a* and the base 31 may be defined as $\theta S$. The force transmitted to the second arm 912*a* from the right rod 870*a* may be defined as FT. The force transmitted to the right link bracket 951*a* from the right pusher 930*a* may be defined as FP.

Referring to FIG. 54, when the second arm 912*a* is in the state of being exactly parallel to the base 31, the $\theta S$ may have the minimum value. The right spring 940*a* connected to the right pusher 930*a* may be maximally compressed, and the restoring force FP may have the maximum value. The compressed right spring 940*a* may provide the right pusher 930*a* with the restoring force FP. The right pusher 930*a* may transmit the restoring force FP to the right link bracket 951*a*. The restoring force FP may be directed in a +y-axis direction.

When the second arm 912*a* is in the state of being parallel to the base 31, the distance HL between the base 31 and the right pusher 930*a* may have the minimum value. The first part 931*a* of the right pusher 930*a* may project outwards from the right link mount 920*a*, and the second part 932*a* of the right pusher 930*a* may be completely received in the reception space 923*a* in the right link mount 920*a*.

Referring to FIG. 55, when the second arm 912*a* is changed from the state of being exactly parallel to the base 31 to the state of being erected, the angle $\theta S$ may gradually increase. The magnitude of compression displacement of the right spring 940*a* may gradually decrease, and the restoring force FP may gradually decrease.

As the angle $\theta S$ gradually increases, at least a portion of the second part 932*a* may project outwards from the right link mount 920*a*. The length that the second part 932*a* of the right pusher 930*a* projects outwards from the right link mount 920*a* may be defined as a length HP. The distance HL between the base 31 and the upper end of the right pusher 930*a* may increase by HP, compared to the case in which the second arm 912*a* is disposed so as to be exactly parallel to the base 31.

Referring to FIG. 56, when the second arm 912*a* is further erected from the base 31, the right pusher 930*a* may be separated from the right link bracket 951*a*. The magnitude of compression displacement of the right spring 940*a* becomes zero. When the magnitude of compression displacement of the right spring 940*a* becomes zero, the restoring force FP provided to the right link bracket 951*a* by the right pusher 930*a* may become zero.

The length HP that the second part 932*a* of the right pusher 903*a* projects outwards from the right link mount 920*a* may have the maximum value. The distance HL between the base 31 and the upper end of the right pusher 930a may have the maximum value.

Specifically, the right pusher 930a may apply the restoring force to the right link bracket 951a while the right pusher 930a is in contact with the right link bracket 951a, thereby assisting in erection of the second arm 912a and decreasing the load applied to the motor assembly 810.

The lead screws 840a and 840b may be driven by a single motor assembly 810. Since the lead screws 840a and 940b may be driven by a single motor assembly 810, the second arms 912a and 912b may be erected in the symmetrical state. However, when the lead screws 840a and 840b are driven by a single motor assembly 810, the load applied to the motor assembly 810 in order to erect the second arms 912a and 912b may be excessively increased. Here, since the right pusher 930a applies the restoring force to the right link bracket 951a, it is possible to assist in erection of the second arm 912a and to decrease the load applied to the motor assembly 810.

Meanwhile, when the second arm 912a is changed from the state of being erected from the base 31 to the state of being exactly parallel to the base 31, the restoring force, which is provided to the right link bracket 951a by the right pusher 930a, may mitigate the impact that is generated when the link 910a becomes parallel to the base 31. In other words, the restoring force provided to the right link bracket 951a by the right pusher 930a may serve as a damper when the link 910a becomes parallel to the base 31. Since the right pusher 930a serves as a damper, it is possible to decrease the load applied to the motor assembly 810.

The structure established by the left pusher 930b, the left spring 940b, the left link bracket 951b, the left link mount 920b and the left rod 870b, may be symmetrical with the structure established by the right pusher 930a, the right spring 940a, the right link bracket 951a, the right link mount 910a and the right rod 870a. Here, the symmetrical axis may be the symmetrical axis of the motor assembly.

Figure 57:
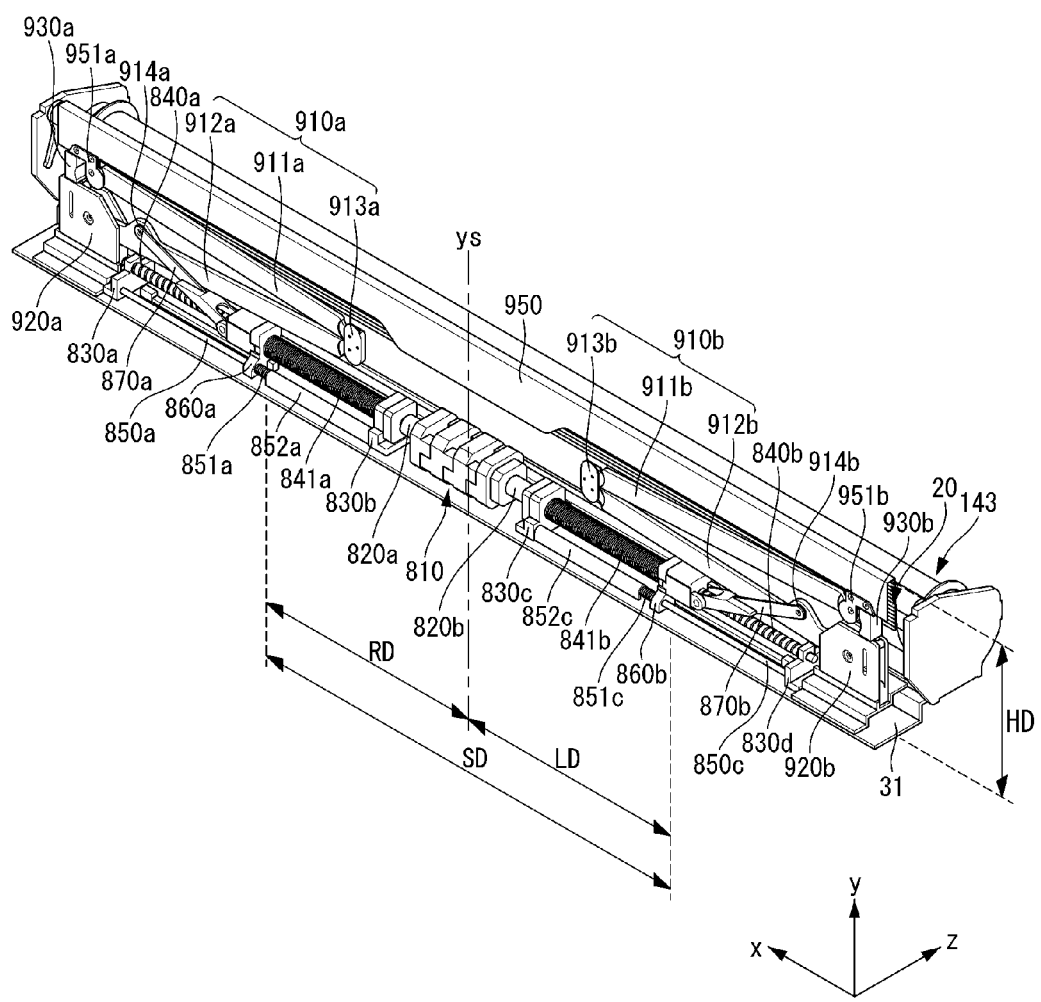
Figure 58:
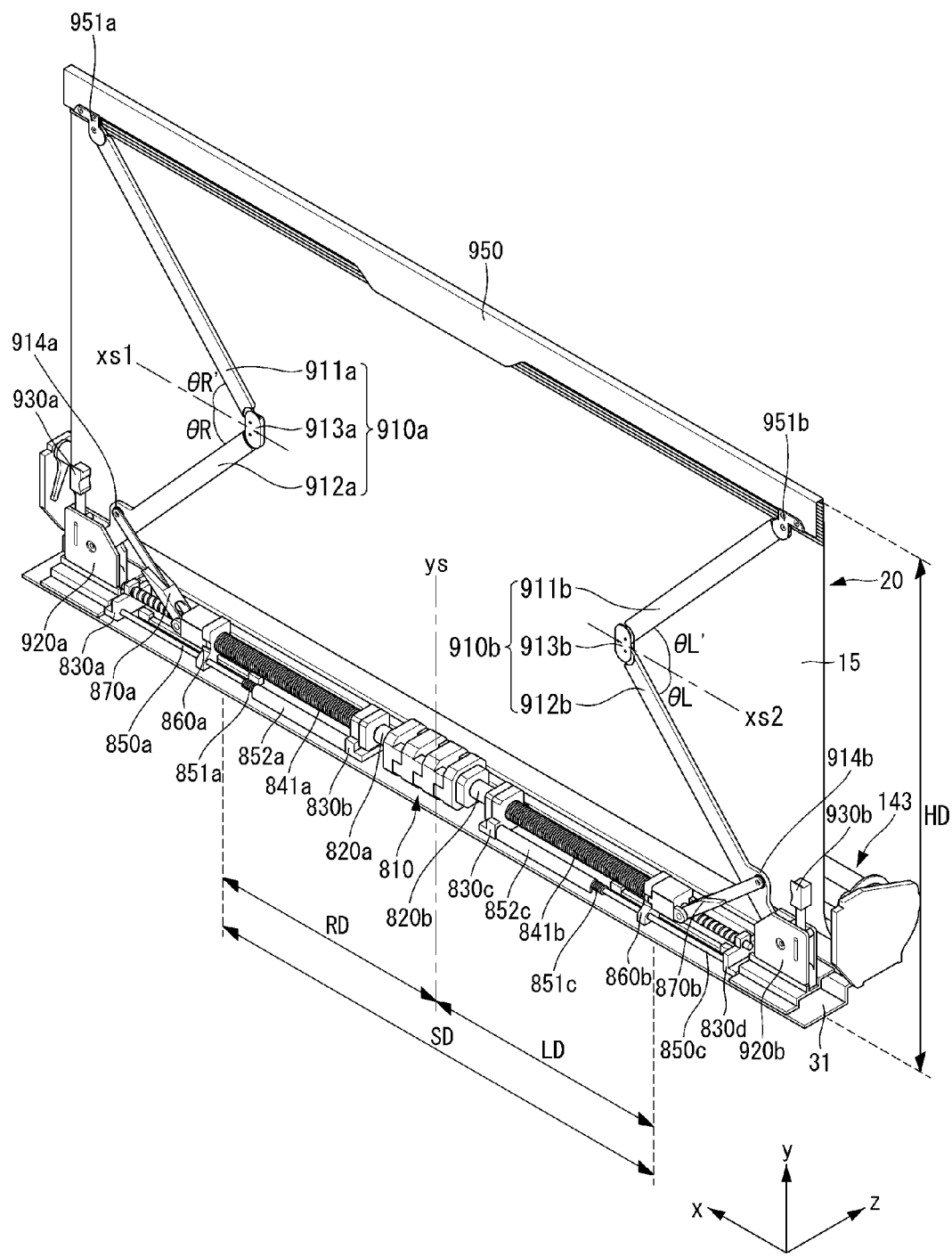
Figure 59:
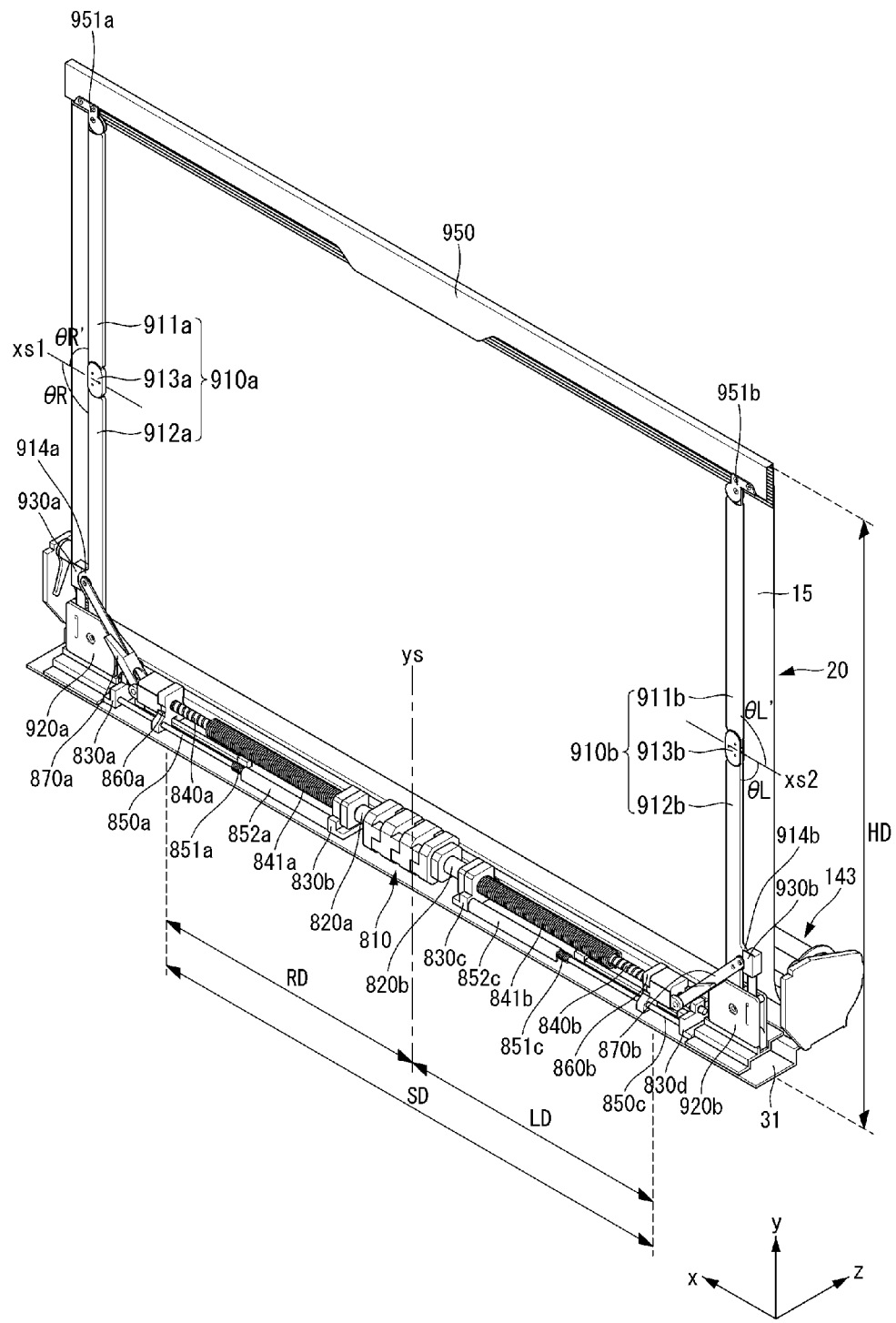

Referring to FIGS. 57 to 59, the panel roller 143 may be mounted on the base 31. The panel roller 143 may be disposed in front of the lead screws 840a and 840b. The panel roller 143 may be disposed so as to be parallel to the longitudinal direction of the lead screws 840a and 940b. The panel roller 143 may be spaced apart from the lead screws 840a and 840b.

The display unit 20 may include the display panel 10 and the module cover 15. The lower end of the display unit 20 may be connected to the panel roller 143, and the upper end of the display unit 20 may be connected to the upper bar 75. The display unit 20 may be wound around or unwound from the panel roller 143.

The distance between the symmetrical axis ys of the motor assembly 810 and the right slider 860a may be defined as RD. The distance between the symmetrical axis ys of the motor assembly 810 and the left slider 860b may be defined as LD. The distance between the right slider 860a and the left slider 860b may be defined as SD. The distance between the right slider 860a and the left slider 860b may be defined as SD. The distance SD may be the sum of the distance RD and the distance LD. The distance between the base 31 and the display unit 20 may be defined as HD.

Referring to FIG. 57, when the second arms 912a and 921b are in the state of being exactly parallel to the base 31, the distance SD between the right slider 860a and the left slider 860b may have the minimum value. The distance RD between the symmetrical axis ys of the motor assembly 810 and the right slider 860a may be equal to the distance LD between the symmetrical axis ys of the motor assembly 810 and the left slider 860b.

When the second arms 912a and 921b are in the state of being exactly parallel to the base 31, the distance HD between the base 31 and the display unit 20 may have the minimum value.

When the second arms 912a and 921b are in the state of being exactly parallel to the base 31, the first springs 841a and 841b may be respectively in contact with the sliders 860a and 860b. Furthermore, the second springs 851a and 851b may be respectively in contact with the sliders 860a and 860b. Furthermore, the pushers 930a and 930b may be respectively in contact with the link brackets 951a and 951b.

When the second arms 912a and 921b are in the state of being exactly parallel to the base 31, the magnitude of compression displacement of each of the first springs 841a and 841b may have the maximum value, and the restoring force provided to the sliders 860a and 860b by the first springs 841a and 841b, respectively, may have the maximum value.

When the second arms 912a and 921b are in the state of being exactly parallel to the base 31, the magnitude of compression displacement of each the second springs 851a and 851b may have the maximum value, the restoring force provided to the sliders 860a and 860b by the second springs 851a and 851b, respectively, may have the maximum value, and the restoring force provided to the sliders 860a and 860b by the second springs 851a and 851b, respectively, may have the maximum value.

When the second arms 912a and 921b are in the state of being exactly parallel to the base 31, the magnitude of compression displacement of each of the springs 940a and 940b may have the maximum value, and the restoring force provided to the springs 940a and 940b by the pushers 930a and 930b, respectively, may have the maximum value.

When the second arms 912a and 912b begin to be erected from the base 31, the second arms 912a and 912b may be erected by receiving the restoring force from the first springs 841a and 841b, the second springs 851a and 851b, and the springs 940a and 940b. Accordingly, it is possible to decrease the load applied to the motor assembly 810.

Referring to FIG. 58, as the second arms 912a and 912b are erected from the base 31, the distance SD between the right slider 860a and the left slider 860b may gradually increase. Even though the distance SD increases, the distance LD and the distance RD may be equal to each other. In other words, the right slider 860a and the left slider 860b may be positioned so as to be symmetrical with each other with respect to the symmetrical axis ys of the motor assembly 810. Furthermore, the extent to which the second arms 912a and 912b of the right link 910a are erected from the base 31 may be equal to the extent to which the second arms 912a and 912b of the left links 910b are erected from the base 31.

As the second arms 912a and 912b are erected from the base 31, the distance HD between the base 31 and the display unit 20 may gradually increase. The display unit 20 may be unwound from the panel roller 143. In other words, the display unit 20 may be expanded from the panel roller 143.

When the second arms 912a and 912b are sufficiently erected from the base 31, the first springs 841a and 841b may be respectively separated from the sliders 860a and 860b. Furthermore, when the second arms 912a and 912b are sufficiently erected from the base 31, the second springs 851a and 851b may be respectively separated from the sliders 860*a* and 860*b*. Furthermore, when the second arms 912*a* and 912*b* are sufficiently erected from the base 31, the pushers 930*aa* and 030*b* may be respectively separated from the link brackets 951*a* and 951*b*.

The separation of the first springs 841*a* and 841*b* from the sliders 860*a* and 860*b*, the separation of the second springs 851*a* and 851*b* from the sliders 860*a* and 860*b*, and the separation of the pushers 930*a* and 930*b* from the link brackets 951*a* and 951*b* may be conducted independently of one another. In other words, the sequence of separation of the first springs 841*a* and 841*b* from the sliders 860*a* and 860*b*, separation of the second springs 851*a* and 851*b* from the sliders 860*a* and 860*b* and separation of the pushers 930*a* and 930*b* from the link brackets 951*a* and 951*b* may be changed.

The angle defined between an axis xs1 parallel to the base 31 and the second arm 912*a* may be defined as R. The angle defined between the axis xs1 parallel to the base 31 and the first arm 911*a* may be defined as $\theta R'$. The axis xs1 and the x-axis may be parallel to each other.

The angle $\theta R$ and the angle $\theta R'$ may be maintained in the state of being equal to each other when the second arm 912*a* is in the state of being exactly parallel to the base 31, while the second arm 912*a* is being erected from the base 31 or when the second arm 912*a* is completely erected from the base 31.

The angle defined between an axis xs2 parallel to the base 31 and the second arm 912*b* may be defined as $\theta L$. The angle defined between the axis xs2 parallel to the base 31 and the first arm 911*b* may be defined as $\theta L'$. The axis xs2 and the x-axis may be parallel to each other.

The angle $\theta L$ and the angle $\theta L'$ may be maintained in the state of being equal to each other when the second arm 912*b* is in the state of being exactly parallel to the base 31, while the second arm 912*b* is being erected from the base 31 or when the second arm 912*b* is completely erected from the base 31.

The axis xs1 may be the same as the axis xs2.

Referring to FIG. 59, when the second arms 912*a* and 912*b* are completely erected from the base 31, the distance SD between the right slider 860*a* and the left slider 860*b* may have the maximum value. Even when the distance SD has the maximum value, the distance LD and the distance RD may be equal to each other.

When the second arms 912*a* and 912*b* are completely erected from the base 31, the distance HD between the base 31 and the upper end of the display unit 20 may have the maximum value.

Figure 60:
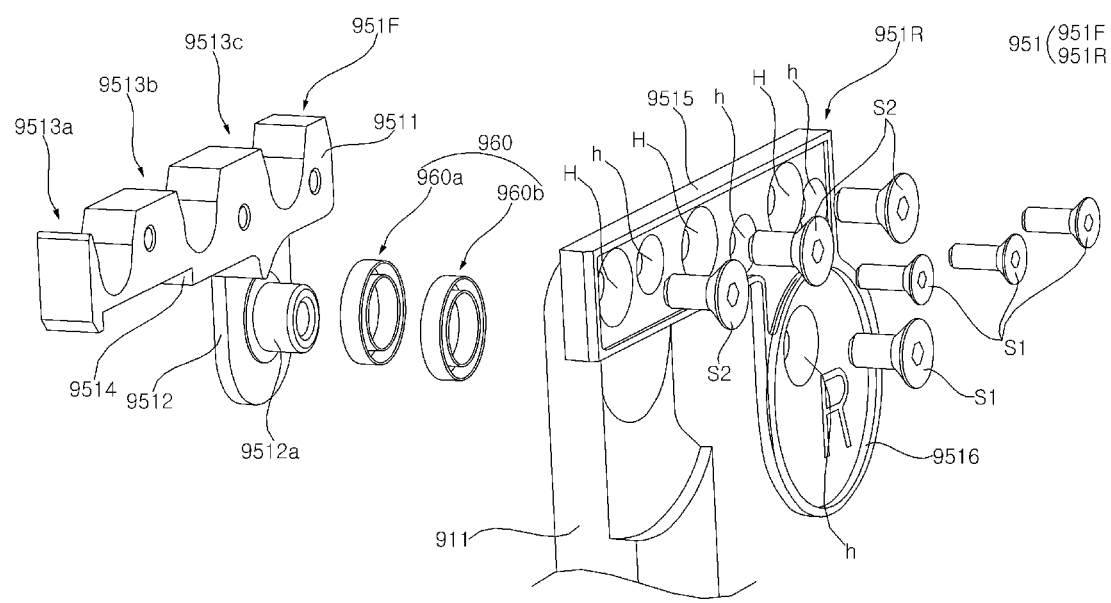

Referring to FIG. 60, the link bracket 951 may be pivotably connected to the first arm 911. The link bracket 951 may include a support 951F and a coupling plate 951R.

The support 951F may include a horizontal body 9511, a joint 9512 and 9512*a*, and cups 9513*a*, 9513*b* and 9513*c*. The horizontal body 9511 may be configured to have an elongate bar shape, which extends horizontally. The joint 9512 and 9512*a* may be formed at the lower side of the horizontal body 9511. The joint 9512 and 9512*a* may include a fixed plate 9512 and a pivot shaft 9512*a*.

The bearing 960 may be fastened to the pivot shaft 9512*a*. The bearing 960 may include a plurality of bearings. The plurality of bearings 960 may include a first bearing 960*a* and a second bearing 960*b*. The second bearing 960*b* may be stacked on the first bearing 960*a*. The first bearing 960*a* and the second bearing 960*b* may be fitted over the pivot shaft 9512*a*. Lubricant may be applied to the bearing 960. The assembly of the bearing 960 and application of lubricant may be conducted simultaneously with coupling of the first arm 911 with the link bracket 951. Here, since the assembly of the bearing 960 and the application of lubricant are conducted independently of coupling of other components, it is possible to prevent leakage of the lubricant.

The fixed plate 9512 may be positioned at the lower side of the horizontal body 9511 so as to deviate from the center of the horizontal body 9511 leftwards or rightwards. The fixe plate 9512 may be configured to have an elongate plate shape, which extends downwards. The pivot shaft 9512*a* may project from one surface of the fixed plate 9512.

The cups 9513*a*, 9513*b* and 9513*c* may be formed by depressing the upper surface of the horizontal body 9511. The cups 9513*a*, 9513*b* and 9513*c* may be formed by depressing the upper surface of the horizontal body 9511 such that the front and rear faces of the cups 9513*a*, 9513*b* and 9513*c* are open. For example, each of the cups 9513*a*, 9513*b* and 9513*c* may be configured to have a "U" shape overall. The cups 9513*a*, 9513*b* and 9513*c* may be arranged in the longitudinal direction of the horizontal body 9511 in that order. Consequently, it is possible to reduce concentration of stress and to improve fatigue failure of the link bracket 951.

The coupling plate 951R may include a support cover 9515 and a joint cover 9516. The support cover 9515 may be a plate, which is configured to have a length corresponding to the support 951F. The joint cover 9516 may be a circular plate, which is coupled to the lower side of the support cover 9515 so as to deviate from the center of the support cover 9515 leftwards or rightwards. The coupling plate 951R may have therein a plurality of holes H and h.

The plurality of holes H and h may include first coupling holes h and second coupling holes H. The first coupling holes h may be intended to couple the support 951F, the coupling plate 951R and the first arm 911 with one another. The second coupling holes H may be intended to couple the top case 950 (see FIG. 61) with the link bracket 951.

Figure 61:
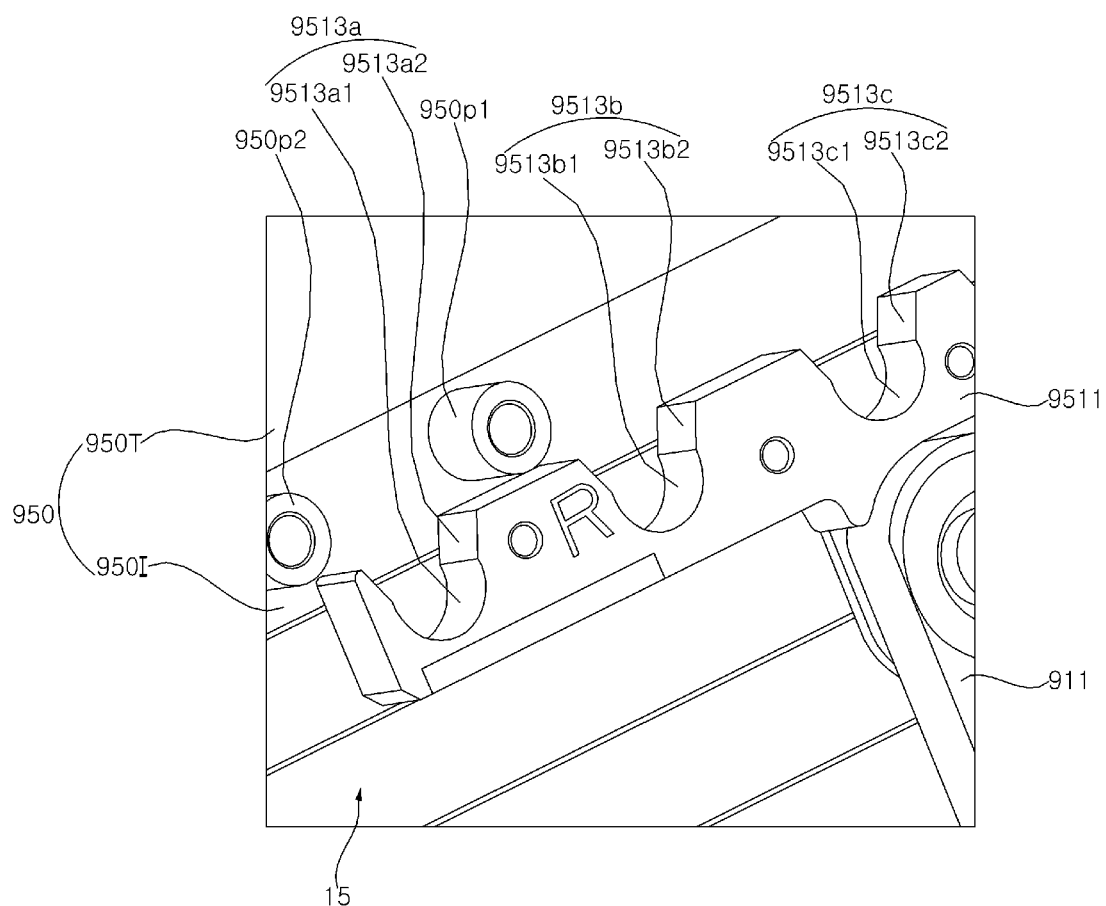

Referring to FIG. 61, the cup 9513*a* may include a support 9513*a*1 and a guide 9513*a*2. The support 9513*a*1 may define the lower part of the cup 9513*a*, and the guide 9513*a*2 may define the upper part of the cup 9513*a*. For example, the support 9513*a*1 may be configured to have a semicircular shape or a sector shape, and the guide 9513*a*2 may extend from the support 9513*a*1, and may be two lateral sides of an inverted trapezoidal shape.

The top case 950 may include an inner bar 9501 and a top cover 950T. The inner bar 9501 may be positioned at the upper side or the upper end of the module cover 15, and may be coupled to the module cover 15. Coupling protrusions 950P1 and 950P2 may be mounted on the outer surface of the inner bar 9501. The coupling protrusions 950P1 and 950P2 may include a plurality of coupling protrusions. The number of coupling protrusions 950P1 and 950P2 may correspond to the number of cups 9513*a*, 9513*b* and 9513*c* of the support 951F. For example, each of the coupling protrusions 950P1 and 950P2 may be a PEM nut. The radius of each of the coupling protrusions 950P1 and 950P2 may correspond to the radius of each of the supports 9513*a*1, 9513*b*1 and 9513*c*1 of the cups 9513*a*, 9513*b* and 9513*c*.

Figure 62:
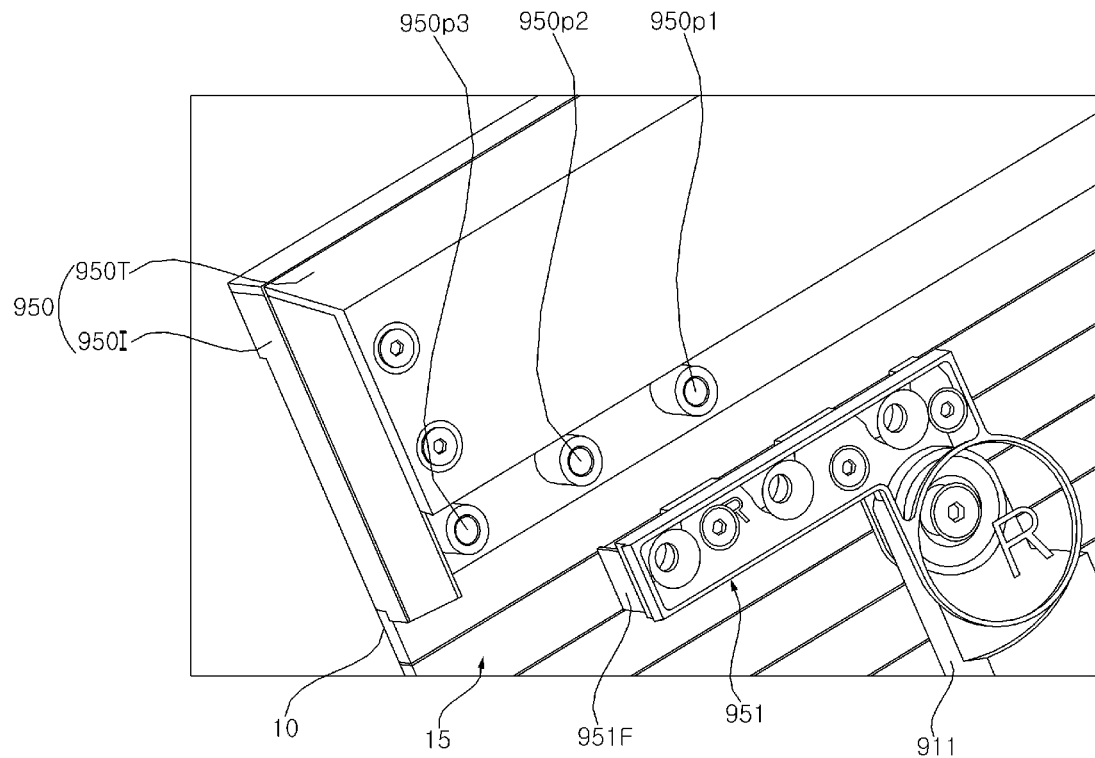
Figure 63:
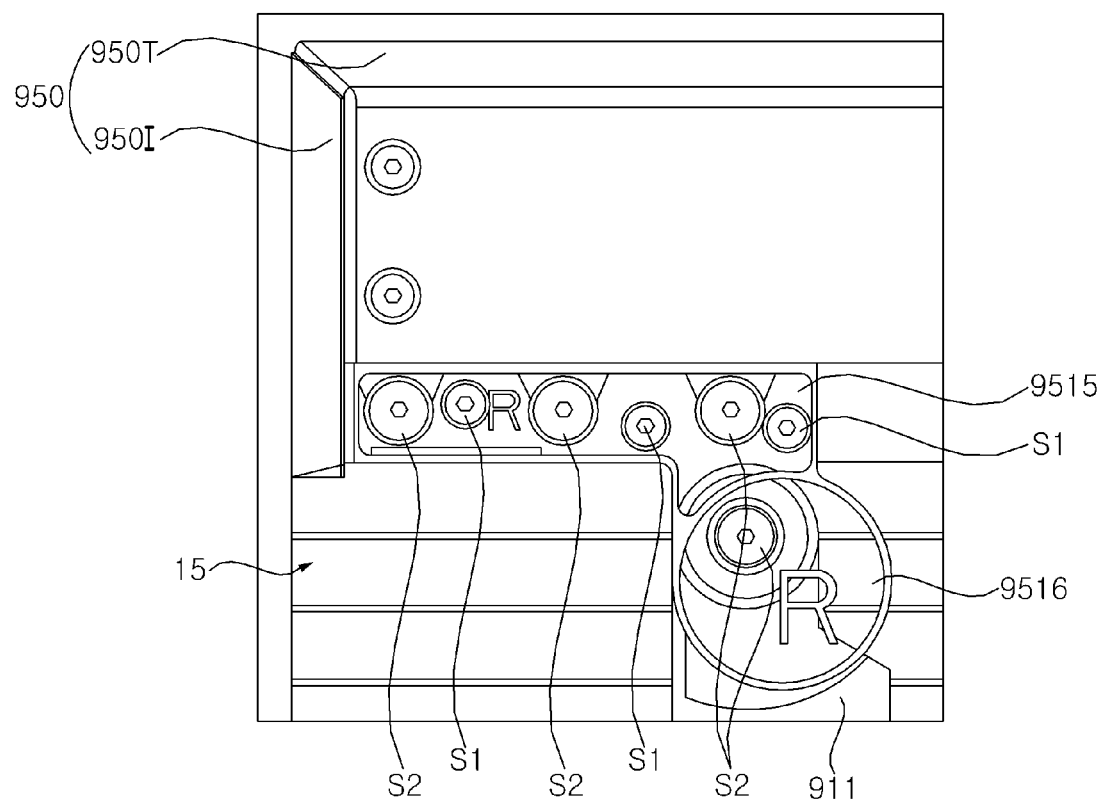

Referring to FIGS. 62 and 63, the link bracket 951 is assembled with the top case 950 in the state in which the link bracket 951 is coupled to the first arm 911. The link bracket 951 may be moved to the top case 950 by movement of the links 910 (see FIGS. 28) 910*a* and 910*b* (see FIG. 58) in a vertical direction (for example, in the y-axis direction). As the support 951F of the link bracket 951 is moved close to the top case 950, the coupling protrusions 950P1, 950P2 and 950P3 may be received in the cups 9513*a*, 9513*b* and 9513*c*

(see FIG. 60) in the support 951F. After the coupling protrusions 950P1, 950P2 and 950P3 are received in the cups 9513a, 9513b and 9513c in the support 951F, the link bracket 951 may be fastened to the top case 950 by means of screws S2 (see FIG. 60).

Accordingly, it is possible to easily couple the link bracket 951 to the top case 950 within the movable range of the links 910, 910a and 910b without application of excessive load to the joints of the links 910, 920a and 910b.

Figure 64:
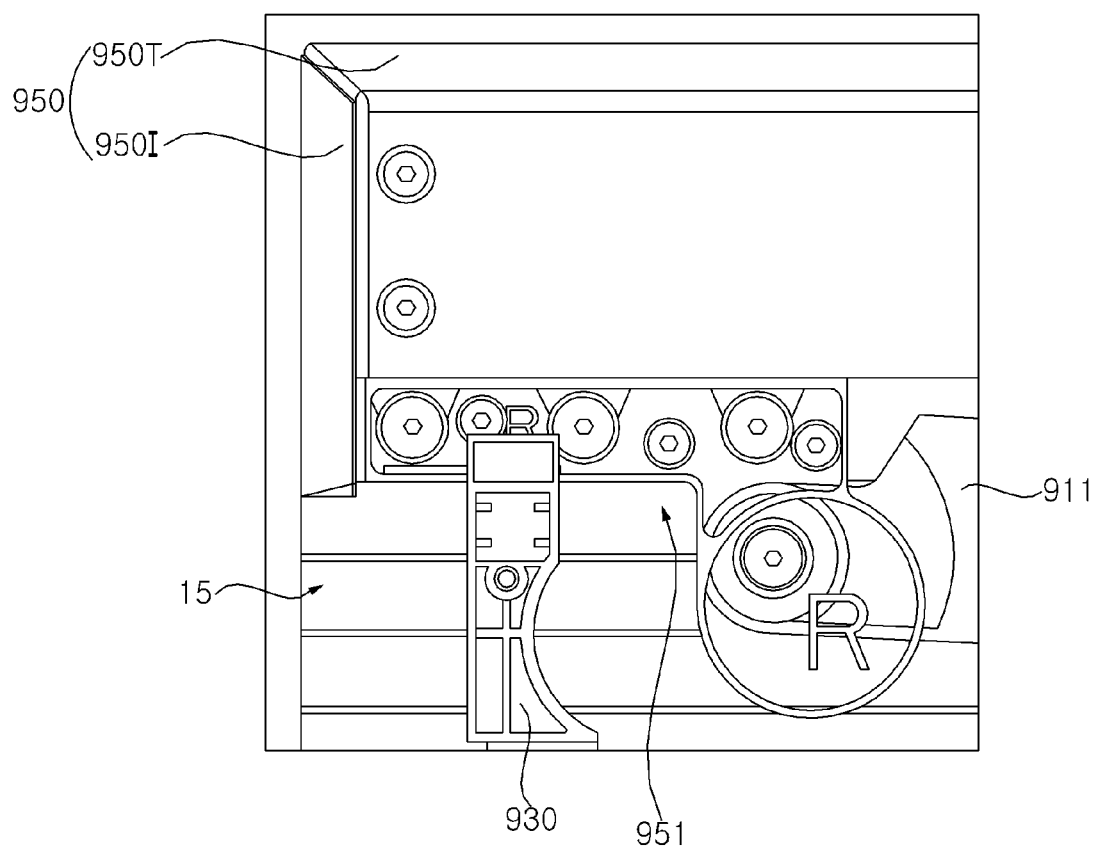

Referring to FIGS. 60 and 64, a support groove 9514 may be formed by depressing the lower surface of the horizontal body 9511 of the support 951F. The support groove 9514 may be positioned at the lower surface of the horizontal body 9511 so as to deviate from the center of the horizontal body 9511 leftwards or rightwards. For example, when the fixed plate 9512 is positioned at the right side of the lower surface of the horizontal body 9511, the support groove 9514 may be positioned at the left side of the lower surface of the horizontal body 9511.

When the module cover 15 is completely wound and the links 910, 910a and 910b are thus positioned so as to be exactly parallel to the base 31, the support groove 9514 in the support 951F may be positioned on the pusher 930. As described above, the pusher 930 may provide a force to the link bracket 951 in a direction in which the links 910, 910a 910b are erected while the links 910, 910a and 910b are erected, and may provide a buffering effect to the link bracket 951 while the links 910, 910a and 910b are folded.

Figure 65:
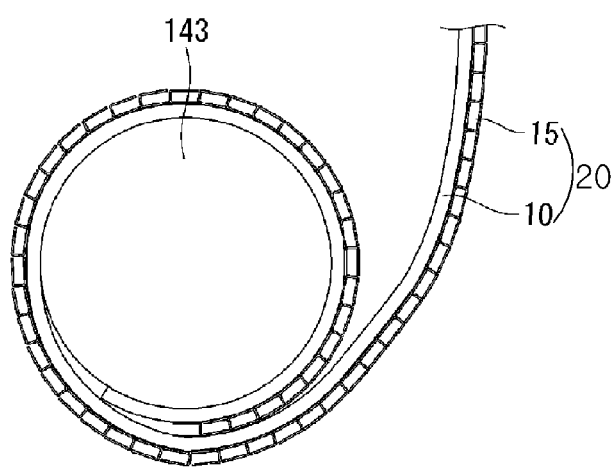
Figure 66:
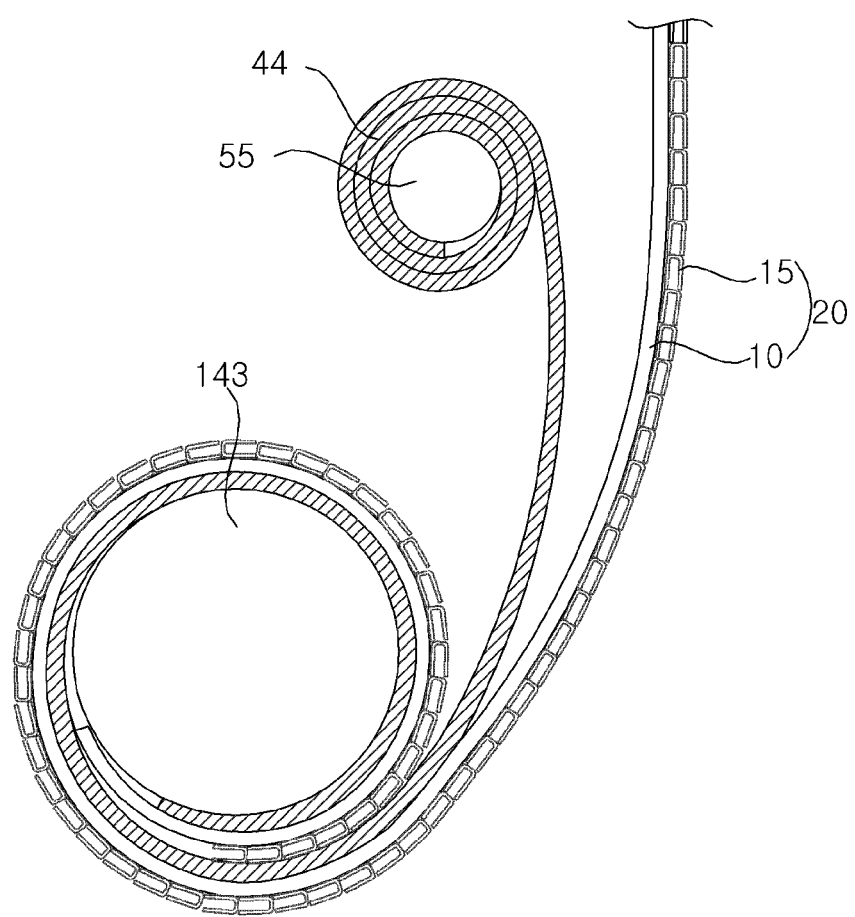

Referring to FIGS. 65 and 66, the module cover 15 may be coupled to the rear surface of the flexible display panel 10. The module cover 15 and the display panel 10 may be wound around or unwound from the panel roller 143, which extending long (see FIG. 16).

Referring to FIG. 65, when the display panel 10 and the module cover 15 are wound around the panel roller 143, the front surface of the display panel 10 may come into contact with the rear surface of the module cover 15, thereby damaging the display panel 10.

Referring to FIG. 66, when the display panel 10 and the module cover 15 are wound around the panel roller 143 together with a protective sheet 44, the protective sheet 44 may be positioned between the display panel 10 and the module cover 15. Specifically, since the front surface of the display panel 10 does not come into contact with the rear surface of the module cover 15 by virtue of the protective sheet 44, which is in contact with the front surface of the display panel 10, it is possible to prevent damage to the display panel 10. The protective sheet 44 may include non-woven cloth. For example, the protective sheet 44 may include polyethylene foam. For example, the thickness of the protective sheet 44 may be in the range of 0.3-0.5 mm.

Figure 67:
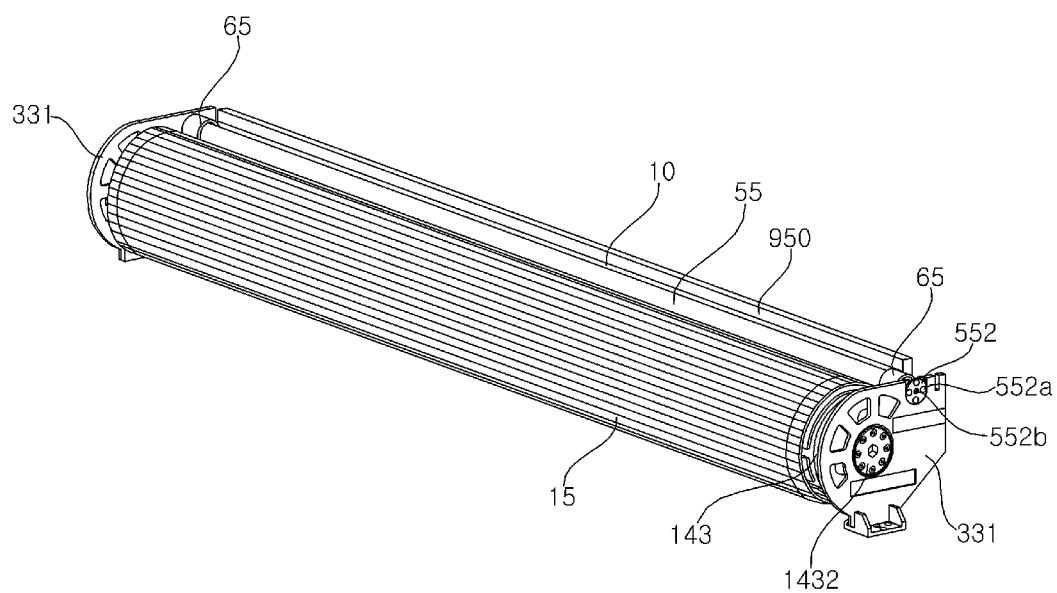
Figure 68:
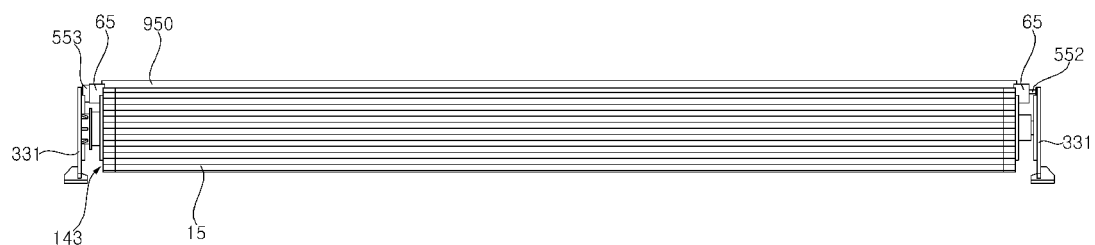

Referring to FIGS. 67 and 68, a subsidiary roller 55 may be spaced apart from the panel roller 143 in the radial direction of the panel roller 143, and may be positioned close to the front surface of the display panel 10. The protective sheet 44 may be coupled at a first end thereof to the outer circumferential surface of the subsidiary roller 55 and at the second end thereof to the front surface of the display panel 10 or the outer circumferential surface of the panel roller 132. Here, the protective sheet 44, which is wound around the subsidiary roller 55, may have a length equal to or less than the length of the display panel 10, which is wound around the panel roller 143.

When the protective sheet 44 is wound around one of the subsidiary roller 55 and the panel roller 143, the protective sheet may be unwound from the other of the subsidiary roller 55 and the panel roller 143. Specifically, when the protective sheet 44 is wound around the panel roller 143, the protective sheet 44 may be unwound from the subsidiary roller 55. Meanwhile, when the protective sheet 44 is wound around the subsidiary roller 55, the protective sheet 44 may be unwound from the panel roller 143. When the protective sheet 44 is wound around the panel roller 143 together with the display panel 10 and the module cover 15, the protective sheet 44 may be in contact with the front surface of the display panel 10. Here, the front surface of the display panel 10, which is wound around the panel roller 143, may overlap the module cover 15 coupled to the rear surface of the display panel 10, which has been previously wound around the panel roller 143, with the protective sheet 44 interposed therebetween.

Frames 331 may be connected to the side walls 30a (see FIG. 17) of the housing 30. The rotational shaft of the panel roller 143 and the rotational shaft of the subsidiary roller 55 may be rotatably coupled to the frames 331. The panel roller 143 may be coupled to the frames 331 via brackets 1432. The subsidiary roller 55 may be coupled to the frames 331 via a stationary cap 552 and a rotary cap 553.

Figure 69:
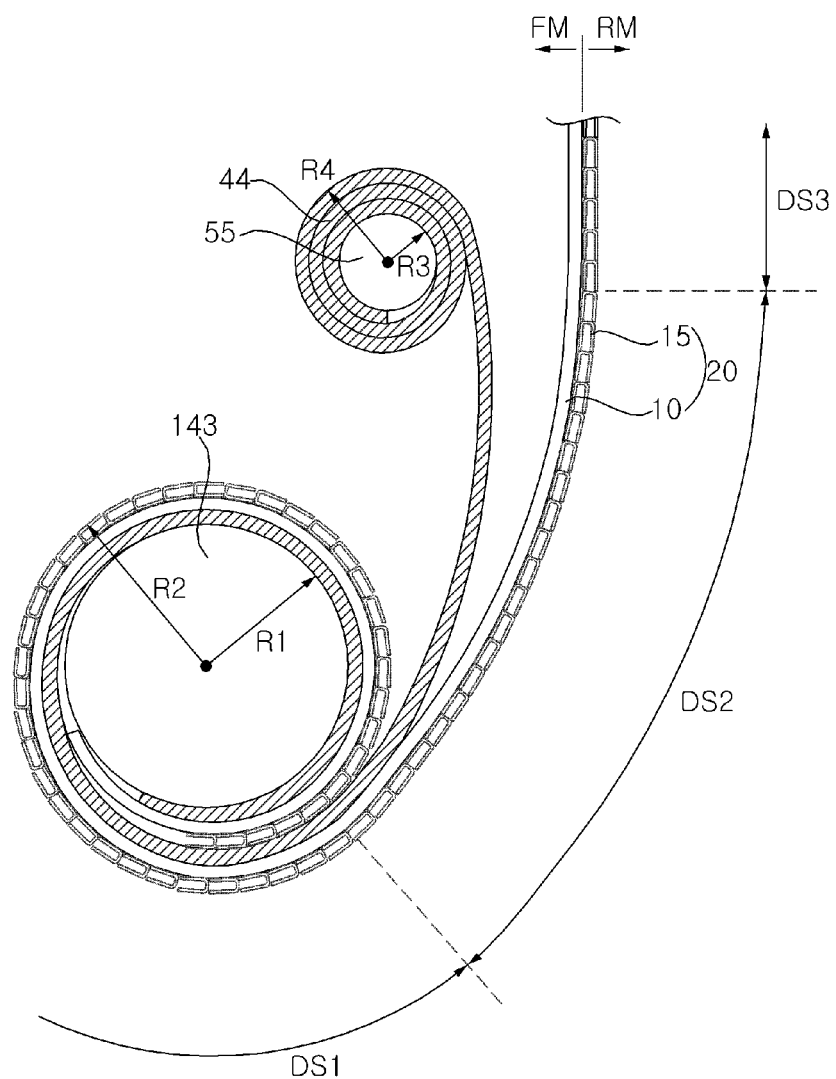

Referring to FIG. 69, the radius of the panel roller 143 may be defined as R1, and the radius defined by the display unit 20 and the protective sheet 44, which are wound around the panel roller 143, may be defined as R2. The radius R2 may vary according to the extent to which the display unit 20 and the protective sheet 44 are wound around the panel roller 143. Furthermore, the radius of the subsidiary roller 55 may be defined as R3, and the radius defined by the protective sheet 44, which is wound around the subsidiary roller 55, may be defined as R4. The radius R4 may vary according to the extent to which the protective sheet 44 is wound around the subsidiary roller 55.

The display unit 20 may include a first zone DS1 in which the display unit 20 is wound around the panel roller 143, a third zone DS3, which is positioned above the rotational axis of the subsidiary roller 55, and a second zone DS2 which connects the first zone DS1 to the third zone DS3. The portion of the display unit 20 in the third zone DS3 is moved upwards from the inlet of the housing 30 so as to be viewed by a user. It is preferable that the portion of the display unit 20 in the third zone DS3 be stably moved vertically without forward or rearward motion.

The rearward motion RM of the portion of the display unit 20 in the third zone DS3 may be prevented by the rod 870 or the link 910, which is positioned behind the display unit 20 (see FIG. 27).

The forward motion FM of the display unit 20 in the third zone DS3 may be prevented by the subsidiary roller 55, which is positioned in front of the display unit 20. For example, the forward motion FM of the display unit 20 may be prevented by contact of the protective sheet 44, which is wound around the subsidiary roller 55, with the front surface of the display panel 10. However, because the radius R4 varies according to the extent to which the protective sheet 44 is wound around the subsidiary roller 55, it is necessary to adjust the position of the subsidiary roller 55 according to the extent to which the protective sheet 44 is wound around the subsidiary roller 55. Accordingly, although it is preferable to realize stable vertical movement of the portion of the display unit 20 in the third zone DS3, there is a need to provide an additional device for adjusting the position of the subsidiary roller 55.

Figure 70:
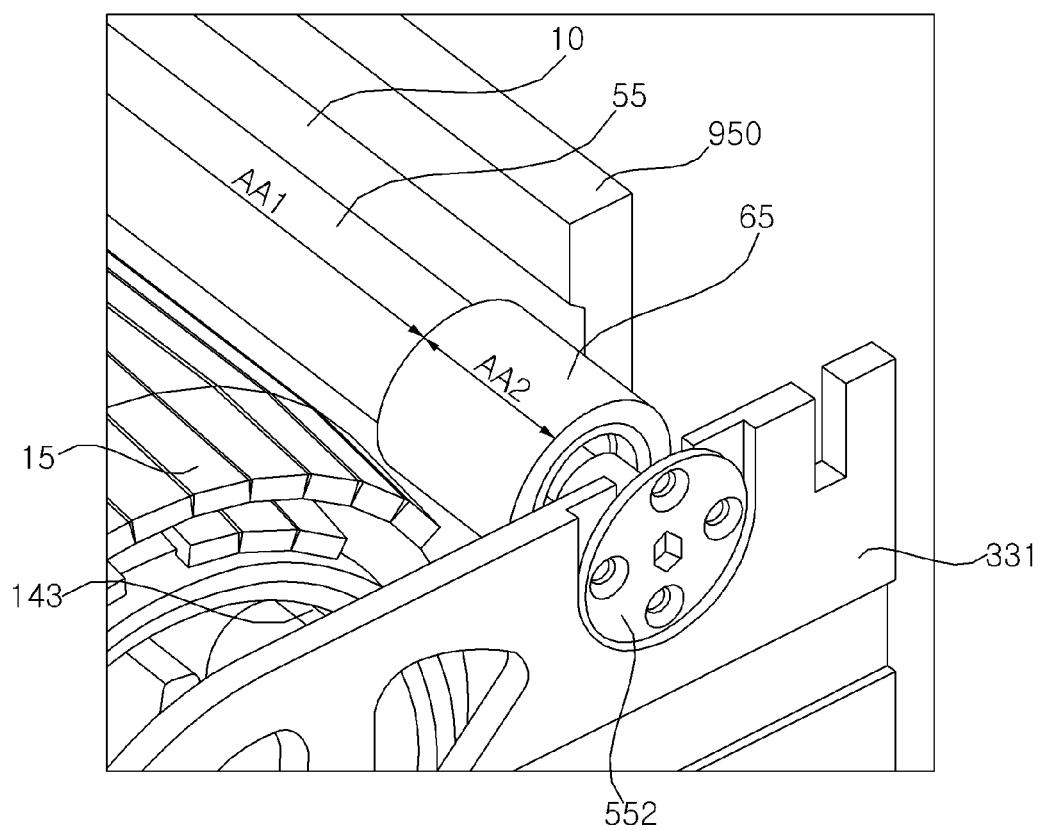

Referring to FIG. 70, a filler 65 may be coupled to the subsidiary roller 55 so as to be in contact with the front surface of the display panel 10. The filler 65 may be rotated with the subsidiary roller 55 while being in contact with the front surface of the display panel 10. In other words, by virtue of the contact between the filler 65 and the front surface of the display panel 10, forward motion FM of the portion of the display unit 20 in the third zone DS3 may be prevented, thereby realizing stable vertical movement. Here, the distance between the rotational axis of the panel roller 143 and the rotational axis of the subsidiary roller 55 may be constant. Specifically, since contact between the filler 65 and the display panel 10 is maintained without adjusting the position of the subsidiary roller 55, it is possible to prevent forward motion FM of the display unit 20. Accordingly, since there is no need to provide an additional device for adjusting the position of the subsidiary roller 55, there are advantages of improving mass productivity and assembly efficiency.

For example, the filler 65 may include a pair of fillers 65, which are positioned adjacent to the two ends of the subsidiary roller 55 in the longitudinal direction of the subsidiary roller 55. For example, the filler 65 may include a urethane material. For example, the filler 65 may have a diameter of 27-30 mm. At least part of the outer surface of the filler 65 may be in contact with the front surface of the display panel 10. Specifically, all or a portion of the outer surface of the filler 65 may be in contact with the end of the display panel 10 or a portion of the display panel 10 adjacent to the end. When only a portion of the filler 65 is in contact with the end of the display panel 10 or a portion of the display panel 10 adjacent to the end, the remaining portion of the filler 65 may be positioned between the display panel 10 and the frame 331. For example, the filler 65 may be configured to have a cylindrical shape, and at least a portion of the inner circumferential surface of the filler 65 may be in contact with the outer circumferential surface of the subsidiary roller 55. For example, the filler 65 may be coupled to the subsidiary roller 55 using an adhesive such as a piece of double-sided adhesive tape.

An area AA1 of the subsidiary roller 55, in which the protective sheet 44 is wound or unwound, and an area AA2, in which the filler 65 is positioned, may be distinguished from each other.

Figure 71:
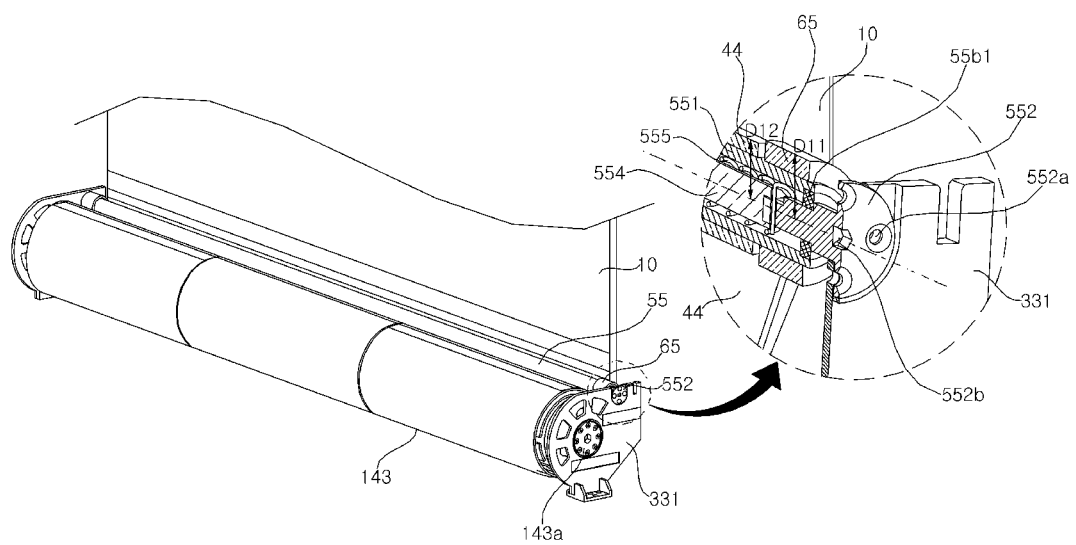
Figure 72:
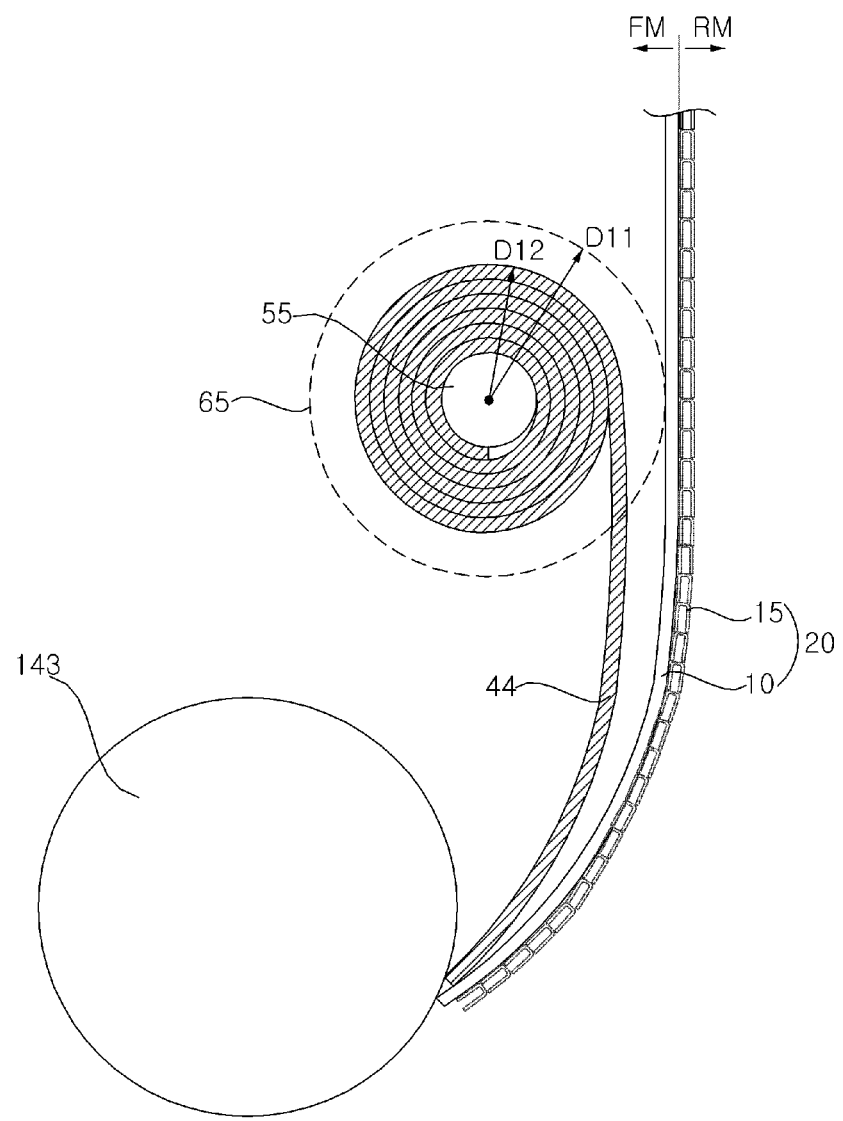

Referring to FIGS. 71 and 72, the distance D11 between the rotational axis of the subsidiary roller 55 and the filler 65 may be equal to or greater than the distance D12 between the rotational axis of the subsidiary roller 55 and the point on the outer surface of the protective sheet 44 that has the maximum radius. Here, even when the protective sheet 44 is maximally wound around the subsidiary roller 55, both the protective sheet 44 and the filler 65 or only the filler 65 are in contact with the front surface of the display panel 10. Accordingly, contact between the filler 65 and the front surface of the display panel 10 may be maintained without adjusting the position of the subsidiary roller 55, regardless of the extent to which the protective sheet 44 is wound around the subsidiary roller 55.

Figure 73:
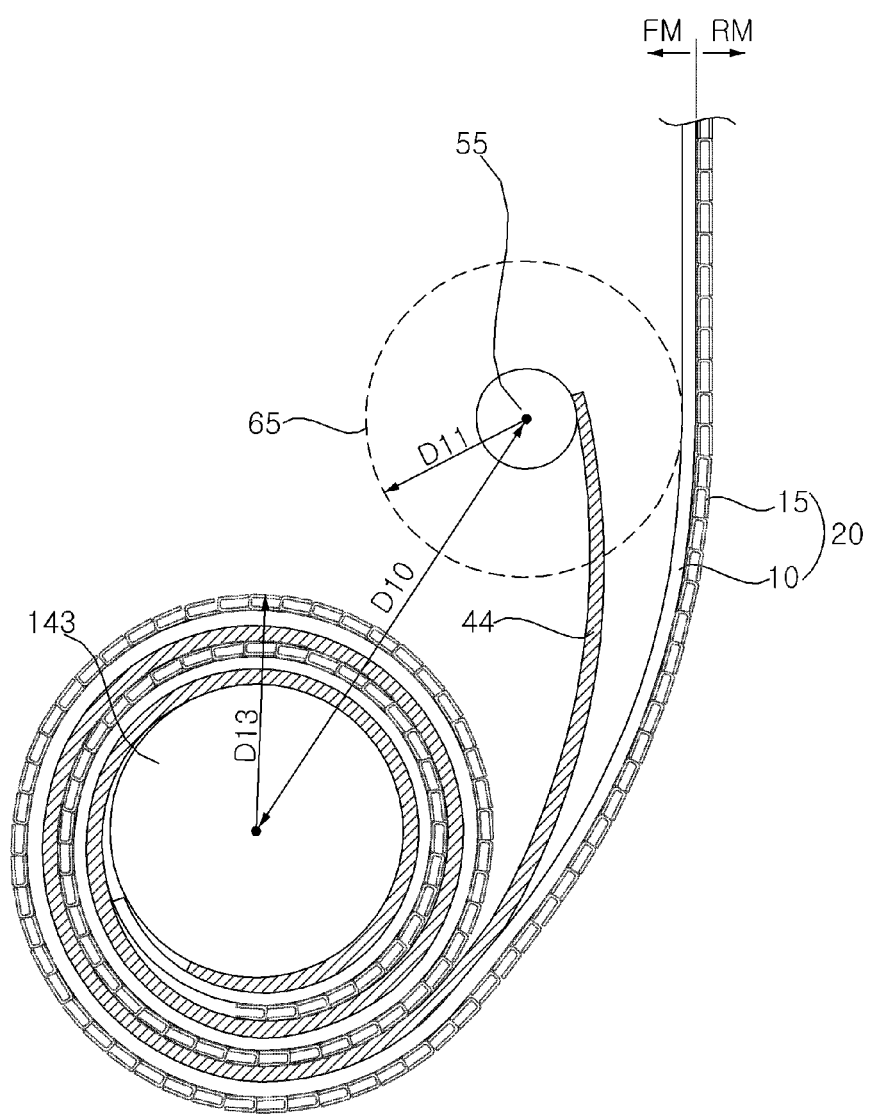

Referring to FIG. 73, the distance D10 between the rotational axis of the panel roller 143 and the rotational axis of the subsidiary roller 55 may be greater than the sum of the distance D13 between the rotational axis of the panel roller 143 and the point on the outer surface of the module cover 15, wound around the panel roller 143, that has the maximum radius and the distance D11 between the rotational axis of the subsidiary roller 55 and the outer surface of the filler 65. Accordingly, even when the display unit 20 and the protective sheet 44 are maximally wound around the panel roller 143, the module cover 15, which is positioned at the outermost layer from the panel roller 143, is prevented from coming into contact with the filler 65, thereby allowing smooth rotational movement of the panel roller 143 and the subsidiary roller 55.

Figure 74:
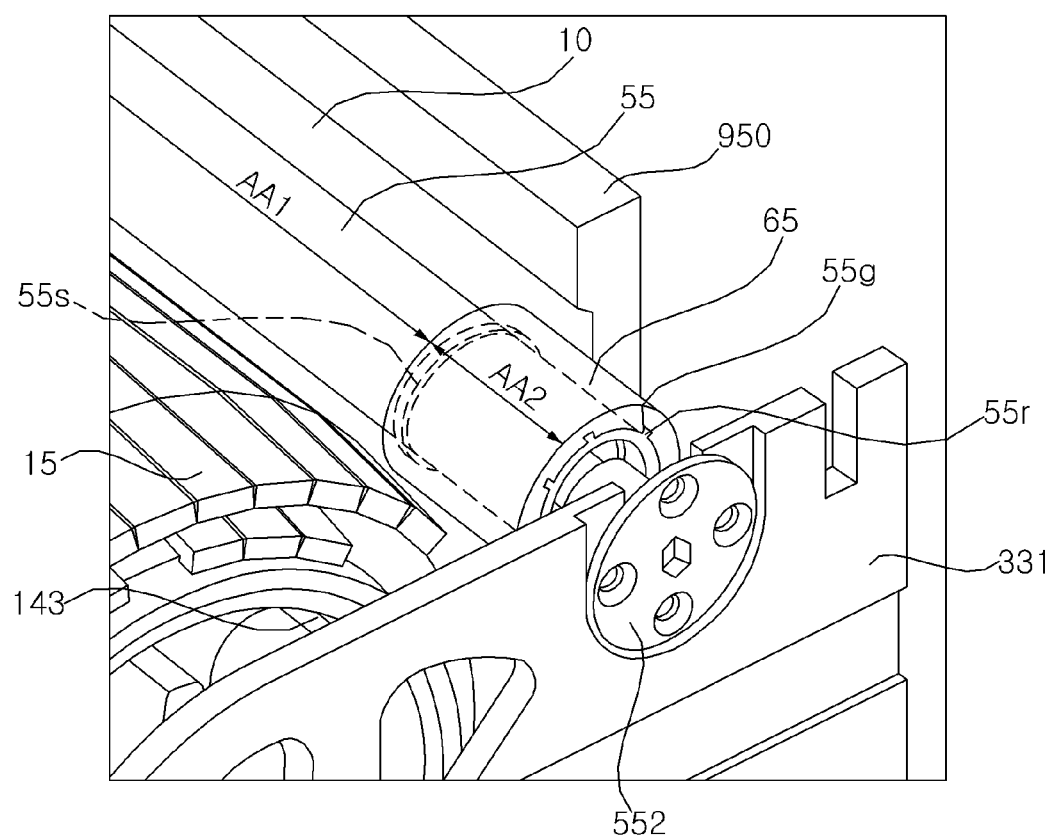

Referring to FIG. 74, a stopper 55s may project from the outer surface of the subsidiary roller 55 between the protective sheet 44 and the filler 65, and may be in contact with the filler 65. The stopper 55s may prevent the filler 65, coupled to the subsidiary roller 55, from being moved inwards in the longitudinal direction of the subsidiary roller 55, and may prevent winding or unwinding of the protective sheet 44 with respect to the subsidiary roller 55 from being hindered by the filler 65. Furthermore, the stopper 55s may guide the coupling position of the filler 65 on the subsidiary roller 55. For example, the stopper 55s may be composed of a single ring-shaped plate. For example, the stopper 55s may include a plurality of rectangular plates, which are radially arranged on the subsidiary roller 55.

A rib 55r may project from the outer surface of the subsidiary roller 55. The filler 65 may include an inner surface 651, which is in contact with the outer surface of the subsidiary roller 55, an outer surface 652, which is in contact with the front surface of the display panel 10, and a groove 653, which is formed in the inner surface 651 and in which the ribs 55r is fitted. The rib 55r and the groove 653 may extend in the longitudinal direction of the subsidiary roller 55. For example, the rib 55r may include a plurality of ribs, and the groove 653 may also include a plurality of grooves corresponding to the plurality of ribs 55r. Since the rib 55r is fitted into the groove 653 and the coupling force between the filler 65 and the subsidiary roller 55 is thus increased, it is possible to prevent the filler 65 from slipping on the subsidiary roller 55 during rotational movement of the subsidiary roller 55 and the filler 65. Accordingly, it is possible to prevent the occurrence of a difference between the rotational speed of the filler 65 and the vertical moving speed of the display panel 10 due to slippage of the filler 65 on the subsidiary roller 55, and thus to enable smooth vertical movement of the display panel 10.

Figure 75:
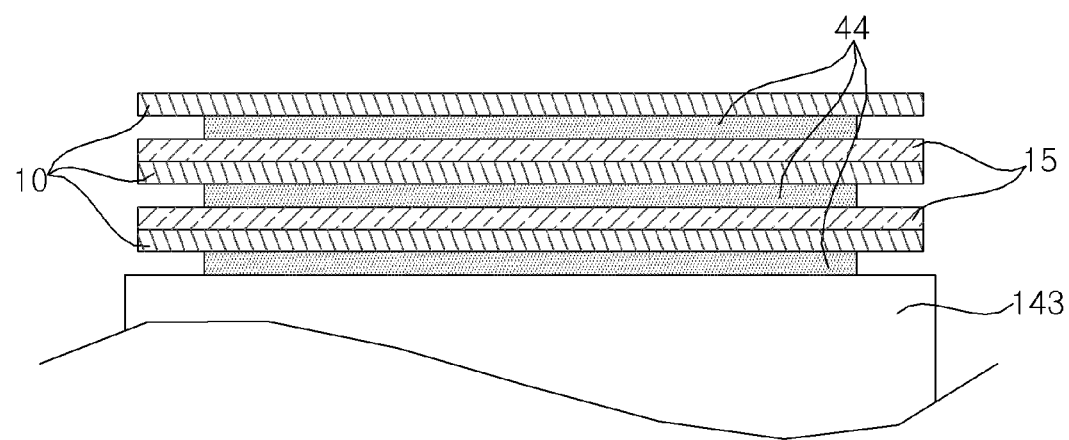

Referring to FIGS. 70 and 75, the area AA1, in which the protective sheet 44 is wound around or unwound from the subsidiary roller 55, and the area AA2, in which the filler 65 is positioned, may be distinguished from each other, and at least a portion of the outer surface of the filler 65 may be in contact with the front surface of the display panel 10. In other words, when the display panel 10 is wound around the panel roller 143, the protective sheet 44 may be in contact with a portion of the front surface of the display panel 10, but may not be in contact with the remaining portion of the front surface. Accordingly, when the display panel 10 is wound around the panel roller 143, the display panel 10 may overlap itself in the radial direction of the panel roller 143. Here, the display panel 10 may include a region, in which the display panel 10 is stacked on itself, with the protective sheet 44 interposed therebetween, and a region, in which the wound display panel 10 is spaced apart from itself.

Figure 76:
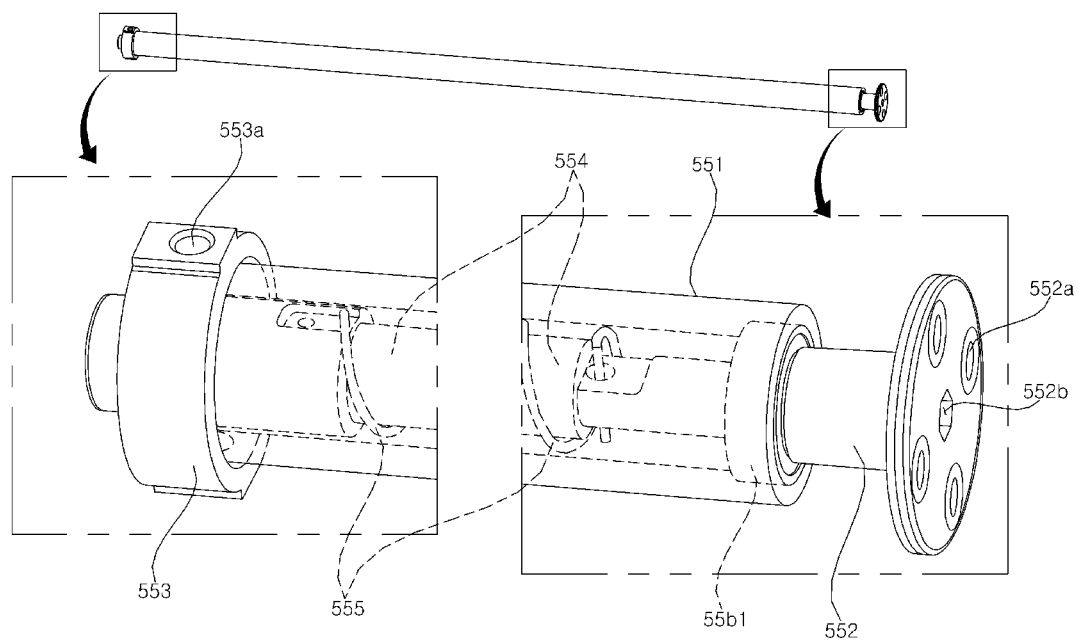
Figure 77:
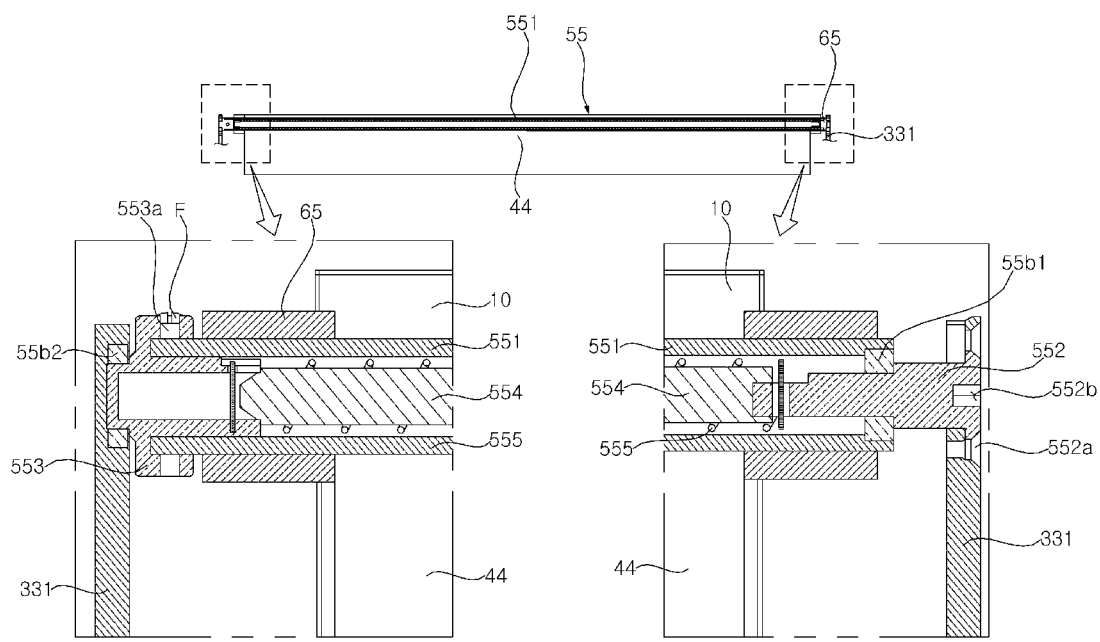

Referring to FIGS. 76 and 77, the subsidiary roller 55 may include a roller body 551, the stationary cap 552, the rotary cap 553, a shaft 554 and a coil spring 555.

The protective sheet 44 may be wound around or unwound from the outer surface of the roller body 551. The protective sheet 44 may be coupled at a first end thereof to the outer surface of the roller body 551 and at a second end thereof to the front surface of the display panel 10 or the panel roller 143. Accordingly, when the panel roller 143 is rotated, the roller body 551 may also be rotated together with the panel roller 143 so as to roll or unroll the protective sheet 44. Because the filler 65 is coupled to the outer surface of the roller body 551, the roller body 551 may be rotated with the filler 65. The roller body 551 may accommodate therein the stationary cap 552, the rotary cap 553, the shaft 554 and the coil spring 555, which will be described later. For example, the roller body 551 may be configured to have a cylindrical shape. For example, the roller body 551 may be produced by extruding aluminum.

The stationary cap 552 may be rotatably coupled to a first end of the roller body 551. The stationary cap 552 may be fixed to the frame 331 adjacent to a first end of the subsidiary roller 55. For example, the stationary cap 552 may be fastened to the frame 331 by means of a screw, which extends through a hole 552*a* formed in the stationary cap 552. The stationary cap 552 may be fixed to the frame 331 without being rotated with the roller body 551 even when the roller body 551 is rotated. A bearing 55*b*1 may be positioned between the outer surface of the stationary cap 552 and the inner surface of the roller body 551, which faces the stationary cap 552. The bearing 55*b*1 may support the rotation of the roller body 551 with respect to the stationary cap 552. The bearing 55*b*1 may assist the coupling between the stationary cap 552 and the roller body 551.

The rotary cap 553 may be coupled to the second end of the roller body 551. For example, the rotary cap 553 may be fixed to the roller body 551 by means of a fastening element F such as a screw, which extends through a hole 553*a* formed in the rotary cap 553. When the roller body 551 is rotated, the rotary cap 553 may be rotated together with the roller body 551. The rotary cap 553 may be rotatably coupled to the frame 331 adjacent to the second end of the subsidiary roller 55. For example, a first end of the rotary cap 553 may be rotatably fitted into the frame 331 adjacent to the second end of the subsidiary roller 55. The bearing 55*b*2 may be positioned between the outer surface of the rotary cap 553 fitted in the frame 331 and the frame 331. The bearing 55*b*2 may support the rotation of the rotary cap 553 with respect to the frame 331. The bearing 55*b*2 may assist in coupling between the rotary cap 553 and the frame 331.

The shaft 554 may extend in the longitudinal direction of the subsidiary roller 55. A first end of the shaft 554 may be fixed to the stationary cap 552, and a second end of the shaft 554 may be rotatably coupled to the rotary cap 553. The rotary cap 553 may rotate relative to the fixed shaft 554. The shaft 554 may be inserted into the coil spring 555, which will be described later. The shaft 554 may assist in stably positioning the coil spring 555 in the subsidiary roller 55. The shaft 554 may prevent the coil spring 555 from being entangled during elastic deformation of the coil spring 555, which will be described later, thereby increasing the durability of the coil spring 555. It is possible to reduce friction or noise, which is generated upon elastic deformation of the coil spring 555, by injecting lubricant such as grease between the shaft 554 and the subsidiary roller 55.

The coil spring 555 may extend in the longitudinal direction of the subsidiary roller 55. The coil spring 555 may be fixed at a first end thereof to the stationary cap 552 and at a second end thereof to the rotary cap 553. When the roller body 551 is rotated, although the first end of the coil spring 555 may be maintained in the state of being fixed without being rotated, the second end of the coil spring 555 may be rotated together with the rotary cap 553. At this point, the coil spring 555 may be elastically deformed. The coil spring 555 may store energy while being elastically deformed, and may apply the restoring force to the rotary cap 553 and the roller body 551. Here, the direction in which the restoring force is applied by the coil spring 555 may be opposite the direction in which the coil spring 555 is elastically deformed. A load may be input to the coil spring 555 by means of a hexagonal groove 552*b* formed in the end of the stationary cap 552 and a hexagonal wrench.

Specifically, when the protective sheet 44 is wound around the panel roller 143 together with the display unit 20, the subsidiary roller 55 may unroll the protective sheet 44 while being rotated in a first rotational direction. At this point, the coil spring 555 may store energy therein while being rotated in the first rotational direction. Meanwhile, when the display unit 20 is unwound from the panel roller 143, the subsidiary roller 55 may roll the protective sheet 44 while being rotated in a second rotational direction, opposite the first rotational direction, by virtue of the restoring force of the coil spring 555.

In accordance with an aspect of the present disclosure, provided is a display device including a flexible display panel, a module cover positioned behind the flexible display panel, a panel roller coupled to a lower end of the flexible display panel, wherein the flexible display panel and the module cover are configured to be wound around or unwound from the panel roller, a subsidiary roller spaced apart from the panel roller and positioned adjacent to a front side of the flexible display panel, a protective sheet in contact with a front side of the flexible display panel when the protective sheet is wound around the panel roller together with the flexible display panel and the module cover, wherein the protective sheet is wound around one of the subsidiary roller and the panel roller while being unwound from a remaining one of the subsidiary roller and the panel roller, a filler coupled to the subsidiary roller, wherein a portion of the filler is configured to be in contact with the front side of the flexible display panel and a distance between a rotational axis of the panel roller and a rotational axis of the subsidiary roller is fixed.

In accordance with another aspect of the present disclosure, the filler may include a pair of fillers each respectively positioned at opposite ends of the subsidiary roller.

In accordance with another aspect of the present disclosure, the filler may include a cylindrical shape such that at least a portion of an inner circumferential surface of the filler is in contact with an outer circumferential surface of the subsidiary roller.

In accordance with another aspect of the present disclosure, the portion of the filler may correspond to an outer circumferential surface of the filler.

In accordance with another aspect of the present disclosure, a first end of the protective sheet may be coupled to an outer circumferential surface of the subsidiary roller and a second end of the protective sheet may be coupled to the front side of the flexible display panel or an outer circumferential surface of the panel roller.

In accordance with another aspect of the present disclosure, a length of the protective sheet may be less than or equal to a length of the flexible display panel.

In accordance with another aspect of the present disclosure, a distance between the rotational axis of the subsidiary roller and an outer surface of the filler may be greater than or equal to a distance between the rotational axis of the subsidiary roller and a point on an outer surface of the protective sheet, when the protective sheet is fully wound on the subsidiary roller.

In accordance with another aspect of the present disclosure, a distance between a rotational axis of the panel roller and a rotational axis of the subsidiary roller may be greater than a sum of a distance between the rotational axis of the panel roller and a point on an outer surface of the module cover when the module cover is fully wound around the panel roller, and a distance between the rotational axis of the subsidiary roller and the outer surface of the filler.

In accordance with another aspect of the present disclosure, the protective sheet may be configured to be interposed between layers of the flexible display panel at a first region and not disposed between layers of the flexible display panel at a second region when the flexible display panel is wound around the panel roller.

In accordance with another aspect of the present disclosure, the display device may further include a stopper projecting from an outer surface of the subsidiary roller between the protective sheet and the filler, wherein the stopper may be in contact with the filler.

In accordance with another aspect of the present disclosure, the display device may further include a rib projecting from an outer surface of the subsidiary roller, wherein the filler may further include an inner surface configured to contact an outer surface of the subsidiary roller, an outer surface configured to contact the front side of the flexible display panel, and a groove depressed from the inner surface such that the rib is fitted into the groove.

In accordance with another aspect of the present disclosure, the display device may further include a frame positioned adjacent to a first end of the subsidiary roller, wherein the subsidiary roller may further include a roller body comprising an outer circumferential surface on which the protective sheet is wound or unwound from, a stationary cap rotatably coupled to a first end of the roller body and fixed to the frame, a rotary cap coupled to a second end of the roller body and rotatable with the roller body, a coil spring received in the roller body, wherein a first end of the coil spring is coupled to the stationary cap and a second end of the coil spring may be coupled to the rotary cap.

The effects of the display device according to the present disclosure will be described.

At least one embodiment of the present disclosure provides a display device capable of preventing damage to a display panel due to contact with a module cover, which may occur during a procedure of winding the display panel and the module cover around a panel roller or unwinding the display panel and the module cover from the panel roller.

At least one embodiment of the present disclosure provides a display device capable of stably guiding a display panel without unexpected motion of the display panel during a procedure of winding the display panel around a panel roller or unwinding the display panel from the panel roller.

At least one embodiment of the present disclosure provides a display device capable of allowing a subsidiary roller, around which a protective sheet for preventing damage to a display panel is wound or unwound, to be smoothly rotated.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination between the configurations is not directly described, the combination is possible except in the case where it is described that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:

1. A display device comprising:
a flexible display panel;
a module cover positioned behind the flexible display panel;
a panel roller coupled to one end of the flexible display panel, wherein the flexible display panel and the module cover are configured to be wound around or unwound from the panel roller;
a subsidiary roller spaced apart from the panel roller and positioned adjacent to a front side of the flexible display panel;
a protective sheet in contact with a front side of the flexible display panel when the protective sheet is wound around the panel roller together with the flexible display panel and the module cover, wherein the protective sheet is wound around one of the subsidiary roller and the panel roller while being unwound from a remaining one of the subsidiary roller and the panel roller; and
a filler coupled to the subsidiary roller and positioned exterior to an area of the subsidiary roller around which the protective sheet is wound, wherein the filler is in contact with the front side of the flexible display panel and a distance between a rotational axis of the panel roller and a rotational axis of the subsidiary roller is fixed.

2. The display device according to claim 1, comprising a pair of fillers each respectively positioned at opposite ends of the subsidiary roller.

3. The display device according to claim 1, wherein the filler comprises a cylindrical shape such that at least a portion of an inner circumferential surface of the filler is in contact with an outer circumferential surface of the subsidiary roller.

4. The display device according to claim 1, wherein at least a portion of an outer circumferential surface of the filler is in contact with the front side of the flexible display panel.

5. The display device according to claim 1, wherein a first end of the protective sheet is coupled to an outer circumferential surface of the subsidiary roller and a second end of the protective sheet is coupled to the front side of the flexible display panel or an outer circumferential surface of the panel roller.

6. The display device according to claim 5, wherein a length of the protective sheet is less than or equal to a length of the flexible display panel.

7. The display device according to claim 1, wherein a distance between the rotational axis of the subsidiary roller and an outer surface of the filler is greater than or equal to a distance between the rotational axis of the subsidiary roller and a point on an outer surface of the protective sheet, when the protective sheet is fully wound on the subsidiary roller.

8. The display device according to claim 7, wherein a distance between a rotational axis of the panel roller and a rotational axis of the subsidiary roller is greater than a sum of:

a distance between the rotational axis of the panel roller and a point on an outer surface of the module cover when the module cover is fully wound around the panel roller, and a distance between the rotational axis of the subsidiary roller and the outer surface of the filler.

9. The display device according to claim 7, wherein the protective sheet is configured to be interposed between layers of the flexible display panel at a first region and not disposed between layers of the flexible display panel at a second region when the flexible display panel is wound around the panel roller.

10. The display device according to claim 1, further comprising a stopper projecting from an outer surface of the subsidiary roller between the protective sheet and the filler, wherein the stopper is in contact with the filler.

11. The display device according to claim 1, further comprising a rib projecting from an outer surface of the subsidiary roller, wherein the filler further comprises:

an inner surface configured to contact an outer surface of the subsidiary roller;

an outer surface configured to contact the front side of the flexible display panel; and a groove depressed from the inner surface such that the rib is fitted into the groove.

12. The display device according to claim 1, further comprising a frame positioned adjacent to a first end of the subsidiary roller, wherein the subsidiary roller further comprises:

a roller body comprising an outer circumferential surface on which the protective sheet is wound or unwound from;

a stationary cap rotatably coupled to a first end of the roller body and fixed to the frame;

a rotary cap coupled to a second end of the roller body and rotatable with the roller body; and a coil spring received in the roller body, wherein a first end of the coil spring is coupled to the stationary cap and a second end of the coil spring is coupled to the rotary cap.

* * * * *